(12) United States Patent
Kumagai

(10) Patent No.: US 9,825,025 B2
(45) Date of Patent: Nov. 21, 2017

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Naoki Kumagai, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/428,498

(22) Filed: Feb. 9, 2017

(65) Prior Publication Data

US 2017/0271324 A1 Sep. 21, 2017

(30) Foreign Application Priority Data

Mar. 16, 2016 (JP) ................................ 2016-052467
Aug. 16, 2016 (JP) ................................ 2016-159571

(51) Int. Cl.
| | | |
|---|---|---|
| *H01L 29/15* | (2006.01) | |
| *H01L 27/06* | (2006.01) | |
| *H01L 29/06* | (2006.01) | |
| *H01L 29/78* | (2006.01) | |
| *H01L 29/08* | (2006.01) | |
| *H01L 21/761* | (2006.01) | |
| *H01L 29/10* | (2006.01) | |
| *H01L 29/872* | (2006.01) | |
| *H01L 21/763* | (2006.01) | |
| *H01L 21/76* | (2006.01) | |
| *H01L 29/16* | (2006.01) | |
| *H01L 21/82* | (2006.01) | |
| *H01L 29/40* | (2006.01) | |

(52) U.S. Cl.
CPC ........ *H01L 27/0617* (2013.01); *H01L 21/761* (2013.01); *H01L 21/7602* (2013.01); *H01L 21/763* (2013.01); *H01L 21/8213* (2013.01); *H01L 27/0629* (2013.01); *H01L 29/0696* (2013.01); *H01L 29/0865* (2013.01); *H01L 29/0882* (2013.01); *H01L 29/1095* (2013.01); *H01L 29/1608* (2013.01); *H01L 29/402* (2013.01); *H01L 29/7803* (2013.01); *H01L 29/7806* (2013.01); *H01L 29/872* (2013.01)

(58) Field of Classification Search
CPC ............. H01L 27/0617; H01L 27/0629; H01L 21/7602; H01L 21/761; H01L 21/763; H01L 21/8213; H01L 29/0696; H01L 29/0865; H01L 29/0882; H01L 29/1095; H01L 29/1608; H01L 29/402; H01L 29/7803; H01L 29/7806; H01L 29/872
USPC .......................................................... 257/77
See application file for complete search history.

(56) References Cited

U.S. PATENT DOCUMENTS 8,698,229 B2 * 4/2014 Willmeroth ......... H01L 29/0634
257/262

OTHER PUBLICATIONS

Agarwal et al., "A New Degradation Mechanism in Hi-Voltage SiC Power MOSFETs", IEEE Electron Device Letters, Jul. 2007, vol. 28, No. 7, pp. 587-589 (Mentioned in paragraph Nos. 4 and 7 of the as-filed specification.).

* cited by examiner

*Primary Examiner* — Tu-Tu Ho
(74) *Attorney, Agent, or Firm* — Chen Yoshimura LLP

(57) ABSTRACT

A semiconductor device includes a first drain region that is made primarily of SiC, a drift layer, a channel region, a first source region, a source electrode that is formed on the first source region, a second drain region that is connected to the first source region, a second source region that is formed separated from the second drain region, a first floating electrode that is connected to the second source region and to the channel region, first gate electrodes, and a second gate electrode that is connected to the first gate electrodes.

17 Claims, 38 Drawing Sheets

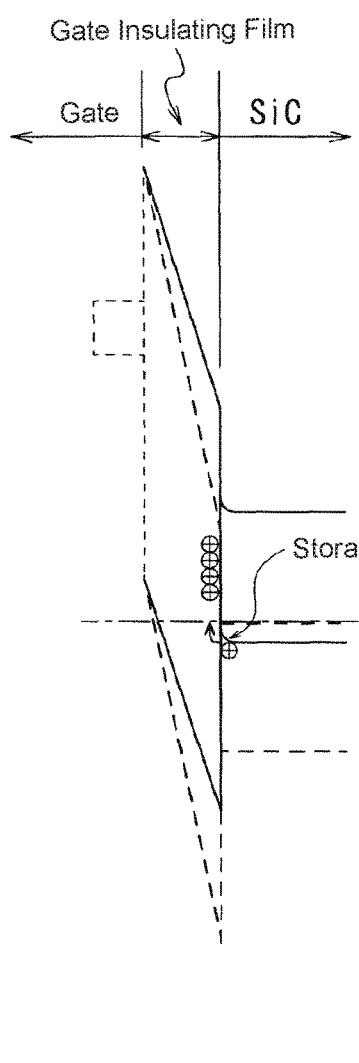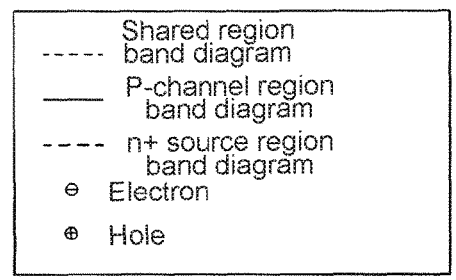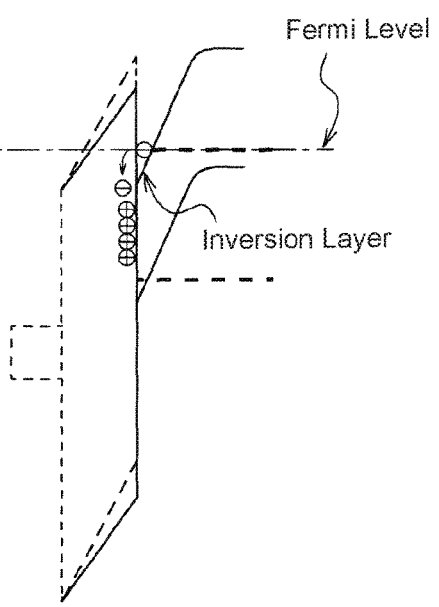
FIG. 10A    FIG. 10B

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

Wide-bandgap semiconductors such as silicon carbide (SiC), gallium nitride (GaN), and diamond (C) are expected to have numerous applications, particularly in power devices, due to having excellent performance characteristics such as high dielectric breakdown field strength and high thermal conductivity. Among these, SiC in particular has attracted attention due to allowing oxide films ($SiO_2$) to be formed using thermal oxidation processes, similar to when working with pure silicon (Si).

Semiconductor devices that use wide-bandgap semiconductors exhibit higher dielectric breakdown field strength than those that use Si. For example, 4H—SiC, GaN, and diamond respectively make it possible to achieve dielectric breakdown field strengths of approximately 10, 11, and 19 times greater than with Si. For a device of a given breakdown voltage, this makes it possible to increase the impurity concentration and decrease the thickness of a low concentration n-type ($n^-$) drift layer, thereby making it possible to achieve a high breakdown voltage and a low on-resistance.

If the SiC body diode is used as the path for this reverse current, the on-resistance increases (this is a well-known phenomenon).

This increase in on-resistance is thought to be due to an increase in the portion of the current path through which it is difficult for current to flow that occurs when a forward current flows across the body diode after the conductivity is modulated (see Non-Patent Document 1, for example). The specific reason behind this increase in the portion through which it is difficult for current to flow is thought to be the formation of stacking faults in the crystal structure of the SiC due to the recombination energy of the majority carriers and the minority carriers.

One method of preventing current from flowing through the SiC body diode is to allow current to flow through the channel of the MOSFET, for example. However, switching ON the switching elements in both the upper and lower arms at the same time can cause a short-circuit in the power supply. Moreover, switching OFF some of the switching elements in order to prevent multiple switching elements from being ON at the same time results in an increase in OFF time (or so-called dead time). Furthermore, a forward current will still flow through the SiC body diode during this dead time.

Another method of preventing current from flowing through the SiC body diode is to connect diodes (Schottky diodes) in parallel with each switching element. However, if the forward voltage across these diodes becomes greater than or equal to the built-in voltage of the body diode of the switching element (which is approximately 2.3V for SiC), current begins to flow through the SiC body diode. This creates a need to reduce the forward voltage Vf of the diodes, which typically makes it necessary to prepare larger-area diodes and results in an overall increase in cost.

RELATED ART DOCUMENT

Non-Patent Document

Non-Patent Document 1: A New Degradation Mechanism in High-Voltage SiC Power MOSFETs, Agarwal et al., IEEE Electron Device Letters, Volume 28 Issue 7 Pages 587-589, 2007

SUMMARY OF THE INVENTION

The present invention was made in view of the above-mentioned problems and aims to provide an SiC semiconductor device and a method of manufacturing the same that make it possible to prevent an increase in on-resistance. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a first drain region of a first conductivity type and made primarily of silicon carbide, in the substrate; a drift layer of the first conductivity type above the first drain region; a channel region of a second conductivity type above the drift layer; a first source region of the first conductivity type in a portion of an upper surface of the channel region; a source electrode above the first source region; a second drain region of the first conductivity type disposed in a portion of the upper part of the channel region and having a pattern connected to the first source region; a second source region of the first conductivity type in a portion of the upper surface of the channel region and separated from the second drain region; a first floating electrode connected to the second source region and the channel region; a first gate electrode controlling a surface potential of a path for current that flows from the first source region in the channel region to the drift layer; and a second gate electrode that is connected to the first gate electrode and that controls a surface potential of the channel region between the second drain region and the second source region.

In another aspect, the present disclosure provides: a method of manufacturing a semiconductor device, including: forming, on a first drain region made of silicon carbide, a drift layer of a first conductivity type and a lower concentration of impurities than the first drain region; forming a channel region of a second conductivity type above the drift layer; forming, in a portion of an upper surface of the channel region, a first source region of the first conductivity type, a second drain region of the first conductivity type to be connected to the first source region, and a second source region of the first conductivity type separated from the second drain region; forming a gate insulating film above the channel region; forming, above the gate insulating film, a first gate electrode controlling a surface potential of a path for current that flows from the first source region in the channel region to the drift layer, and a second gate electrode connected to the first gate electrode and controlling a surface potential of the channel region between the second drain region and the second source region; forming a source electrode on the first source region; and forming a first floating electrode separated from the source electrode and connected to the second source region and the channel region.

The semiconductor device and the method of manufacturing the semiconductor device according to the present invention make it possible to provide an SiC semiconductor device and a method of manufacturing the same that make it possible to prevent an increase in on-resistance.

It is to be understood that both the foregoing general description and the following detailed description are exemplary and explanatory, and are intended to provide further explanation of the invention as claimed.

BRIEF DESCRIPTION OF THE DRAWINGS

FIGS. 10A and 10B schematically illustrate state changes in an energy band of a cross section taken along line E-E in FIG. 9 in order to explain the charge pumping effect. FIG. 10A is a band diagram of a case in which a negative voltage is applied to the gate of a MOSFET and an accumulation layer is therefore formed on the surface of the channel region. FIG. 10B is a band diagram of a case in which a voltage greater than or equal to the gate threshold voltage is applied to the gate of the MOSFET.

DETAILED DESCRIPTION OF EMBODIMENTS

Figure 1:
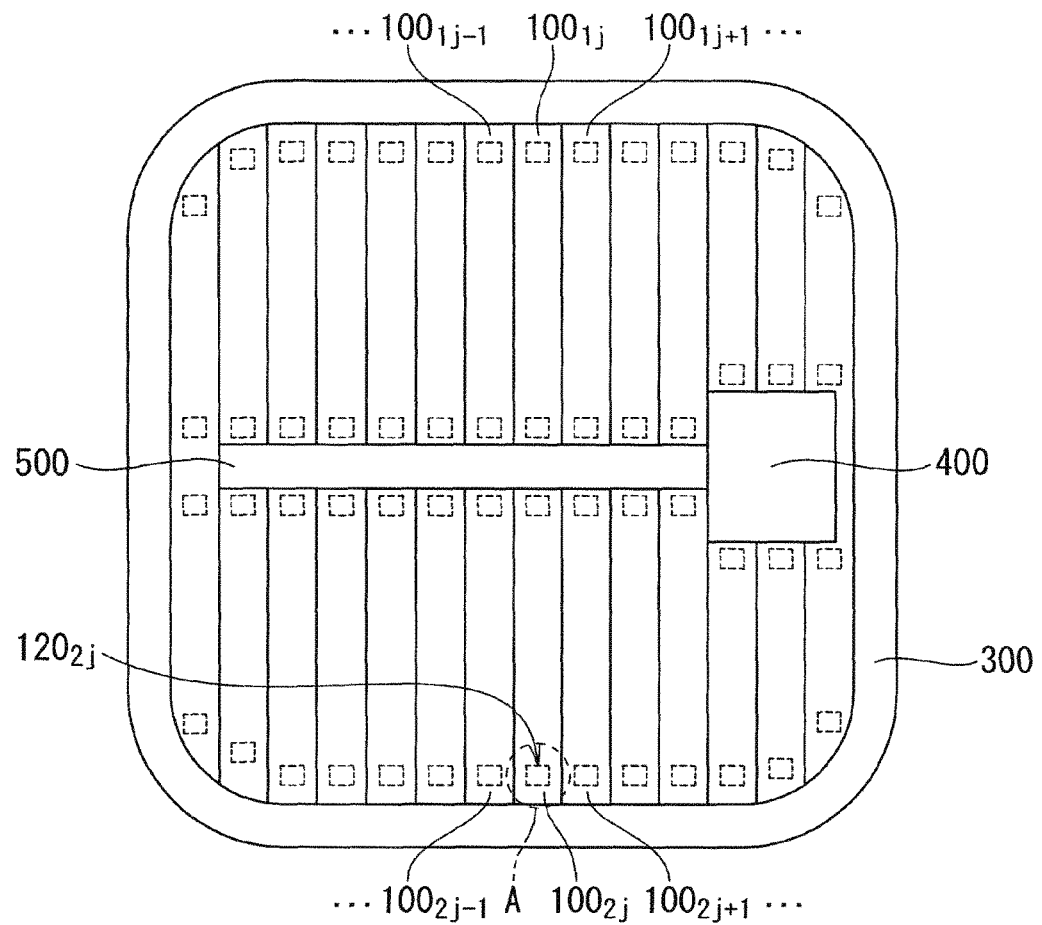
FIG. 1 is a plan view schematically illustrating an overall configuration of a semiconductor device according to Embodiment 1.

Next, Embodiments 1 to 8 of the present invention will be described. In the figures described below, the same or similar reference characters are used for components that are the same or similar. Note, however, that the figures are only intended to be schematic illustrations, and the relationships between thickness and planar dimensions, the proportional relationships between the thicknesses of each device and each component, and the like may be different than in the actual devices. Therefore, specific thicknesses and dimensions should be determined by referencing the descriptions below. Similarly, the illustrated dimensional relationships and proportions of components in the figures may differ from one figure to the next.

Moreover, in the following descriptions, the "left and right" and the "up and down" directions are defined only for the purposes of convenience and do not limit the technical concepts of the present invention in any way. Therefore, the figures may be rotated by 90° such that the "left and right" and the "up and down" directions are interchanged, or the figures may be rotated by 180° such that the "left" direction becomes the "right" direction and the "right" direction becomes the "left" direction, for example.

Furthermore, in the present specification and the attached drawings, the letters "n" and "p" are used to indicate whether the majority carriers in a region or layer are electrons or holes, respectively. Moreover, the symbols + and − are appended to the letters n and p to indicate that the corresponding semiconductor region has a higher or lower impurity concentration, respectively, than a semiconductor region for which the symbols + and − are not appended to the letters n and p. More, even when regions have the same notation (such as when two regions are both labeled as $n^+$), this does not necessarily mean that those regions have exactly the same impurity concentrations.

<Embodiment 1>

(Structure of Semiconductor Device)

As illustrated in FIG. 1, a semiconductor device according to Embodiment 1 includes an active portion in which a plurality of stripe-shaped basic cells . . . , $100_{1j-1}$, $100_{1j}$, $100_{1j+1}$, . . . and . . . , $100_{2j-1}$, $100_{2j}$, $100_{2j+1}$, . . . are arranged and an edge termination structure 300 formed around the periphery of the active portion. In a front view of the upper surface of the semiconductor device, the plurality of basic cells . . . , $100_{1j-1}$, $100_{1j}$, $100_{1j+1}$, . . . and . . . , $100_{2j-1}$, $100_{2j}$, $100_{2j+1}$, . . . are embedded in the active portion on the inner side of the frame-shaped edge termination structure 300.

Figure 2:
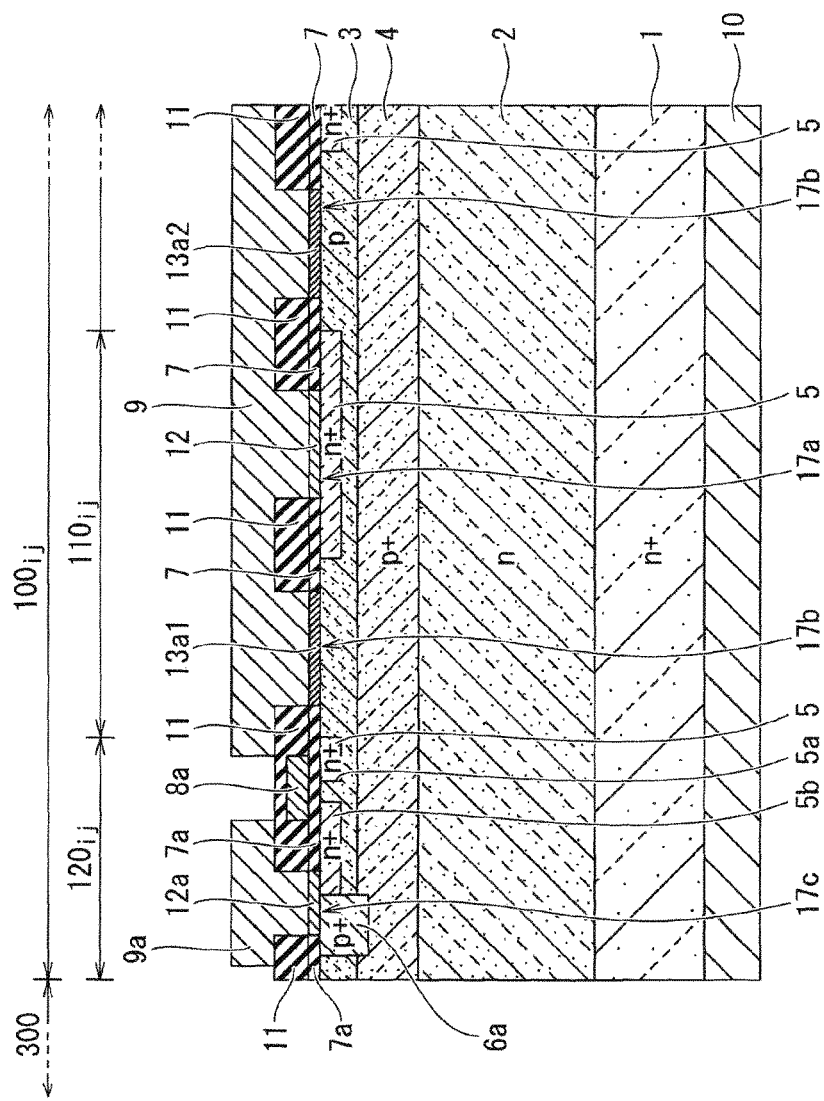
FIG. 2 is a cross-sectional view schematically illustrating a configuration of a portion of the main components of a basic cell of the semiconductor device according to Embodiment 1 as viewed along line D-D in FIG. 3.

As illustrated in FIG. 2, each basic cell $100_{ij}$ (where i=1 or 2 and j=1 to n, where n is a positive number greater than or equal to 2) includes a standard unit $110_{ij}$ (a region through which a primary current flows) and a built-in transistor $120_{ij}$ (a region for short-circuiting an SiC body region (3, 4) and a source region in the standard unit $110_{ij}$) that is connected to the standard unit $110_{ij}$. Here, the "body region (3, 4)" is an SiC region that includes a channel region 3 and a base region 4. One or more standard units $110_{ij}$ and one or more built-in transistors $120_{ij}$ may be arranged within each basic cell $100_{ij}$.

The plurality of basic cells . . . , $100_{1j-1}$, $100_{1j}$, $100_{1j-1}$, . . . and . . . , $100_{2j-1}$, $100_{2j}$, $100_{2j+1}$, each have a stripe-shaped topology that is elongated in the vertical direction in FIG. 1, and these stripes are arranged parallel to one another in a line in the left-to-right direction. In the active portion, a substantially square-shaped gate pad 400 is formed towards the right side thereof and in the center in the height direction in FIG. 1, and a gate runner 500 is arranged extending out from the left edge of the gate pad 400 and extending in the left side direction of the gate pad 400 through the center portion.

The active portion is thus roughly divided vertically into two regions by the gate pad 400 and the gate runner 500. The plurality of basic cells . . . , $100_{1j-1}$, $100_{1j}$, $100_{1j-1}$, . . . are arranged in the upper region except for on the ends in the left-to-right direction. Similarly, the plurality of basic cells . . . , $100_{2j-1}$, $100_{2j}$, $100_{2j+1}$, . . . are arranged in the lower region.

Note that although the active portion is divided vertically into two regions in Embodiment 1, the active portion may be divided into m or more regions i=1 to m in the vertical direction (where m is a positive number greater than or equal to 1). Moreover, as illustrated by the region in the dashed circle A at the bottom end of the basic cell $100_{2j}$ in FIG. 1, a pair of the built-in transistors $120_{2j}$ (that is, the built-in transistors $120_{ij}$; schematically illustrated by the dashed rectangular regions) are formed respectively at each end of each stripe.

The basic cells $100_{ij}$ of the semiconductor device according to Embodiment 1 include a high concentration n-type ($n^+$) first drain region 1 that is made primarily of SiC and is formed spanning across the respective standard units $110_{ij}$ and the respective built-in transistors $120_{ij}$. An n-type drift layer 2 that has a lower impurity concentration than the first drain region 1 is formed on top of the first drain region 1.

The drift layer 2 can be formed by being epitaxially grown on the first drain region 1, for example. For an SiC element in the 1200V breakdown voltage class, for example, the impurity concentration and thickness of the drift layer 2 should be approximately $1.0 \times 10^{16}$ cm$^{-3}$ and approximately 10 µm, respectively, and further increasing the breakdown voltage requires the impurity concentration to be decreased and the thickness to be increased. The high concentration p-type (p$^+$) base region 4 is formed on top of the drift layer 2. The base region 4 prevents punchthrough from occurring in the channel region 3 when a high reverse bias is applied to the p-n junction between the channel region 3 and the drift layer 2.

The basic cells $100_{ij}$ of the semiconductor device according to Embodiment 1 also include the p-type channel region 3, which is formed on a portion of the upper surface of the base region 4 and has a lower impurity concentration than the base region 4. The channel region 3 can be formed by being epitaxially grown on the base region 4, for example. The drift layer 2, the base region 4, and the channel region 3 are all formed spanning across the standard units $110_{ij}$ and the built-in transistors $120_{ij}$.

The drain region 1 and the drift layer 2 have the same structures in both the standard units $110_{ij}$ and the built-in transistors $120_{ij}$ of the basic cells $100_{ij}$, while the structures of the upper layers (the base region 4 and above) are different for the standard units $110_{ij}$ and for the built-in transistors $120_{ij}$.

(Structure of Standard Unit)

Figure 3:
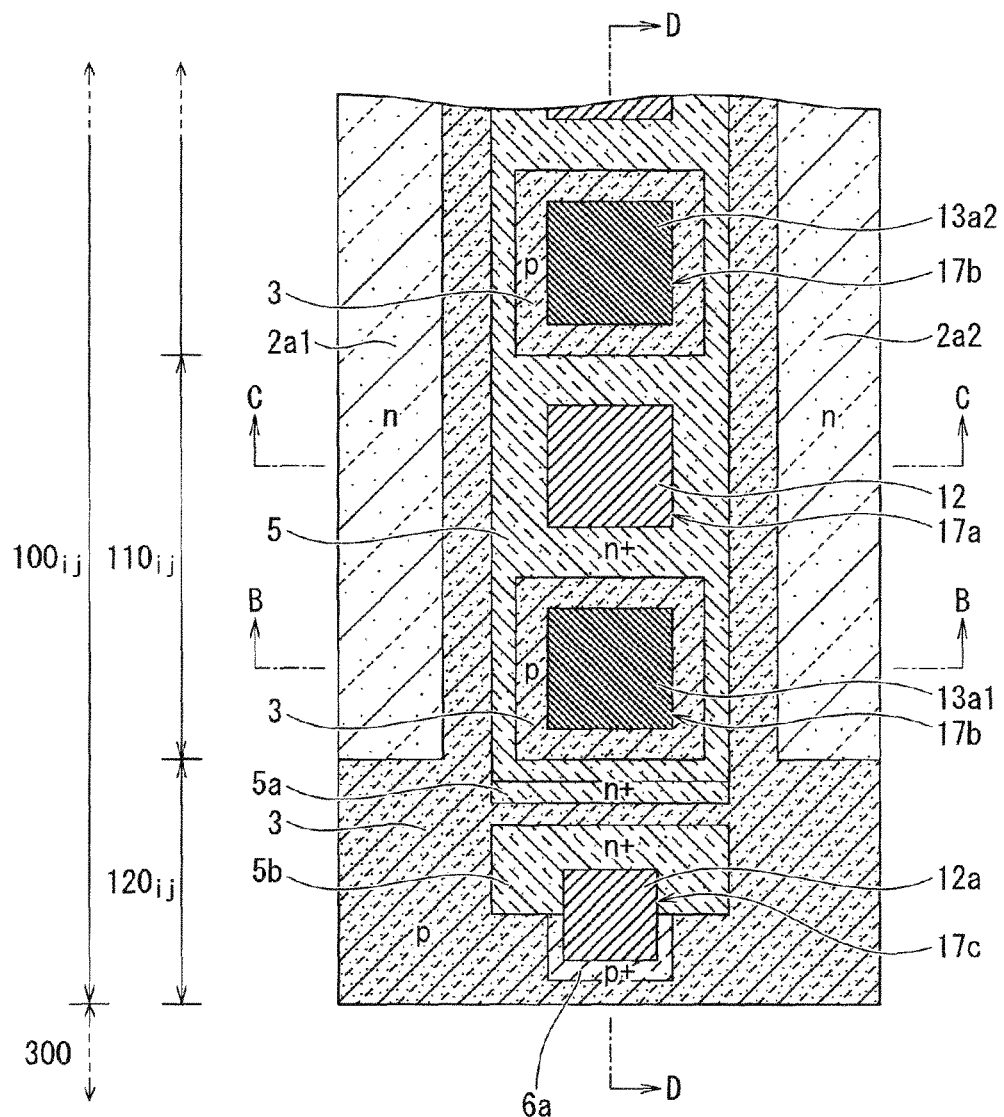
FIG. 3 is an enlarged partial plan view of region A in FIG. 1 and schematically illustrates a configuration of a portion of the main components of the basic cell of the semiconductor device according to Embodiment 1 in a state in which layers above the upper surface of a channel region have been removed but potential barrier layers and ohmic contact layers have already been formed.

FIG. 2 is a cross-sectional view illustrating the structure of the standard unit $110_{ij}$ as viewed along line D-D in FIG. 3. As illustrated in FIG. 3, the standard unit includes a high concentration n-type (n$^+$) first source region 5 formed in a portion of the upper surface of the channel region 3 and running parallel to the lengthwise direction of the stripe of the basic cell $100_{ij}$.

The first source region 5 has a surface pattern in which openings that go through the first source region 5 and expose the upper surface of the channel region 3 are arranged in a pattern running in the vertical direction and parallel to the lengthwise direction of the basic cell $100_{ij}$. FIG. 3 primarily illustrates the structure of the plane on the surface side of the SiC as viewed from above. Note that in FIG. 3, components such as a first insulating film and a second insulating film that are positioned above the channel region 3 and the first source region 5 are not illustrated.

The first source region 5 in which the pattern of openings that go through the first source region 5 are formed can be formed in a frame shape when viewed in a plan view. The portions of the channel region 3 that are exposed by the openings in the first source region 5 are substantially rectangular. Rectangular first potential barrier layers $13a1$ and $13a2$ are respectively formed in the lower and upper exposed portions of the channel region 3 in FIG. 3. The plurality of openings that expose the channel region 3 are arranged separated from one another at a prescribed interval, and therefore the first source region 5 has a ladder-shaped pattern.

Figure 4:
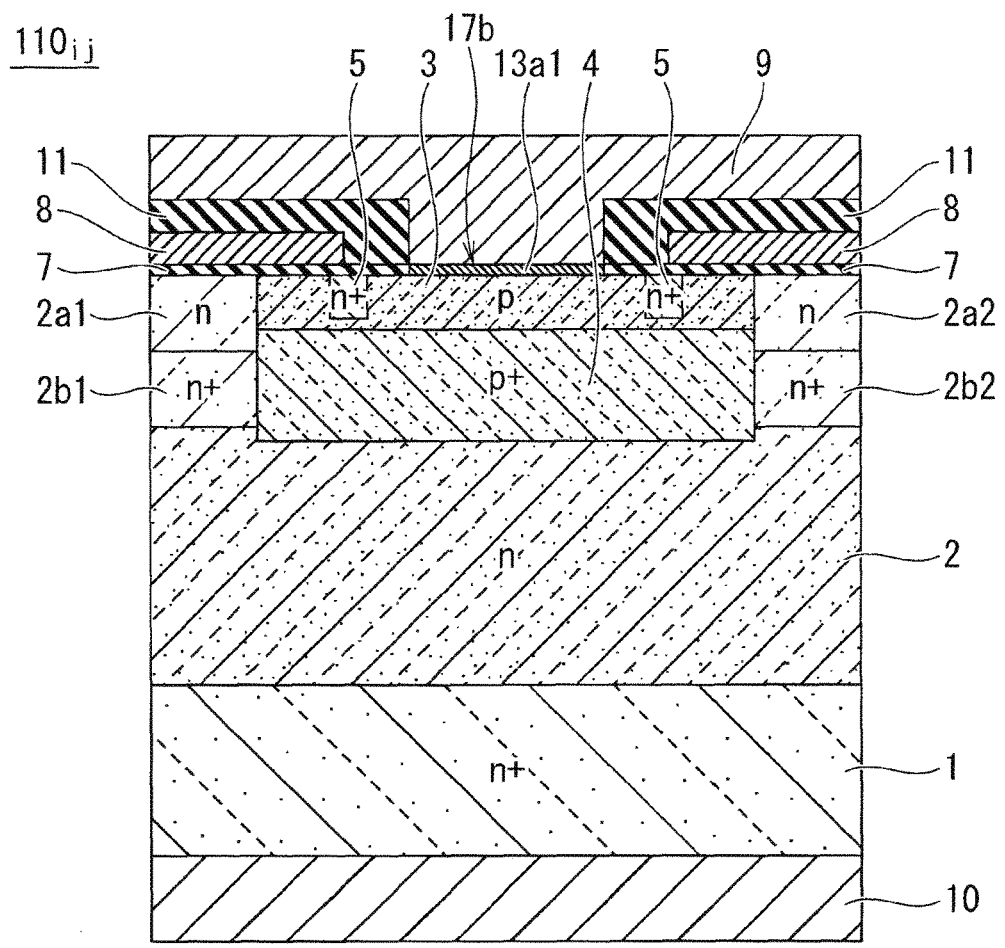
FIG. 4 is a cross-sectional view schematically illustrating a configuration of a portion of the main components of the basic cell of the semiconductor device according to Embodiment 1 as viewed along line B-B in FIG. 3.

FIG. 4 illustrates the structure of a cross section taken along line B-B in FIG. 3. As illustrated in FIG. 4, high concentration n-type (n$^+$) JFET regions $2b1$ and $2b2$ are formed at a position beneath low concentration n-type inverted regions $2a1$ and $2a2$ in both sides of the base region 4 beneath the channel region 3 (of which a portion of the top thereof is enclosed by the first source region 5).

In other words, the inverted regions $2a1$ and $2a2$ are formed above the JFET regions $2b1$ and $2b2$ so as to sandwich the channel region 3. The inverted regions $2a1$ and $2a2$ are both formed by using ion implantation of n-type impurity elements to invert the conductivity of the p-type channel region to n-type. The carriers flowing through the inversion layer in the surface of the channel region 3 travel through the inverted regions $2a1$ and $2a2$ and the JFET regions $2b1$ and $2b2$ and towards the drift layer 2.

Furthermore, as illustrated in FIG. 2, a first insulating film 7 is selectively formed on the channel region 3 in the standard unit $110_{ij}$. Moreover, a plurality of first gate electrodes (two first gate electrodes in FIG. 4; not illustrated in the cross section in FIG. 2) are formed on the first insulating film 7 and extend above the first source region 5 illustrated in FIG. 3 and parallel to the lengthwise direction of the first source region 5 (the vertical direction in FIG. 3).

The first insulating film 7 (which functions as the gate insulating film for the first gate electrodes) is an oxide film (SiO$_2$) or the like. High-breakdown voltage elements are typically driven at gate voltages of approximately 15V to 30V, and therefore the thickness of the first insulating film 7 should typically be 50 nm to 150 nm in order to ensure reliability. In addition, an interlayer insulating film 11 is formed on the first insulating film 7 and the first gate electrodes.

Moreover, as illustrated in FIGS. 2 and 3, the first potential barrier layers $13a1$ and $13a2$ are formed on the channel region 3 where exposed by the openings in the first source region 5 in order to prevent the majority carriers from being injected into the channel region 3. A metal film such as gold (Au), nickel (Ni), titanium (Ti), molybdenum (Mo), tungsten (W), or chromium (Cr) that forms a Schottky junction with the channel region 3 can be used for the first potential barrier layers $13a1$ and $13a2$, for example.

As illustrated in FIG. 4, a source electrode 9 is formed contacting the channel region 3 in channel contact areas $17b$, with the first potential barrier layers $13a1$ and $13a2$ formed by the Schottky junction with the channel region 3 interposed therebetween. As illustrated in FIGS. 2 and 3, a first ohmic contact layer 12 is formed on the first source region 5 at a position centered between the two openings that expose the channel region 3. The first ohmic contact layer 12 corresponds to the "first ohmic contact layer" in the present invention.

Figure 5:
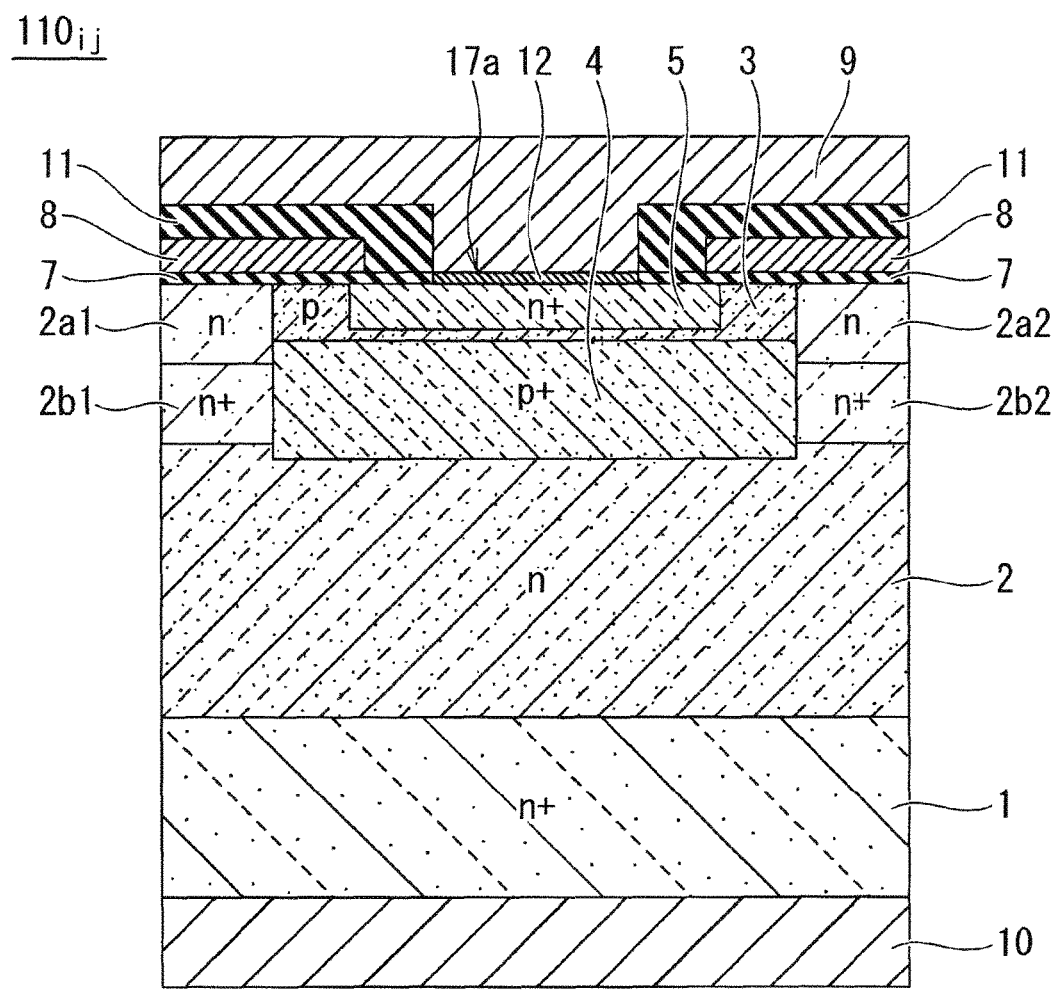
FIG. 5 is a cross-sectional view schematically illustrating a configuration of a portion of the main components of the basic cell of the semiconductor device according to Embodiment 1 as viewed along line C-C in FIG. 3.

The first ohmic contact layer 12 may be made of a silicide film that contains a metal such as Ni or an NiAl compound of Ni and aluminum (Al), for example. As illustrated in FIG. 5, the source electrode 9 contacts the first source region 5 in a source contact area $17a$, with the first ohmic contact layer 12 interposed therebetween.

Furthermore, as illustrated in FIG. 4, the interlayer insulating film 11 is formed on the first gate electrodes 8, and the source electrode 9 contacts the first ohmic contact layer 12 and the first potential barrier layers $13a1$ and $13a2$ via openings in the interlayer insulating film 11. The source electrode 9 is thus electrically connected to the first source region 5 via the first ohmic contact layer 12 and is electrically connected to the channel region 3 via the first potential barrier layers $13a1$ and $13a2$.

(Structure of Built-in Transistor)

The built-in transistor $120_{ij}$ illustrated in FIGS. 1 to 3 is a lateral MOSFET that includes a second drain region $5a$ and a second source region $5b$ that both have a first conductivity type and are formed at the same depth as the first source region 5 of the standard unit 110$_{ij}$. As illustrated in the figures, the second drain region 5a contacts and is integrated with the first source region 5. Similar to the first source region 5, the second drain region 5a is a high concentration n-type (n$^+$) region.

The high concentration n-type (n$^+$) second source region 5b is included in a portion of the upper surface of the channel region 3 in the built-in transistor 120$_{ij}$ region and is formed separated from the second drain region 5a. In addition, a high concentration p-type (p$^+$) base contact region 6a that contacts the second source region 5b is formed in the channel region 3 in the built-in transistor 120$_{ij}$ region.

As illustrated in FIG. 2, the depth of the base contact region 6a is greater than the thickness of the channel region 3, and the base contact region 6a reaches a portion of the upper surface of the base region 4. Furthermore, a second insulating film 7a is formed on the channel region 3 between the second drain region 5a and the second source region 5b, and a second gate electrode 8a that is electrically connected to the first gate electrodes 8 is formed on the second insulating film 7a.

Similar to the first insulating film 7, the second insulating film 7a is an oxide film (SiO$_2$) or the like and functions as the gate insulating film of the second gate electrode 8a. As described above, the two first gate electrodes 8 extend out from both sides of the second gate electrode 8a in the vertical direction in FIG. 3, and the first gate electrodes 8 are connected to the second gate electrode 8a on at least one end thereof. As illustrated in FIG. 2, a portion of the interlayer insulating film 11 is formed spanning across the standard unit 110$_{ij}$ and the built-in transistor 120$_{ij}$ above the second gate electrode 8a.

The built-in transistor 120$_{ij}$ includes a second ohmic contact layer 12a that is formed on the SiC surface in order to make it possible to form a short-circuit between the surface of the base contact region 6a and the surface of the second source region 5b via a contact hole that goes through the second insulating film 7a. Similar to the first ohmic contact layer 12, the second ohmic contact layer 12a may be made of a silicide film that contains a metal such as Ni or NiAl.

The same metal or different metals may be used for the portions that respectively contact the surfaces of the base contact region 6a and the second source region 5b. Furthermore, a first floating electrode 9a is formed and is connected to the second ohmic contact layer 12a via a contact hole that goes through the interlayer insulating film 11 in the built-in transistor 120$_{ij}$ region. The base contact region 6a and the second source region 5b are thus connected to the first floating electrode 9a via the second ohmic contact layer 12a.

Figure 6:
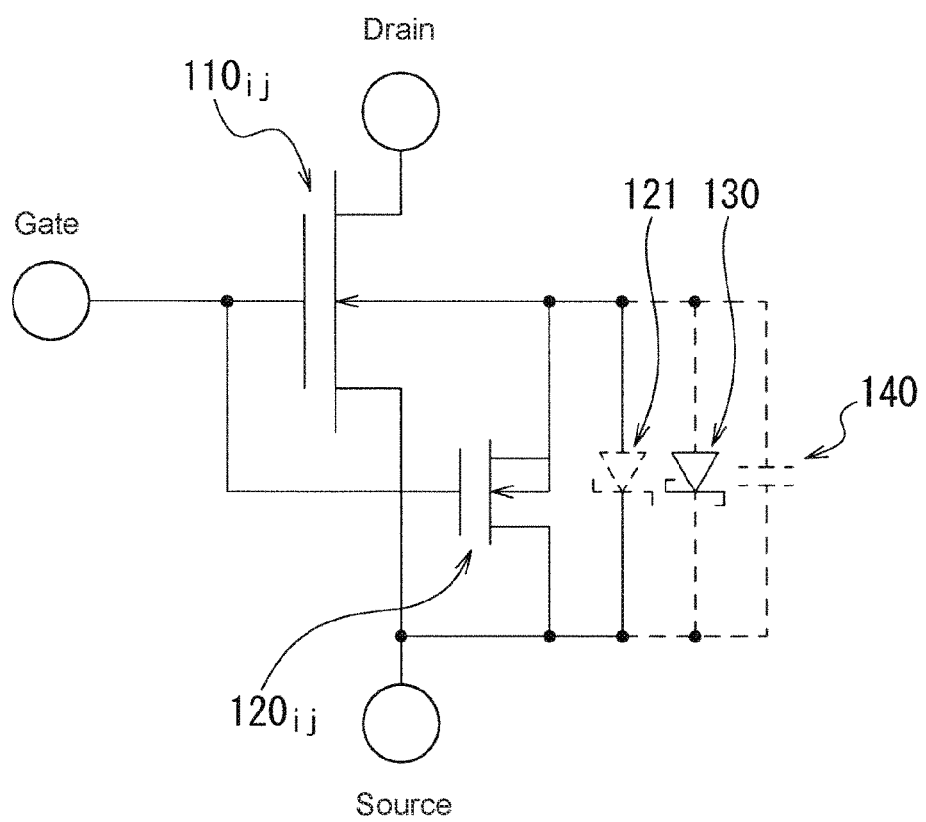
FIG. 6 is an equivalent circuit diagram of the semiconductor device according to Embodiment 1.

Each basic cell 100$_{ij}$ of the semiconductor device according to Embodiment 1 can be represented by the equivalent circuit illustrated in FIG. 6, for example. In FIG. 6, the upper left MOSFET represents the standard unit 110$_{ij}$, and the other MOSFET represents the built-in transistor 120$_{ij}$ that is connected between the channel region 3 and the source electrode 9 (that is, to the back gate of the former MOSFET).

Moreover, a parasitic body diode 121 of the built-in transistor 120$_{ij}$ and a p-type Schottky diode 130 formed between the channel region 3 and the first potential barrier layers 13a1 and 13a2 can be represented as being connected in parallel to the built-in transistor 120$_{ij}$. Similarly, a parasitic junction capacitor 140 that represents the sum of the junction capacitance of the built-in transistor 120$_{ij}$, the p-type Schottky diode 130, and the like can also be represented as being connected in parallel to the built-in transistor 120$_{ij}$.

(Operation of Semiconductor Device)

When a voltage of greater than or equal to a threshold value relative to the source electrode 9 is applied to the first gate electrodes 8, the electric potential of the surface of the channel region 3 that is directly beneath the first gate electrodes 8 changes, thereby forming an inversion layer in the surface of the channel region 3. If, in this state, a positive voltage relative to the source electrode 9 is then applied to a drain electrode 10, electron paths are formed on both the left and right sides of FIG. 5.

The path on the left side of FIG. 5 includes the source electrode 9, the first ohmic contact layer 12, the first source region 5, the inversion layer in the surface of the channel region 3, the inverted region 2a1, the JFET region 2b1, the drift layer 2, the drain region 1, and the drain electrode 10.

Similarly, the path on the right side of FIG. 5 includes the source electrode 9, the first ohmic contact layer 12, the first source region 5, the inversion layer in the surface of the channel region 3, the inverted region 2a2, the JFET region 2b2, the drift layer 2, the drain region 1, and the drain electrode 10. As a result, current flows from the drain electrode 10 to the source electrode 9, thus switching the standard unit 110$_{ij}$ to the ON state.

While the standard unit 110$_{ij}$ is in the ON state, the electric potential of the second gate electrode 8a of the built-in transistor 120$_{ij}$ that is connected to the first gate electrodes 8 causes the built-in transistor 120$_{ij}$ to be switched ON as well. As a result, electrons flow from the first source region 5, through the second drain region 5a and the second source region 5b of the built-in transistor 120$_{ij}$ that are connected to the first source region 5, and to the first floating electrode 9a of the built-in transistor 120$_{ij}$. At this time, the first floating electrode 9a functions as the source electrode of the built-in transistor 120$_{ij}$, which in turn functions as a MOSFET.

The flowing electrons then undergo electron-hole conversion in the second ohmic contact layer 12a or the first floating electrode 9a that contact the high concentration p-type (p$^+$) base contact region 6a. After this conversion, the holes are supplied to the channel region 3 and the base region 4, and therefore the channel region 3 and the base region 4 take the same electric potential as the first source region 5.

Meanwhile, when a voltage of less than the threshold value relative to the source electrode 9 of the standard unit 110$_{ij}$ is applied to the first gate electrodes 8, the inversion layer in the surface of the channel region 3 disappears, thus switching the standard unit 110$_{ij}$ to the OFF state in which no current flows. If a negative voltage is then applied to the first gate electrodes 8, the holes get trapped in the interface between the channel region 3 and the gate oxide film. Here, because the first potential barrier layers 13a1 and 13a2 are formed between the channel region 3 and the source electrode 9, the presence of the resulting Schottky junctions prevents the holes from being injected into the channel region 3.

The barrier height of the Schottky junctions to the holes must be at least 0.5 eV to ensure that the current density does not exceed the level required for holes to cross the barrier and be injected into the channel region and cause growth of stacking faults due to thermal excitation, and it is preferable that the barrier height be greater than or equal to 1 eV. Meanwhile, to prevent hole current from causing the parasitic bipolar effect when avalanche breakdown occurs during inductive loading or the like, it is also preferable that the barrier height be less than or equal to 2.26 eV (that is, at least 1 eV less than the 3.26 eV bandgap of the 4H—SiC) in order to make it possible to keep the voltage drop of the p-type body region due to the hole current less than or equal to approximately 1V.

The channel region 3 and the base region 4 take a negative electric potential relative to the electric potential of the source electrode 9, but this is not a problem while in the OFF state. Instead, this actually improves the breakdown voltage because the JFET regions 2b1 and 2b2 sandwiched between the base region 4 become slightly easier to pinch off. Meanwhile, when a negative voltage is applied to the drain electrode 10, the Schottky junctions become reverse-biased, and only a small amount of current flows for a short time that depends on the capacitance of the Schottky junctions.

COMPARISON EXAMPLE 1

Figure 7:
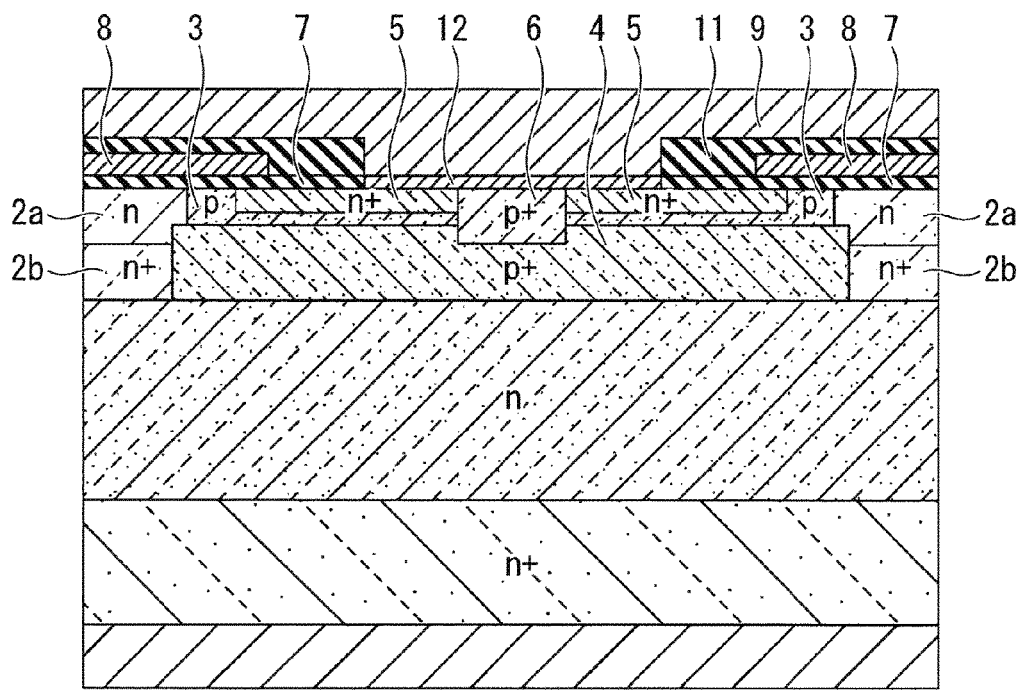
FIG. 7 is a cross-sectional view schematically illustrating a configuration of the main components of a semiconductor device according to Comparison Example 1.

A semiconductor device according to Comparison Example 1 as illustrated in FIG. 7 is a planar vertical SiC power MOSFET in which similar to in FIG. 5, a first ohmic contact layer 12 is formed on the surfaces of a base contact region 6 and a first source region 5.

This first ohmic contact layer 12 forms respective ohmic contacts with the base contact region 6 and the first source region 5. However, this configuration does not include the first potential barrier layers 13a1 and 13a2 or the built-in transistor $120_{ij}$ illustrated in FIGS. 2 and 3 and the like.

Figure 8:
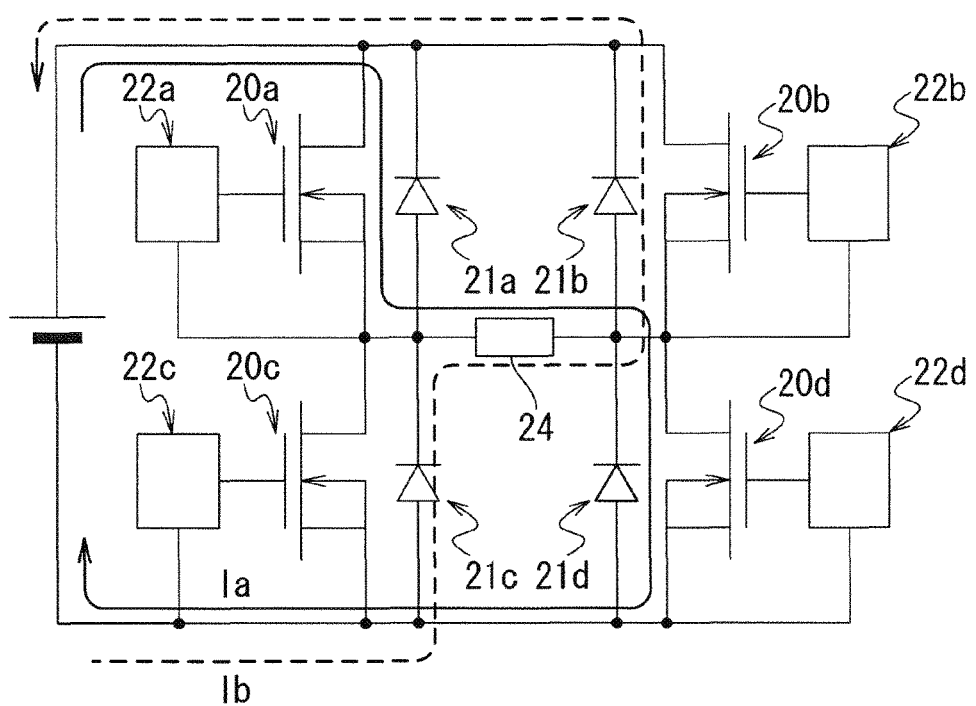
FIG. 8 is a circuit diagram schematically illustrating the operation of an inverter that includes semiconductor devices.

Assume that the semiconductor device according to Comparison Example 1 and the semiconductor device according to Embodiment 1 are respectively used to create single-phase inverters of the type illustrated in FIG. 8, in which four MOSFETs 20a to 20d are connected to a load inductor 24. When the two MOSFETs 20a and 20d are ON, a current $I_a$ flows to the load inductor 24. Moreover, when the two MOSFETs 20a and 20d are switched OFF, the current flowing through the load inductor 24 gets reversed and becomes a current $I_b$ that flows through two diodes 21c and 21b.

In the single-phase inverter that uses the semiconductor device according to Comparison Example 1, the four diodes 21a, 21b, 21c, and 21d must be relatively large-area diodes in order to prevent current from flowing through the SiC and ensure that the forward voltage of the diodes does not become greater than the built-in voltage of the SiC.

Meanwhile, in the single-phase inverter in which the semiconductor device according to Embodiment 1 is used for the four MOSFETs 20a to 20d, the first potential barrier layers 13a1 and 13a2 prevent the holes from being continuously injected into the body region (3, 4) at low reverse voltages. Therefore, even when the four diodes 21a, 21b, 21c, and 21d are relatively small-area diodes with a high forward voltage, current will not flow through the body diodes of the SiC semiconductor devices if the diodes are connected in parallel to those semiconductor devices.

COMPARISON EXAMPLE 2

Figure 9:
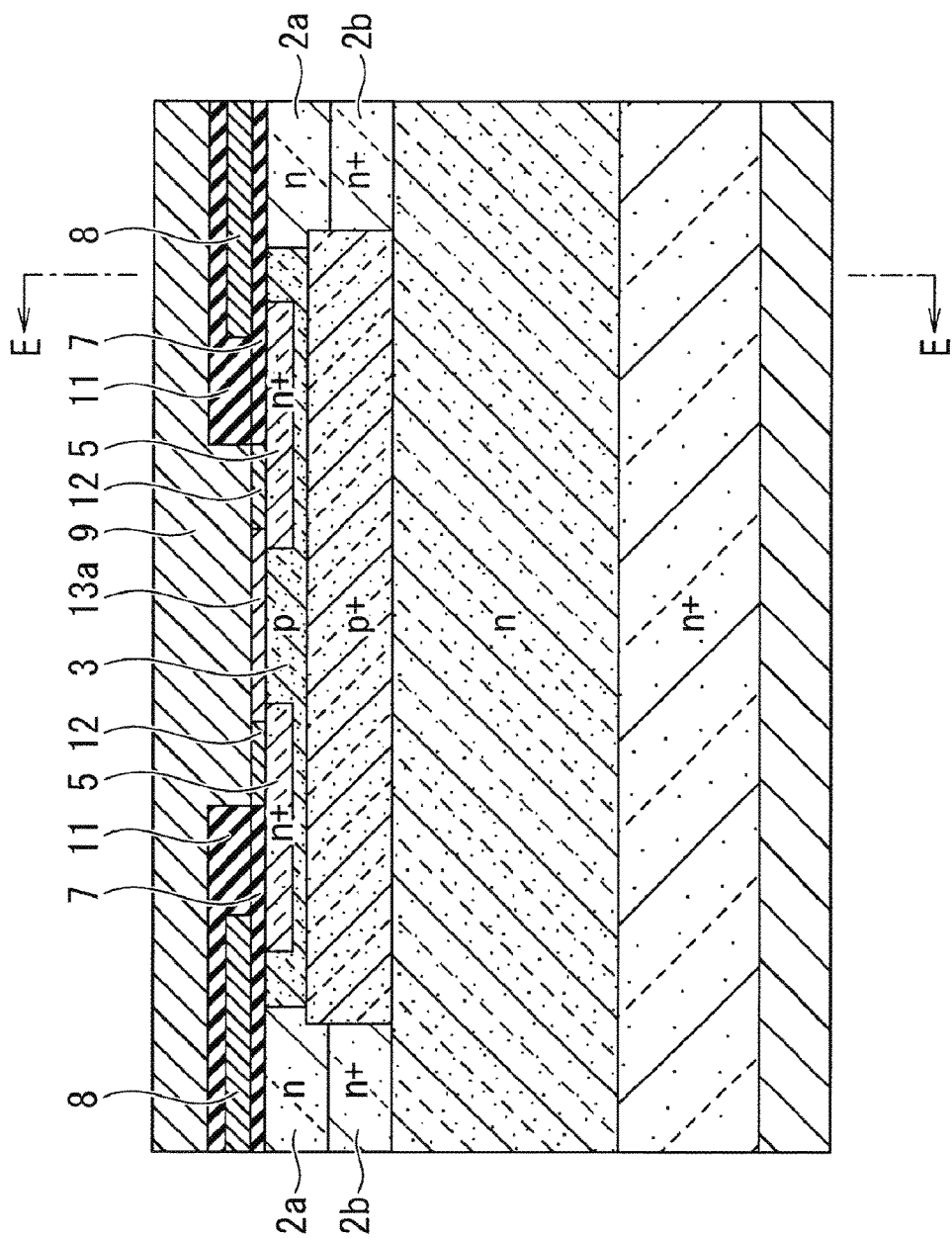
FIG. 9 is a cross-sectional view schematically illustrating a configuration of the main components of a semiconductor device according to Comparison Example 2.

FIG. 9 illustrates an SiC semiconductor device according to Comparison Example 2, which was developed by the same inventor who developed the present invention and has a structure in which a Schottky junction or heterojunction is formed in a channel region 3, thereby preventing holes from being continuously injected into the channel region 3, making it possible to extract holes when avalanche breakdown occurs, and making it possible to prevent the parasitic bipolar effect. Similar to in the semiconductor device according to Embodiment 1, in the semiconductor device according to Comparison Example 2, a first potential barrier layers 13a is formed on the surfaces of a base contact region 6 and a first source region 5.

Also similar to in the semiconductor device according to Embodiment 1, a first ohmic contact layer 12 is formed on the surface of the first source region 5. However, the built-in transistor $120_{ij}$ of the semiconductor device according to Embodiment 1 is not included.

It is well-known that in this type of MOSFET that is made of an SiC semiconductor material, a large number of energy levels are present at the MOSFET interfaces. The inventor's research revealed that the presence of these interface levels results in an increase in gate threshold voltage Vth as well as an increase in the JFET effect. Next, this phenomenon will be described with reference to the band diagram in FIGS. 10A and 10B of a channel portion of the MOSFET. In FIGS. 10A and 10B, the channel region 3 that is indicated by the solid lines and the first source region 5 that is indicated by the dashed lines are superimposed on one another, and the overlapping portions indicated by the dotted line represent portions that have the same energy.

FIG. 10A is a band diagram of a case in which a negative voltage is applied to the gate of the MOSFET and an accumulation layer is therefore formed on the surface of the channel region 3. In this state, the holes in the accumulation layer get trapped in the interface level. Meanwhile, FIG. 10B is a band diagram of a case in which a voltage greater than or equal to the gate threshold voltage Vth is applied to the gate of the MOSFET. Here, electrons fall from the first source region 5 and through the inversion layer in the channel region 3 down to the interface level and are annihilated upon recombining with the trapped holes. This phenomenon is the mechanism behind the so-called charge pumping method, which provides the same results as other methods of studying the energies and density distributions of the interface levels.

Figure 11:
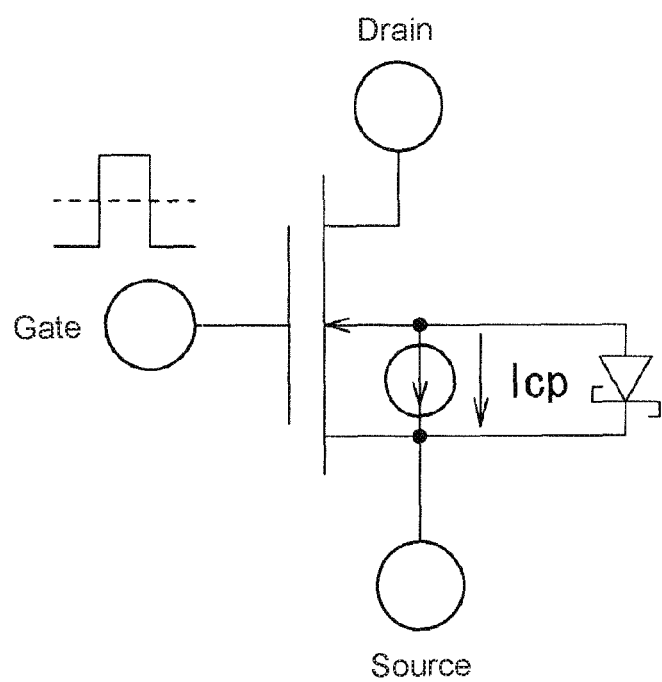
FIG. 11 is an equivalent circuit diagram of the semiconductor device according to Comparison Example 2.

Note that although the above description of FIGS. 10A and 10B assumes that hole trapping occurs, the holes are only supplied from the channel region 3, and the electrons are only supplied from the first source region 5, and therefore the same phenomenon occurs in electron trapping situations as well. Therefore, as illustrated in the equivalent circuit diagram in FIG. 11, alternately applying voltages that produce the states illustrated in FIGS. 10A and 10B to the gate of the MOSFET causes a current $I_{cp}$ to flow from the channel region 3 to the first source region 5.

When the duration for which a voltage continues to be applied to the gate is sufficiently greater than a trapping time constant and a recombination time constant, this current $I_{cp}$ can be given by equation (1), where f is the frequency of the voltage applied to the gate.

$$I_{cp} = q \cdot (N_h + N_e) f \quad (1)$$

Here, $N_h$ is the number of trapped holes and $N_e$ is the number of trapped electrons (which are determined by the amplitude of the gate voltage and the trapping energy distribution), while q is the elementary charge. Also, in FIG. 11, the current $I_{cp}$ represents the average value of the current that flows.

Due to this current $I_{cp}$, the p-type body region (3, 4) takes a negative electric potential, but this electric potential is balanced by leakage current in the Schottky junction or in the junction between the first source region 5 and the channel region 3 or the like. Therefore, when a larger number of carriers are trapped and the leakage currents are smaller, the channel region 3 takes a larger negative electric potential relative to the electric potential of the source.

As a result, the gate threshold voltage Vth of the MOSFET increases due to the so-called back-gate effect, and the JFET effect also becomes more prominent due to the increase in the reverse bias of the p-n junctions between the p-type body region (3, 4) and the JFET regions 2b1 and 2b2. This, in turn, causes the on-voltage of the MOSFET to increase. Hole trapping also depends on the flat-band voltage of the channel region but does not occur at gate voltages near 0V.

However, in normal applications such as the bridge circuit illustrated in FIG. 8, for example, switching ON the MOSFET 20a while the MOSFET 20c in the opposite arm is in the OFF state causes the maximum rate of increase dV/dt for the source-drain voltage of the MOSFET 20c to change. This change in the maximum rate of increase dV/dt causes a current to flow due to the resulting drain-gate capacitance of the MOSFET 20c, and the voltage drop associated with the gate resistance created by this current causes the gate voltage to increase and erroneously switch the MOSFET to the ON state. To prevent the MOSFET from being erroneously switched ON in this manner, a negative bias is typically applied to the gate while the MOSFET is in the OFF state.

In the semiconductor device according to Comparison Example 2, the interface levels described above are present in the MOSFET. In most cases, states in which holes get trapped only occur when the gate voltage is less than or equal to approximately 0V (although this also depends on other factors such as the flat-band voltage and the gate threshold voltage Vth as well). Therefore, in devices that have a low gate threshold voltage Vth, there are also cases in which holes do not get trapped when a gate voltage of 0V is applied. However, this phenomenon still occurs in devices with lower gate threshold voltages Vth because such devices are more prone to being erroneously switched ON, and therefore a larger negative bias must be applied to the gate to prevent the device from being erroneously switched ON. Meanwhile, in the semiconductor device according to Embodiment 1, the presence of the built-in transistor $120_{ij}$ that short-circuits the p-type body region (3, 4) and the first source region 5 while the device is ON makes it possible to prevent increases in the on-voltage due to increases in the gate threshold voltage Vth or the JFET resistance resulting from the charge pumping effect, which occurs due to the trapping levels at the gate oxide film and channel region interfaces.

In the semiconductor device according to Embodiment 1, instead of being an ohmic contact, the junction between the p-type body region (3, 4) and the source electrode 9 is a potential barrier layer that prevents the majority carriers from being injected into the body region (3, 4). Therefore, even when relatively small-area diodes with a high forward voltage are connected in parallel to the semiconductor device, holes are not continuously injected into the body region, and a current does not flow through the body diode of the semiconductor device. This prevents growth of stacking faults due to recombination, thereby making it possible to effectively solve the problem of deterioration in on-resistance.

Moreover, in the semiconductor device according to Embodiment 1, the built-in transistors $120_{ij}$ are embedded in portions near the edge termination structure 300, in portions near the gate pad 400, or in portions near the gate runner 500. Arranging the built-in transistors $120_{ij}$ of the basic cells $100_{ij}$ in this manner makes it possible to easily connect to the source electrode 9 using wire bonding or the like even when the built-in transistors $120_{ij}$ each include the first floating electrode 9a that is separated from the source electrode 9.

(Method of Manufacturing Semiconductor Device)

Figure 12:
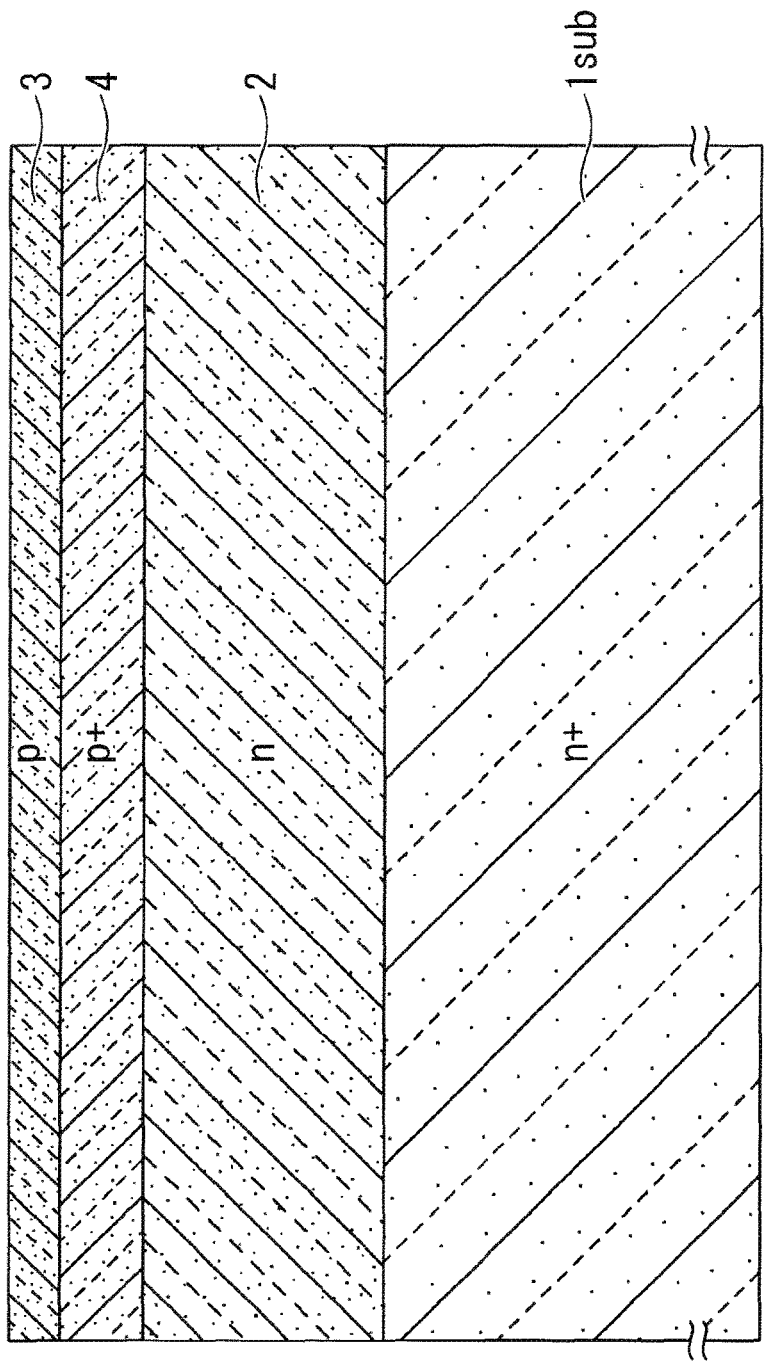
FIG. 12 is a cross-sectional view illustrating a (first) step in a method of manufacturing the semiconductor device according to Embodiment 1.

Next, an example of a method of manufacturing the semiconductor device according to Embodiment 1 will be described with reference to FIGS. 12 to 17. First, as illustrated in FIG. 12, an $n^+$4H—SiC semiconductor substrate $1_{sub}$ is prepared, for example, and an n-type drift layer 2 is formed by epitaxially growing a layer of monocrystalline 4H—SiC on the upper surface of this semiconductor substrate $1_{sub}$.

Next, a photolithography technology is used to form a mask for selectively implanting ions, and p-type impurities such as Al are ion-implanted at prescribed locations. In addition, a p-type channel region 3 is formed continuously over the top of a base region 4 by epitaxially growing another layer of monocrystalline 4H—SiC.

Epitaxially growing the channel region 3 prevents the decrease in channel mobility that occurs due to ion implantation damage when the channel region 3 is formed using an ion implantation method (such as in the so-called DMOS). This makes it possible to provide a high-performance semiconductor device with high channel mobility.

Next, a photolithography technology is used to form a resist mask for selectively implanting ions, and ions of an n-type impurity element such as nitrogen (N) ions are implanted in portions of the upper surface of the channel region 3 using a multi-stage ion implantation process in order to form inverted regions 2a1 and 2a2.

Here, setting the concentration of JFET regions 2b1 and 2b2 to be higher than the concentration of the drift layer 2 makes it possible to reduce the JFET resistance. Moreover, a current spreading layer (CSL) that reduces carrier spreading resistance may be formed at the same time as the JFET regions 2b1 and 2b2 by also introducing a higher concentration of impurities than in the drift layer 2 at the boundaries between the base region 4 and the drift layer 2 as well.

Figure 13:
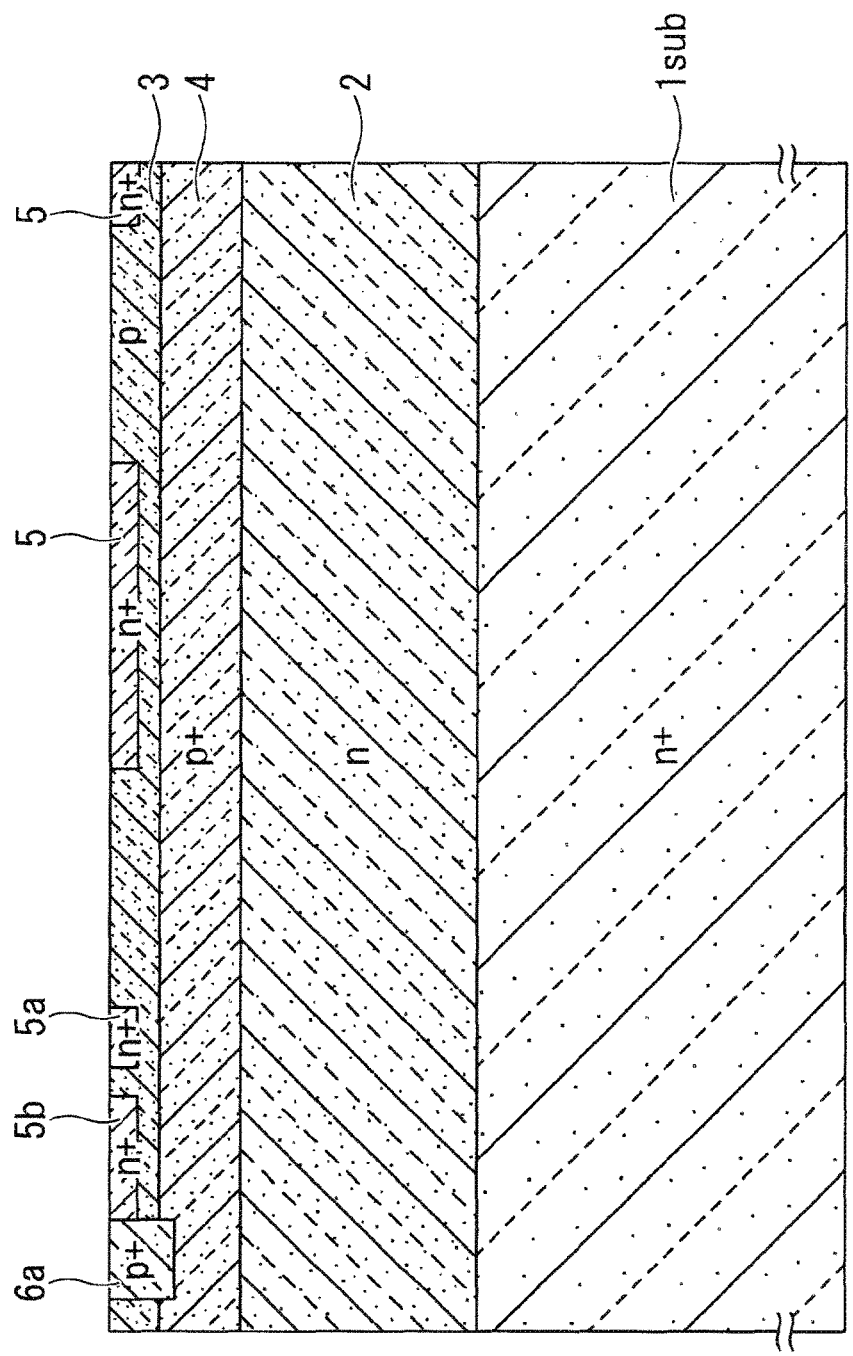
FIG. 13 is a cross-sectional view illustrating a (second) step in the method of manufacturing the semiconductor device according to Embodiment 1.

Next, a photolithography technology is used to form another resist mask for selectively implanting ions, and ions of an n-type impurity element are implanted in portions of the upper surface of the channel region 3 using an ion implantation process. As illustrated in FIG. 13, an $n^+$ first source region 5, an $n^+$ second drain region 5a, and an $n^+$ second source region 5b are all selectively formed at the same time.

Furthermore, a photolithography technology may be used to form another resist mask for selectively implanting ions, and a multi-stage ion implantation process that includes various acceleration voltages may be used to implant ions of an p-type impurity element in portions of the upper surface of the channel region 3 in a region that is reserved for forming a built-in transistor $120_{ij}$ in a later step.

This multi-stage ion implantation process may be performed in multiple stages while changing the acceleration voltage such that the projected range is adjusted to a level that cause the impurities to reach a portion of the upper surface of the base region 4 in order to selectively form a $p^+$ base contact region 6a that contacts the second source region 5b.

Figure 14:
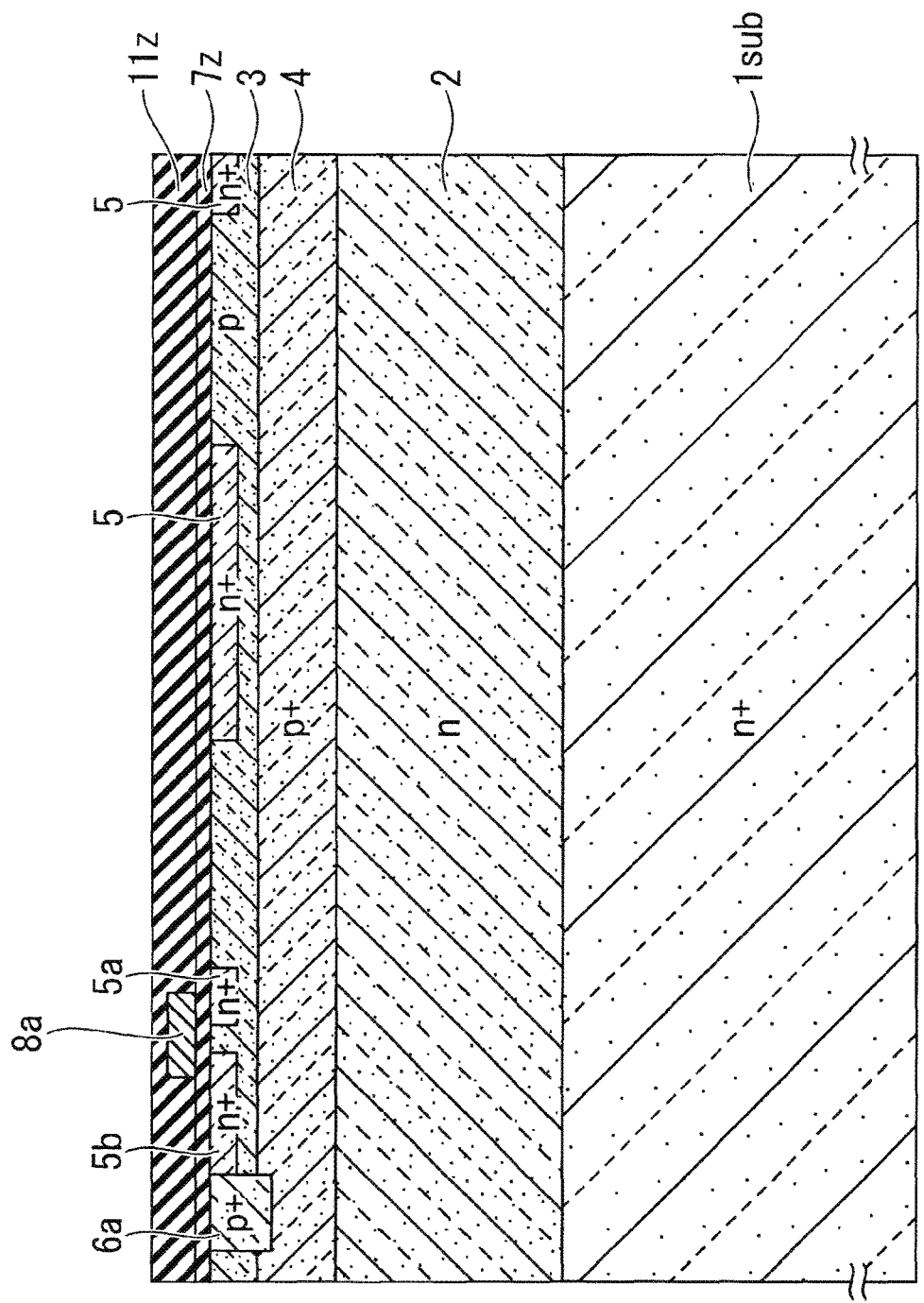
FIG. 14 is a cross-sectional view illustrating a (third) step in the method of manufacturing the semiconductor device according to Embodiment 1.

Next, as illustrated in FIG. 14, a thermal oxidation treatment is applied to the upper surface of the semiconductor substrate $1_{sub}$ in order to create an $SiO_2$ film layer as an insulating film 7z. Then, a doped polysilicon film to which impurity elements have been added is formed on the insulating film 7z using a chemical vapor deposition (CVD) process or the like. Next, this doped polysilicon film is selectively removed and patterned using a photolithography technology and an etching technology or the like in order to form a pattern that includes first gate electrodes 8 and a second gate electrode 8a.

Then, an $SiO_2$ film is formed on the first gate electrodes 8 and the second gate electrode 8a using a CVD process or the like, for example, in order to form an insulating film 11z. Next, using a photolithography technology, an etching mask for forming contact holes in a channel contact area 17b and a source/channel contact area 17c is formed.

Then, using this etching mask and a reactive ion etching (RIE) process or the like, the insulating film 7z and the insulating film 11z are selectively removed at locations above openings in the first source region 5 where the upper surface of the channel region 3 is exposed. At the same time, the portions of the insulating film 7z and the insulating film 11z that are positioned above locations between adjacent openings in the first source region 5 and above the second source region 5b and the base contact region 6a are also removed.

Figure 15:
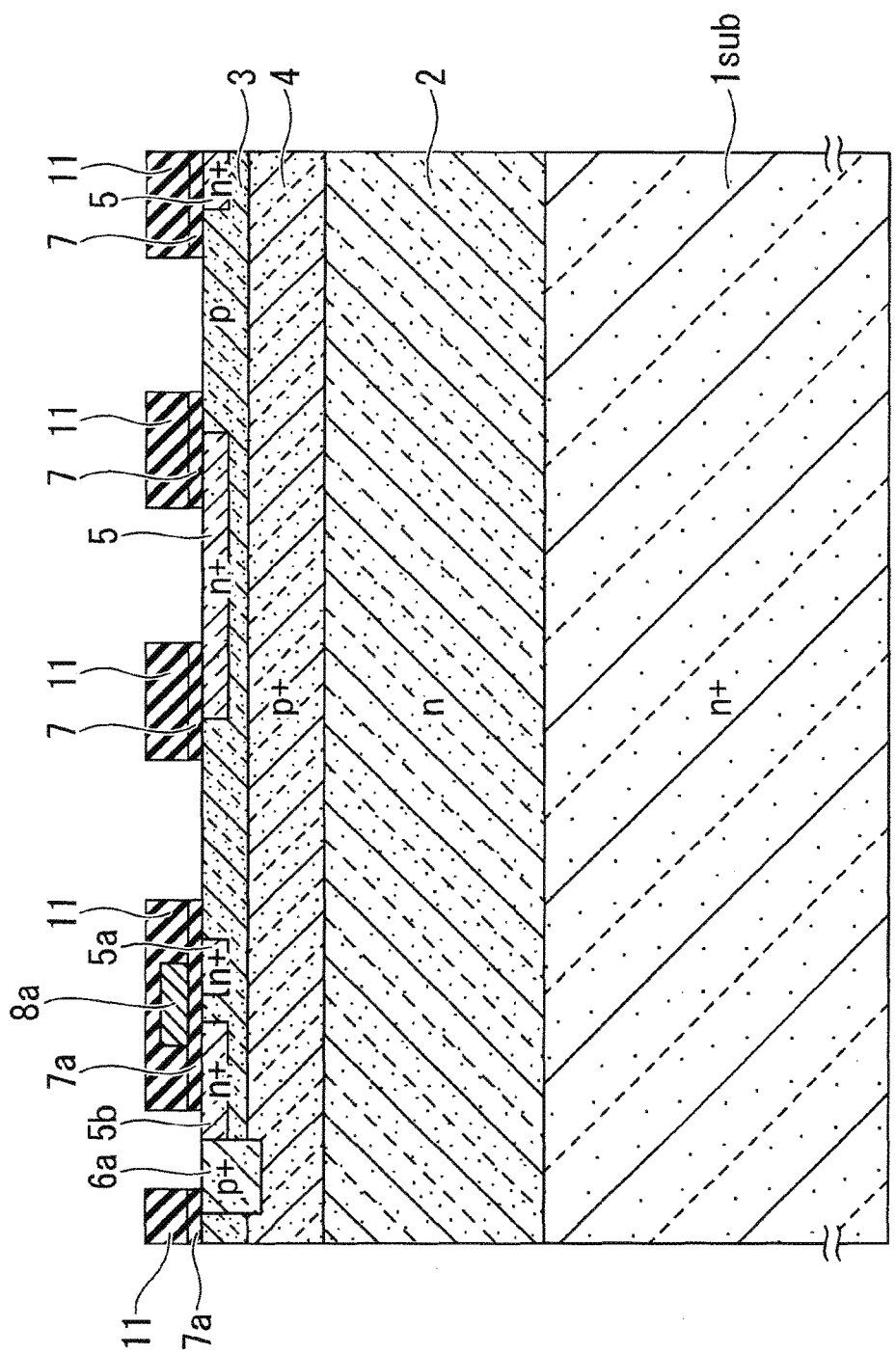
FIG. 15 is a cross-sectional view illustrating a (fourth) step in the method of manufacturing the semiconductor device according to Embodiment 1.

In this way, as illustrated in FIG. 15, a first insulating film 7 and an interlayer insulating film 11 are formed and patterned to have contact holes in a region that is reserved for forming a standard unit $110_{ij}$. At the same time, a second insulating film 7a and the interlayer insulating film 11 are similarly formed and patterned to have contact holes in the reserved formation region for the built-in transistor $120_{ij}$.

Figure 16:
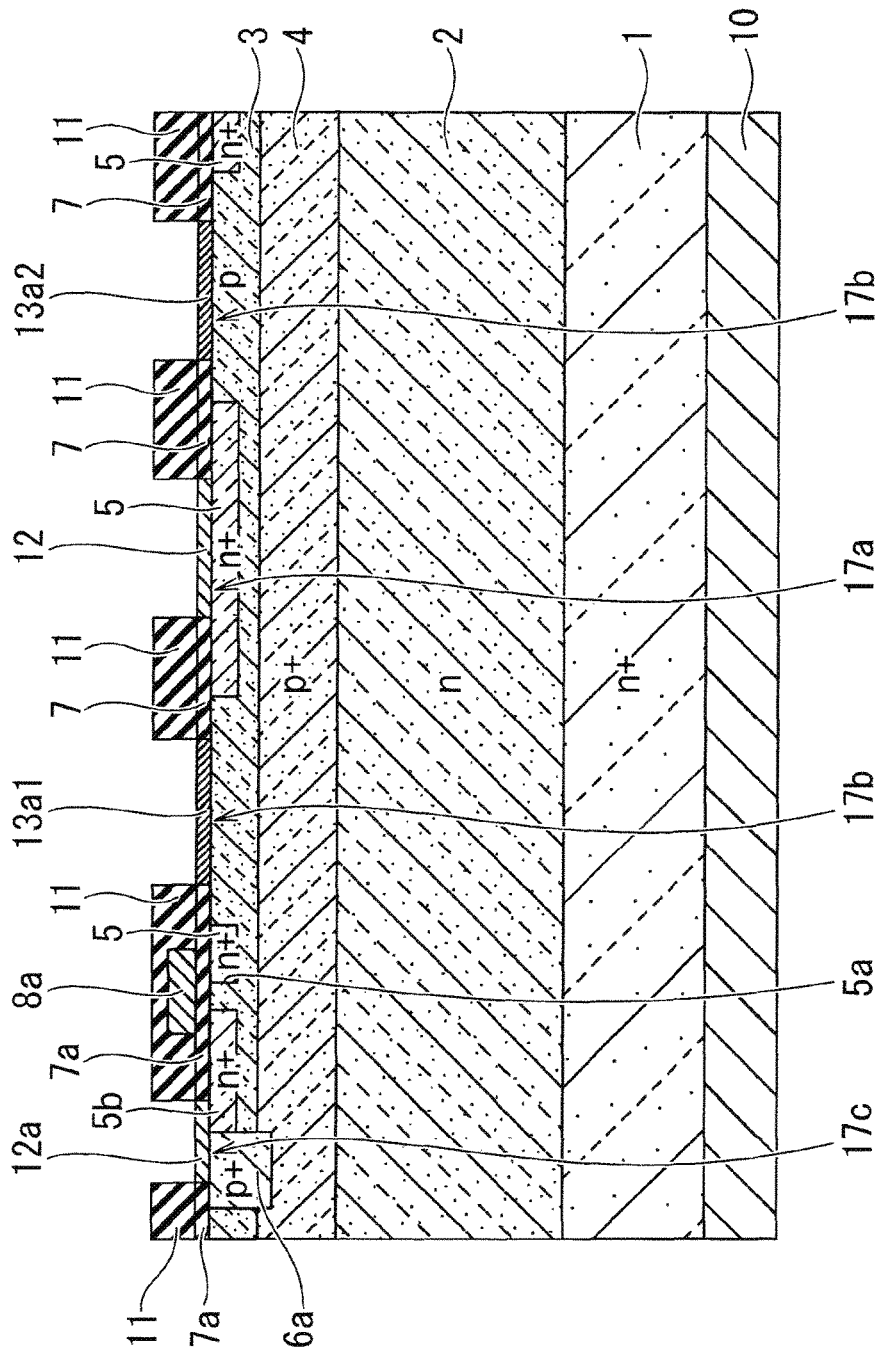
FIG. 16 is a cross-sectional view illustrating a (fifth) step in the method of manufacturing the semiconductor device according to Embodiment 1.

Next, as illustrated in FIG. 16, a metal film made of Ni, NiAl, or the like is formed on the upper surface of the semiconductor substrate $1_{sub}$ using a method such as sputtering or vacuum deposition, for example. Then, a photolithography technology is used to form an etching mask that will leave this metal film remaining only on the upper surfaces of a source contact area 17a and the source/channel contact area 17c.

Next, using this etching mask, the portions of the metal film other than those on the upper surfaces of the source contact area 17a and the source/channel contact area 17c are etched and removed, thereby simultaneously forming a first ohmic contact layer 12 and a second ohmic contact layer 12a. The first ohmic contact layer 12 and the second ohmic contact layer 12a may alternatively be formed using a lift-off process.

Next, the thickness of the bottom surface side of the semiconductor substrate $1_{sub}$ is reduced using a chemical mechanical polishing (CMP) process to form a drain region 1 of the type illustrated in FIG. 1. Then, a metal film made of Ni or the like is formed on the surface of the drain region 1 to form a drain electrode 10.

Next, the overall substrate is heat treated (sintered) to improve the ohmic contact between the first source region 5 and the first ohmic contact layer 12 and second ohmic contact layer 12a as well as the ohmic contact between the drain electrode 10 and the drain region 1. Moreover, when the first ohmic contact layer 12 and the second ohmic contact layer 12a are formed as silicide films, this heat treatment causes silicidation.

Next, a metal film for forming a Schottky junction is formed on the upper surface of the semiconductor substrate $1_{sub}$ using a method such as sputtering or vacuum deposition. Then, similar to the first ohmic contact layer 12 and the second ohmic contact layer 12a, this metal film is selectively removed using a photolithography technology and an etching technology or the like in order to simultaneously form first potential barrier layers 13a1 and 13a2.

Figure 17:
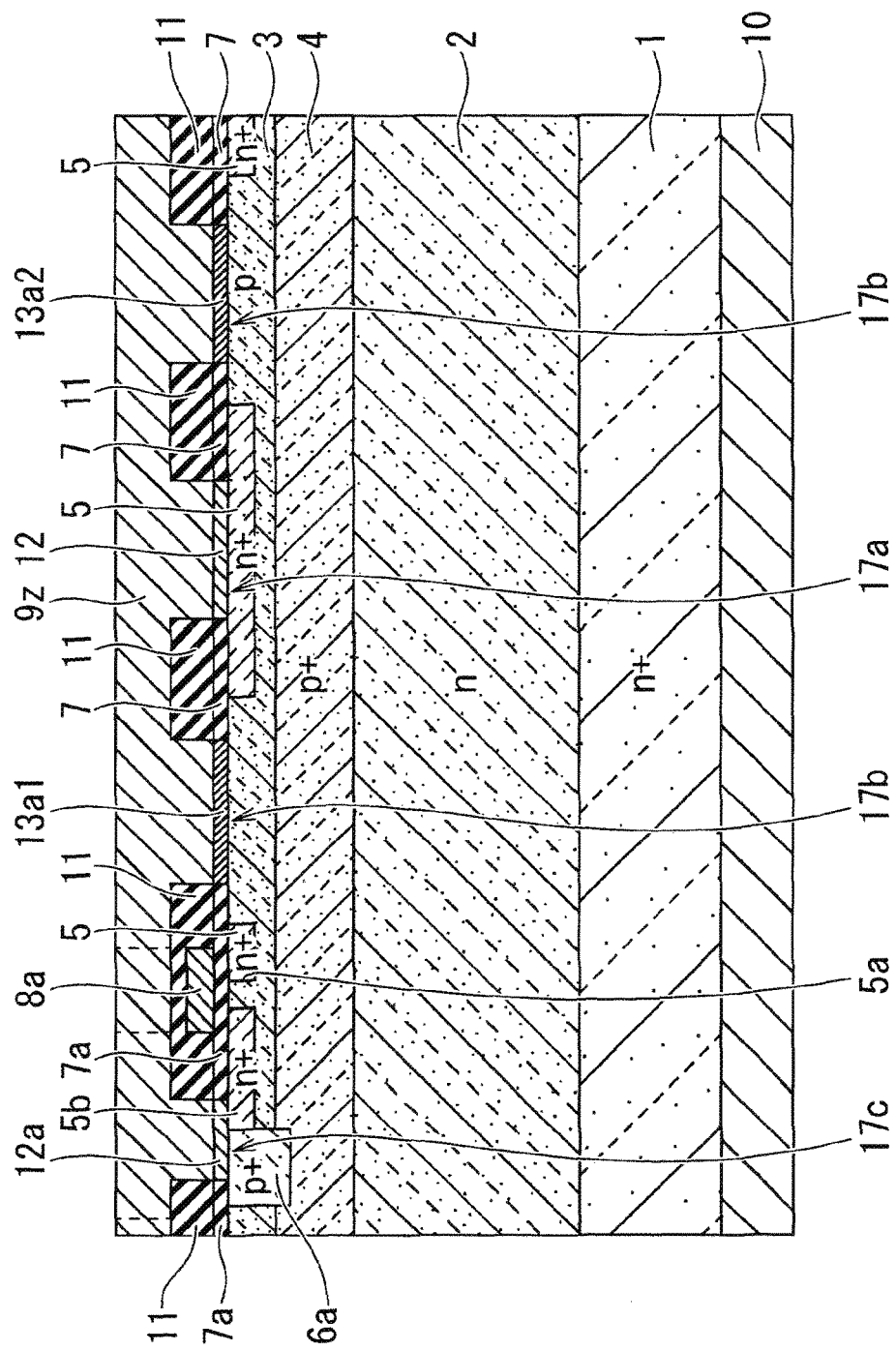
FIG. 17 is a cross-sectional view illustrating a (sixth) step in the method of manufacturing the semiconductor device according to Embodiment 1.

Next, as illustrated in FIG. 17, a metal film 9z made of Al or the like is formed over the entire surface using a method such as sputtering or vacuum deposition. Then, using a photolithography technology, a source electrode 9 is formed contacting the first potential barrier layers 13a1 and 13a2 and the first ohmic contact layer 12 as illustrated in FIG. 2. At the same time, a first floating electrode 9a of a pattern separated from the source electrode 9 is formed contacting the second ohmic contact layer 12a. Next, a passivation film (not illustrated in the figures) are formed on the source electrode 9, the first floating electrode 9a, and the interlayer insulating film 11, thus completing the semiconductor device illustrated in FIGS. 1 to 3.

<Embodiment 2>
(Structure of Semiconductor Device)

A semiconductor device according to Embodiment 2 is different than Embodiment 1 in that first potential barrier layers 13b and 13c are formed not only on the exposed portions of the surface of a channel region 3 but also on a first ohmic contact layer 12, a second ohmic contact layer 12a, and an interlayer insulating film 11.

Figure 18:
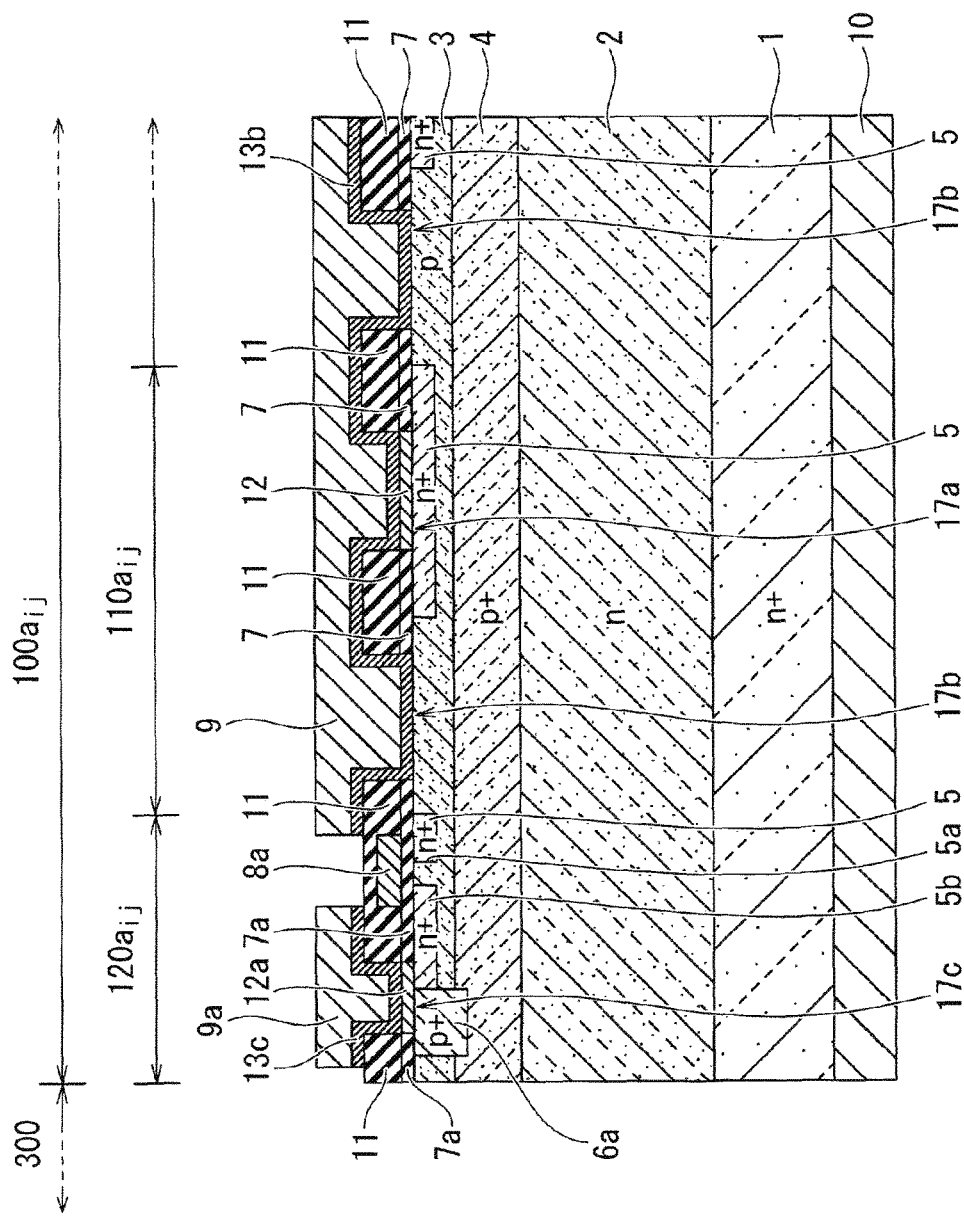
FIG. 18 is a cross-sectional view schematically illustrating a configuration of a portion of the main components of a basic cell of a semiconductor device according to Embodiment 2.

As illustrated in FIG. 18, the semiconductor device according to Embodiment 2 includes a basic cell $100a_{ij}$ that includes one or more standard units $110a_{ij}$ and one or more built-in transistors $120a_{ij}$. The semiconductor device according to Embodiment 2 also includes a high concentration n-type ($n^+$) first drain region 1 that is made primarily of SiC and is formed spanning across the standard unit $110a_{ij}$ and the built-in transistor $120a_{ij}$.

Furthermore, the semiconductor device according to Embodiment 2 includes an n-type drift layer 2 that is formed on the first drain region 1 and has a lower impurity concentration than the first drain region 1, as well as a high concentration p-type ($p^+$) base region 4 that is formed on the drift layer 2. The basic cell $100a_{ij}$ of the semiconductor device according to Embodiment 2 also includes a p-type channel region 3, which is formed on a portion of the upper surface of the base region 4 and has a lower impurity concentration than the base region 4.

In addition, the basic cell $100a_{ij}$ of the semiconductor device according to Embodiment 2 includes a high concentration n-type ($n^+$) first source region 5 formed in a portion of the upper surface of the channel region 3 of the standard unit $110a_{ij}$ and running parallel to the lengthwise direction of the stripe shape of the basic cell $100a_{ij}$. Furthermore, a first insulating film 7 is selectively formed on the channel region 3 in the standard unit $110a_{ij}$.

Moreover, first gate electrodes are formed on the first insulating film 7 and extend parallel to the lengthwise direction of the first source region 5. In addition, the first ohmic contact layer 12 is formed on the first source region 5 at a position centered between two openings that expose the channel region 3. Furthermore, a source electrode 9 is formed on the first potential barrier layer 13b that is formed on the interlayer insulating film 11 and the first ohmic contact layer 12.

The basic cell $100a_{ij}$ of the semiconductor device according to Embodiment 2 also includes a second drain region 5a of a first conductivity type that is formed in a portion of the upper surface of the channel region 3 in the built-in transistor $120a_{ij}$ region and that is electrically connected to the first source region 5. The second drain region 5a is formed as an integrated part of the first source region 5.

Furthermore, the basic cell $100a_{ij}$ of the semiconductor device according to Embodiment 2 also includes a high concentration n-type ($n^+$) second source region 5b that is formed in a portion of the upper surface of the channel region 3 in the built-in transistor $120a_{ij}$ region and that is separated from the second drain region 5a.

Furthermore, a second insulating film 7a is formed on the channel region 3 between the second drain region 5a and the second source region 5b, and a second gate electrode 8a that is electrically connected to the first gate electrodes 8 is formed on the second insulating film 7a. The rest of the components of the structure of the semiconductor device according to Embodiment 2 are the same as the corresponding layers, regions, and the like of the semiconductor device according to Embodiment 1, and therefore a redundant description will be omitted here.

Figure 19:
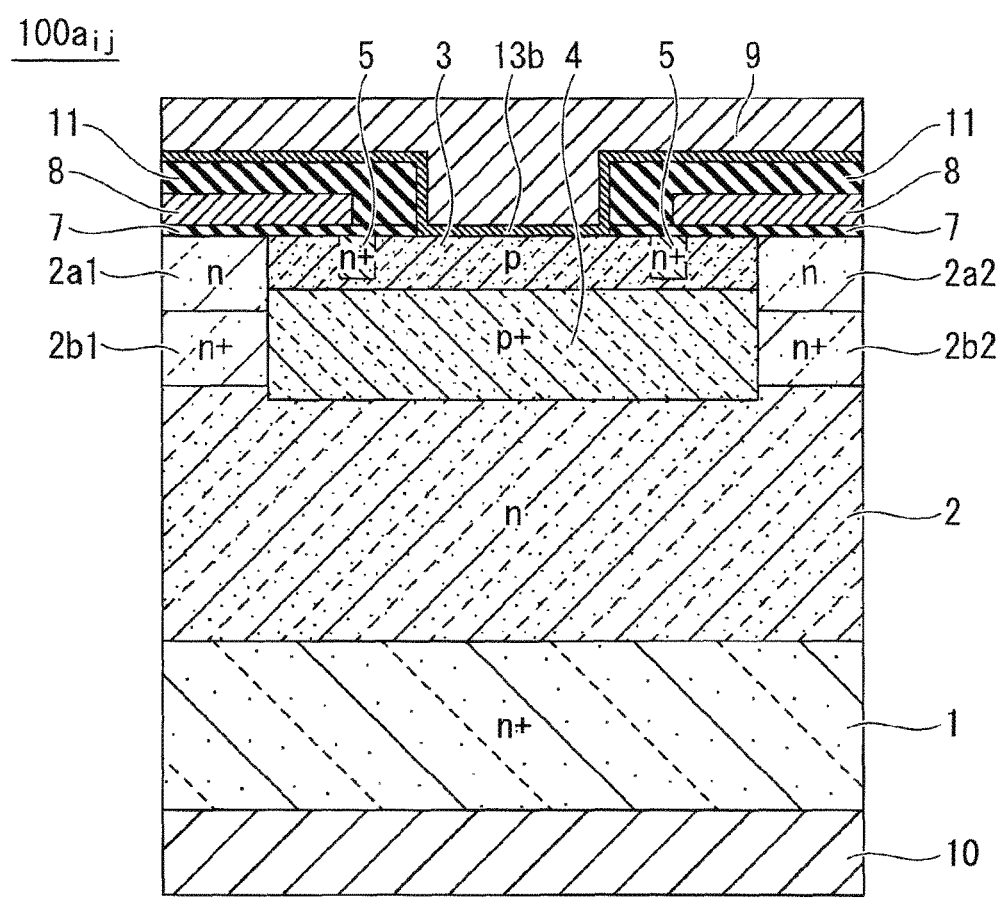
FIG. 19 is a cross-sectional view schematically illustrating a configuration of a portion of the main components of the basic cell of the semiconductor device according to Embodiment 2 as viewed along a direction corresponding to line B-B in FIG. 3.
Figure 20:
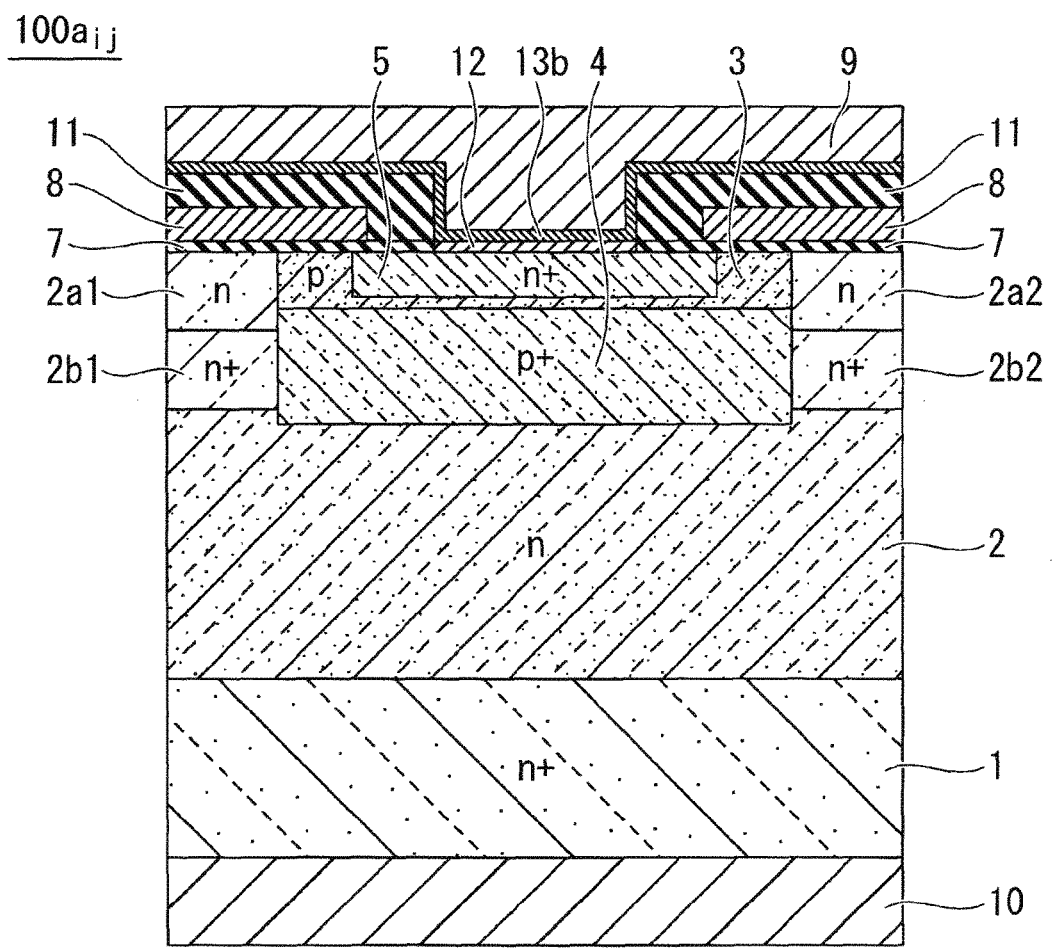
FIG. 20 is a cross-sectional view schematically illustrating a configuration of a portion of the main components of the basic cell of the semiconductor device according to Embodiment 2 as viewed along a direction corresponding to line C-C in FIG. 3.

As illustrated in FIG. 19, in the semiconductor device according to Embodiment 2, the first potential barrier layer 13b that is arranged on the openings in the first source region 5 is formed not only on the exposed surfaces of the channel region 3 but is also formed on the interlayer insulating film 11 in a continuous manner with the portions on those surfaces. As illustrated in FIG. 20, the first potential barrier layer 13b extends over the interlayer insulating film 11 in the standard unit $110a_{ij}$ region and is also formed on the first ohmic contact layer 12 that is arranged on the first source region 5 between the adjacent openings therein.

When a Schottky electrode made of a Schottky metal such as Ti is used for the first potential barrier layers 13b and 13c, the first potential barrier layers 13b and 13c function as barrier layers and prevent deterioration in the performance of the semiconductor device. Moreover, forming the first potential barrier layers 13b and 13c as a film over the entire upper surface of the semiconductor substrate and then etching the first potential barrier layers 13b and 13c using the same photomask used to form the source electrode 9 makes it possible to reduce the number of manufacturing steps. The rest of the effects of the semiconductor device according to Embodiment 2 are the same as those of the semiconductor device according to Embodiment 1.

<Embodiment 3>

(Structure of Semiconductor Device)

A semiconductor device according to Embodiment 3 is different than Embodiment 1 in that p-type (p$^+$) regions 3a with a relatively high impurity concentration of approximately $1 \times 10^{18}$ cm$^{-3}$, for example, are formed in portions of a channel region 3 that contact first potential barrier layers 13a1 and 13a2.

Figure 21:
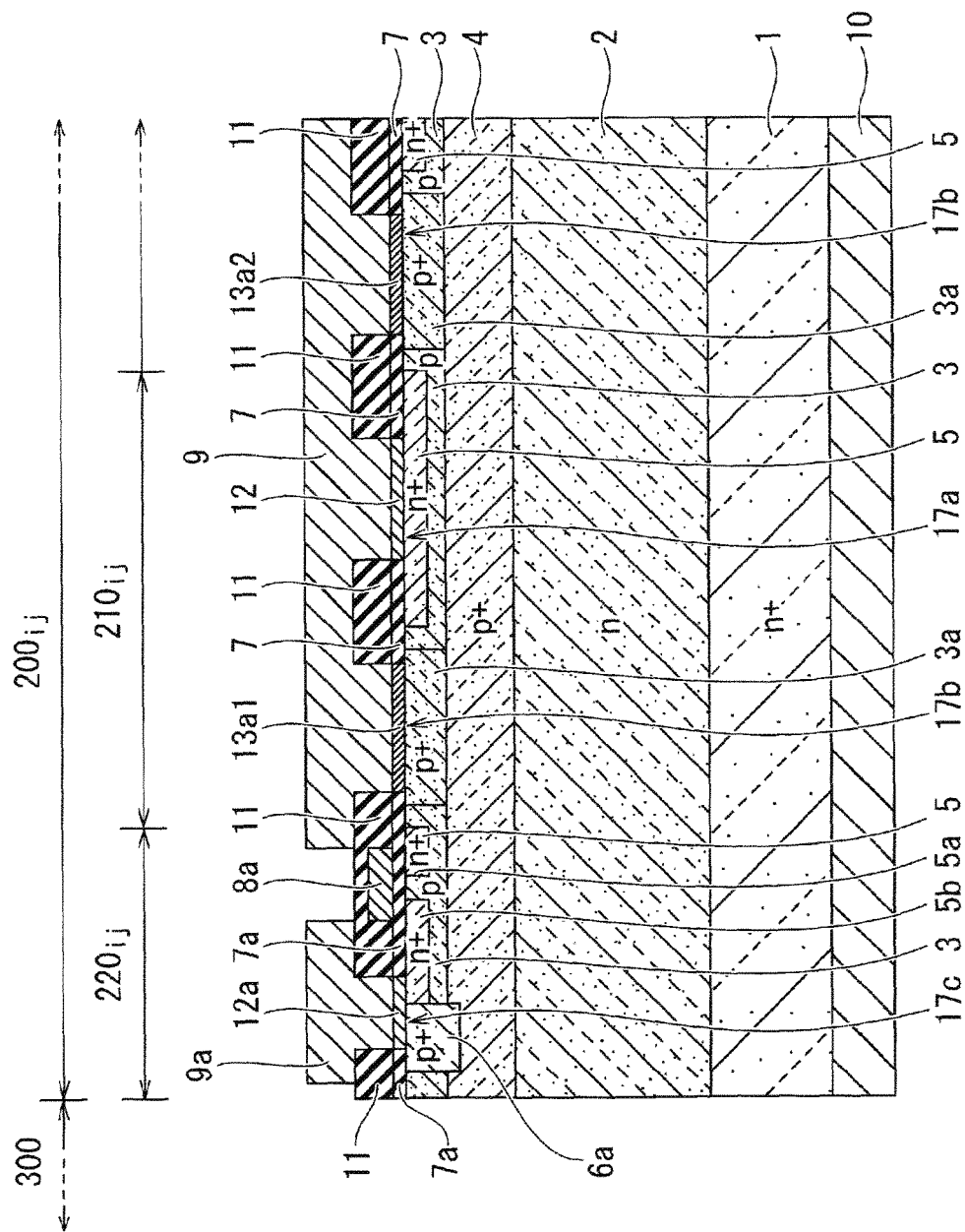
FIG. 21 is a cross-sectional view schematically illustrating a configuration of a portion of the main components of a basic cell of a semiconductor device according to Embodiment 3 as viewed along line H-H in FIG. 22.

As illustrated in FIG. 21, the semiconductor device according to Embodiment 3 includes a basic cell $200_{ij}$ that includes one or more standard units $210_{ij}$ and one or more built-in transistors $220_{ij}$. The semiconductor device according to Embodiment 3 also includes a high concentration n-type (n$^+$) first drain region 1 that is made primarily of SiC and is formed spanning across the standard unit $210_{ij}$ and the built-in transistor $220_{ij}$.

Furthermore, the basic cell $200_{ij}$ of the semiconductor device according to Embodiment 3 includes an n-type drift layer 2 that is formed on the first drain region 1 and has a lower impurity concentration than the first drain region 1, as well as a high concentration p-type (p$^+$) base region 4 that is formed on the drift layer 2. The basic cell $200_{ij}$ of the semiconductor device according to Embodiment 3 also includes a p-type channel region 3, which is formed on a portion of the upper surface of the base region 4 and has a lower impurity concentration than the base region 4.

The semiconductor device according to Embodiment 3 also includes a high concentration n-type (n$^+$) first source region 5 formed in a portion of the upper surface of the channel region 3 of the standard unit $210_{ij}$ and running parallel to the lengthwise direction of the stripe shape of the basic cell $200_{ij}$. Furthermore, a first insulating film 7 is selectively formed on the channel region 3 in the standard unit $210_{ij}$. Moreover, first gate electrodes are formed on the first insulating film 7 and extend parallel to the lengthwise direction of the first source region 5.

In addition, the first potential barrier layers 13a1 and 13a2 are formed on the channel region 3 where exposed by openings in the first source region 5 in order to prevent the majority carriers from being injected into the channel region 3. A first ohmic contact layer 12 is formed on a portion of the first source region 5 where no opening is present. Furthermore, a source electrode 9 is formed on an interlayer insulating film 11, the first ohmic contact layer 12, and the first potential barrier layers 13a1 and 13a2.

The basic cell $200_{ij}$ of the semiconductor device according to Embodiment 3 also includes a second drain region 5a of a first conductivity type that is formed in a portion of the upper surface of the channel region 3 in the built-in transistor $220_{ij}$ region and that is electrically connected to the first source region 5. The second drain region 5a is formed as an integrated part of the first source region 5.

Furthermore, the basic cell $200_{ij}$ of the semiconductor device according to Embodiment 3 also includes a high concentration n-type (n$^+$) second source region 5b that is formed in a portion of the upper surface of the channel region 3 in the built-in transistor $220_{ij}$ region and that is separated from the second drain region 5a. Furthermore, a second insulating film 7a is formed on the channel region 3 between the second drain region 5a and the second source region 5b, and a second gate electrode 8a that is electrically connected to the first gate electrodes 8 is formed on the second insulating film 7a.

Figure 22:
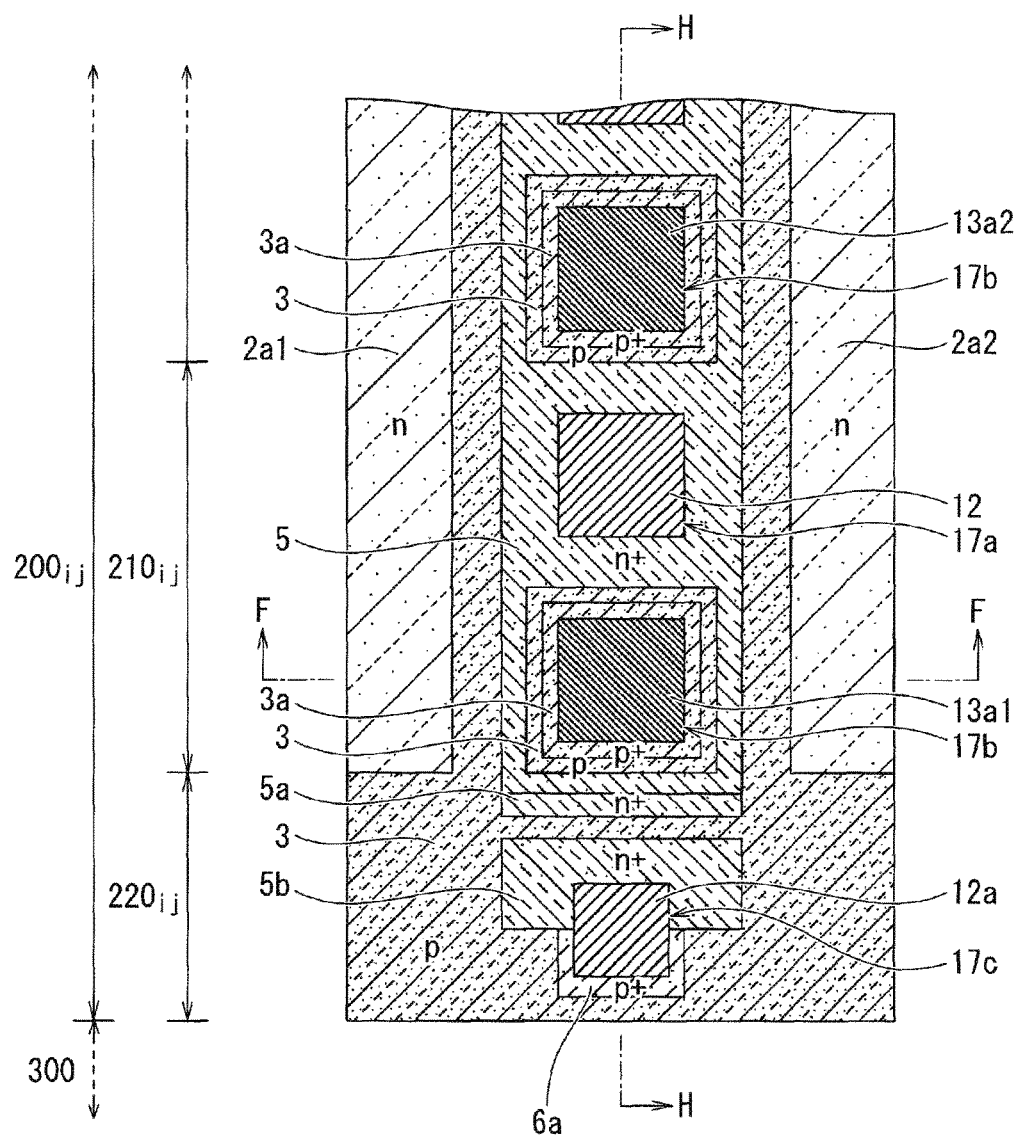
FIG. 22 schematically illustrates a configuration of a portion of the main components of the basic cell of the semiconductor device according to Embodiment 3 in a state in which layers above the upper surface of a channel region have been removed but potential barrier layers and ohmic contact layers have already been formed.
Figure 23:
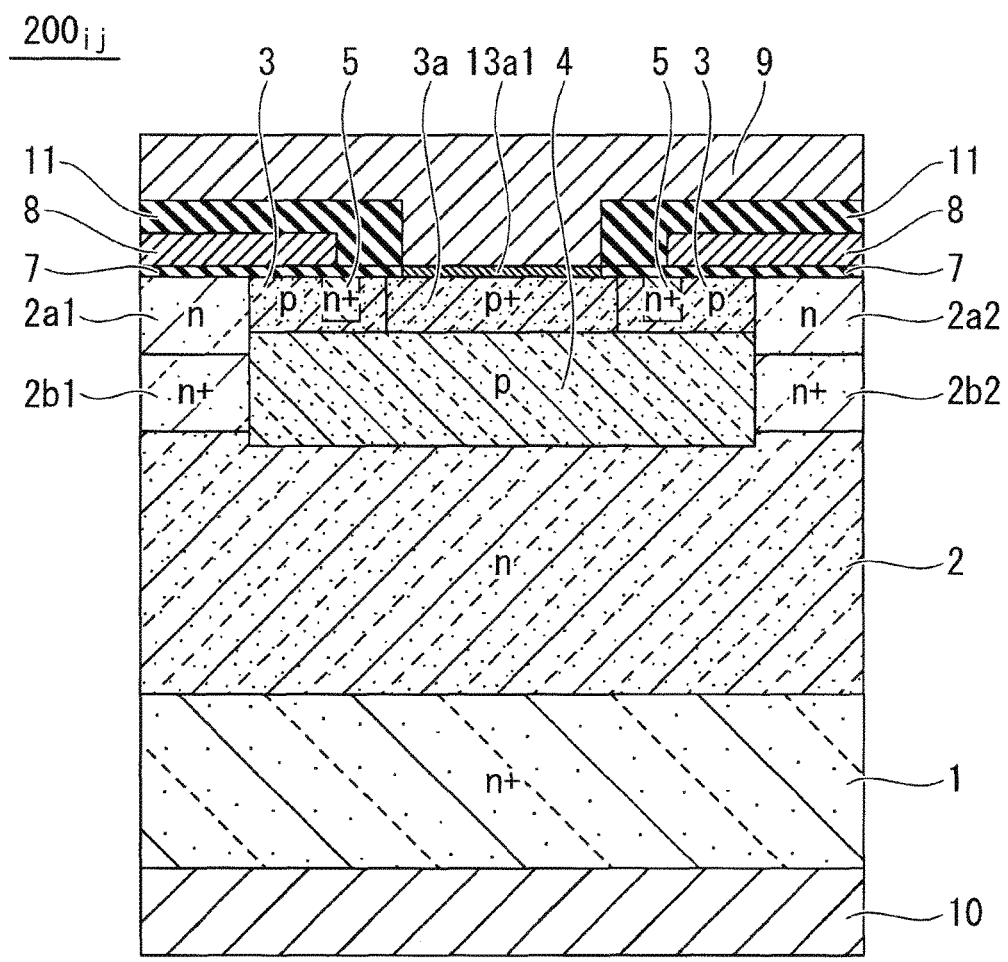
FIG. 23 is a cross-sectional view schematically illustrating a configuration of a portion of the main components of the basic cell of the semiconductor device according to Embodiment 3 as viewed along line F-F in FIG. 22.

As illustrated in FIG. 22, the p-type regions 3a are substantially rectangular, and the rectangular outer peripheries thereof are positioned on the inner periphery side of the openings in the first source region 5 and between the outer peripheries of the substantially rectangular first potential barrier layers 13a1 and 13a2 and the inner peripheries of the substantially rectangular openings. Moreover, as illustrated in FIG. 23, the p-type regions 3a have substantially the same thickness as the channel region 3. The rest of the components of the structure of the semiconductor device according to Embodiment 3 are the same as the corresponding layers, regions, and the like of the semiconductor devices according to Embodiments 1 and 2, and therefore a redundant description will be omitted here.

The semiconductor device according to Embodiment 3 makes it possible to reduce the voltage drop caused by the current that flows when holes that are created due to avalanche breakdown or the like are expelled via the Schottky junction, thereby making it possible to reduce occurrence of the parasitic bipolar effect. This remains effective even when the impurity concentration of the overall channel region 3 is increased and the gate threshold voltage Vth is increased. The rest of the effects of the semiconductor device according to Embodiment 3 are the same as those of the semiconductor device according to Embodiment 1.

<Embodiment 4>

(Structure of Semiconductor Device)

Figure 24:
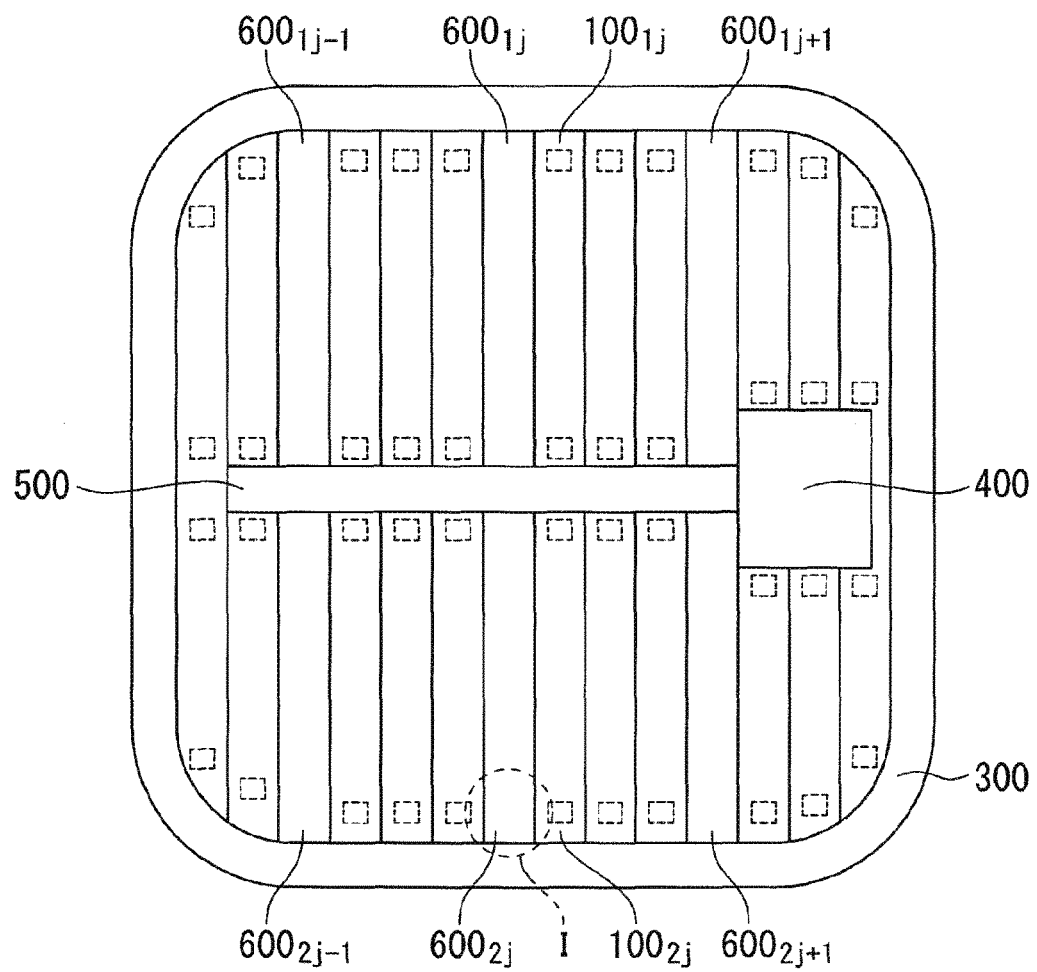
FIG. 24 is a plan view schematically illustrating an overall configuration of a semiconductor device according to Embodiment 4.

As illustrated in FIG. 24, the semiconductor device according to Embodiment 4 is different than Embodiment 1 in that n-type Schottky cells . . . , $600_{1j-1}$, $600_{1j}$, $600_{1j+1}$, . . . and . . . , $600_{2j-1}$, $600_{2j}$, $600_{2j+1}$, . . . are formed in the active portion. These n-type Schottky cells $600_{ij}$ are embedded in the active portion and interspersed among normal basic cells $100_{ij}$.

In other words, similar to in the basic cells $100_{ij}$ in the semiconductor device according to Embodiment 1, the semiconductor device according to Embodiment 4 includes a high concentration n-type (n$^+$) first drain region 1 that is made primarily of SiC and is formed spanning across standard units 110$_{ij}$ and built-in transistors 120$_{ij}$ as well as an n-type drift layer 2 that is formed on the first drain region 1 and has a lower impurity concentration than the first drain region 1.

The basic cells 100$_{ij}$ of the semiconductor device according to Embodiment 4 also include a high concentration p-type (p$^+$) base region 4 that is formed on the drift layer 2 and a p-type channel region 3 that is formed on a portion of the upper surface of the base region 4 and has a lower impurity concentration than the base region 4.

In addition, the basic cell 100$_{ij}$ of the semiconductor device according to Embodiment 4 includes a high concentration n-type (n$^+$) first source region 5 formed in a portion of the upper surface of the channel region 3 of the standard unit 110$_{ij}$ and running parallel to the lengthwise direction of the stripe shape of the basic cell 100$_{ij}$. Furthermore, a first insulating film 7 is selectively formed on the channel region 3 in the standard unit 110$_{ij}$.

Moreover, first gate electrodes are formed on the first insulating film 7 and extend parallel to the lengthwise direction of the first source region 5. In addition, first potential barrier layers 13$a$1 and 13$a$2 are formed on the channel region 3 where exposed by openings in the first source region 5 in order to prevent the majority carriers from being injected into the channel region 3.

A first ohmic contact layer 12 is formed on the first source region 5 between adjacent openings therein. Furthermore, a source electrode 9 is formed on an interlayer insulating film 11, the first ohmic contact layer 12, and the first potential barrier layers 13$a$1 and 13$a$2.

The basic cell 100$_{ij}$ of the semiconductor device according to Embodiment 4 also includes a second drain region 5$a$ of a first conductivity type that is formed in a portion of the upper surface of the channel region 3 in the built-in transistor 120$_{ij}$ region and that is electrically connected to the first source region 5. The second drain region 5$a$ is formed as an integrated part of the first source region 5.

Furthermore, the basic cell 100$_{ij}$ of the semiconductor device according to Embodiment 4 also includes a high concentration n-type (n$^+$) second source region 5$b$ that is formed in a portion of the upper surface of the channel region 3 in the built-in transistor 120$_{ij}$ region and that is separated from the second drain region 5$a$. In addition, a second insulating film 7$a$ is selectively formed on the channel region 3 between the second drain region 5$a$ and the second source region 5$b$.

A second gate electrode 8$a$ that is electrically connected to the first gate electrodes 8 is formed on the second insulating film 7$a$. The rest of the components in the structure of the basic cell 100$_{ij}$ of the semiconductor device according to Embodiment 4 are the same as the corresponding layers, regions, and the like of the semiconductor devices according to Embodiments 1 to 3, and therefore a redundant description will be omitted here.

Figure 25:
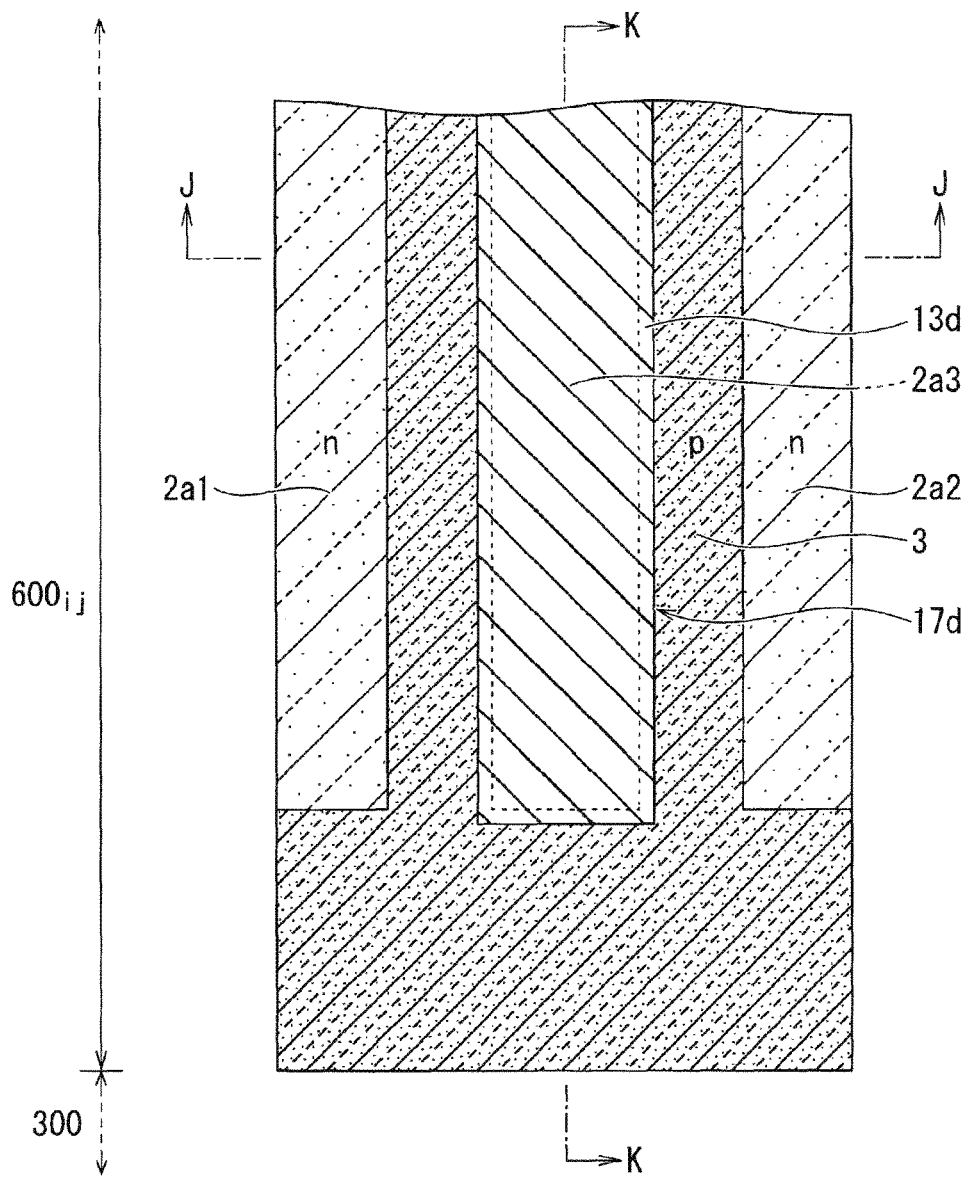
FIG. 25 is an enlarged partial plan view of region I in FIG. 24 and schematically illustrates a configuration of a portion of the main components of an n-type Schottky cell of the semiconductor device according to Embodiment 4 in a state in which layers above the upper surface of a channel region have been removed but potential barrier layers and ohmic contact layers have already been formed.
Figure 26:
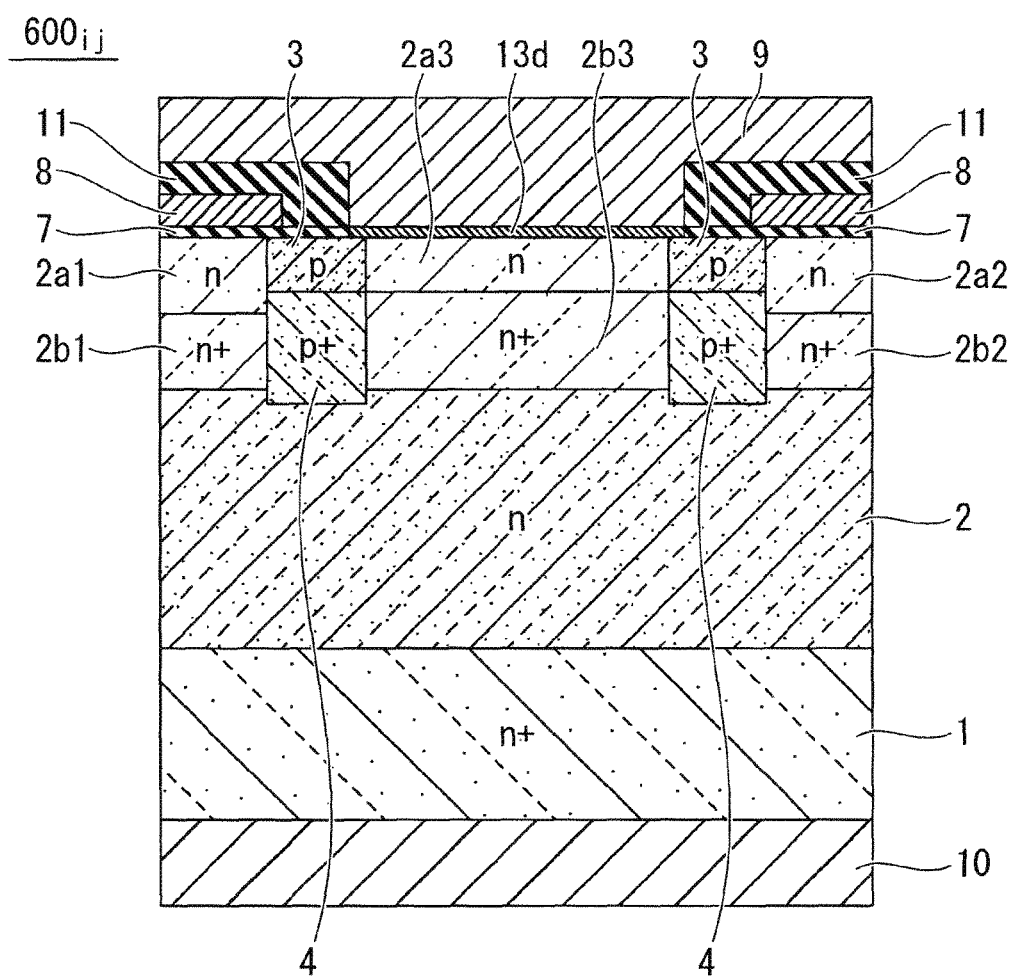
FIG. 26 is a cross-sectional view schematically illustrating a configuration of a portion of the main components of the n-type Schottky cell of the semiconductor device according to Embodiment 4 as viewed along line J-J in FIG. 25.

As illustrated in the region surrounded by the dotted line in FIG. 25, in the n-type Schottky cells 600$ij$, the channel region 3 and the base region 4 beneath the channel region 3 as illustrated in FIG. 2 are not formed, and the upper surface of an inverted region 2$a$3 is exposed on the surface of a body region. As illustrated in FIG. 26, a first potential barrier layer 13$d$ that is made of a Schottky metal is formed on the upper surface of the inverted region 2$a$3 and overlapping with the portion of the channel region 3 that surrounds the inverted region 2$a$3. Moreover, as illustrated in FIG. 26, a high concentration n-type (n$^+$) JFET region 2$b$3 is formed beneath the inverted region 2$a$3.

It is preferable that the gap in the channel region 3 that sandwiches the inverted region 2$a$3 be the same as in the basic cell 100$_{ij}$ in order to maintain the breakdown voltage. Moreover, the width of the n-type Schottky cells 600$_{ij}$ may be greater than that of the basic cells 100$_{ij}$. However, increasing the width of the n-type Schottky cells 600$_{ij}$ decreases the breakdown voltage, and therefore in this case a plurality of channel regions 3 and base regions 4 should be formed in the n-type Schottky cells 600$_{ij}$ in order to keep the gaps in the channel region 3 uniform.

Figure 27:
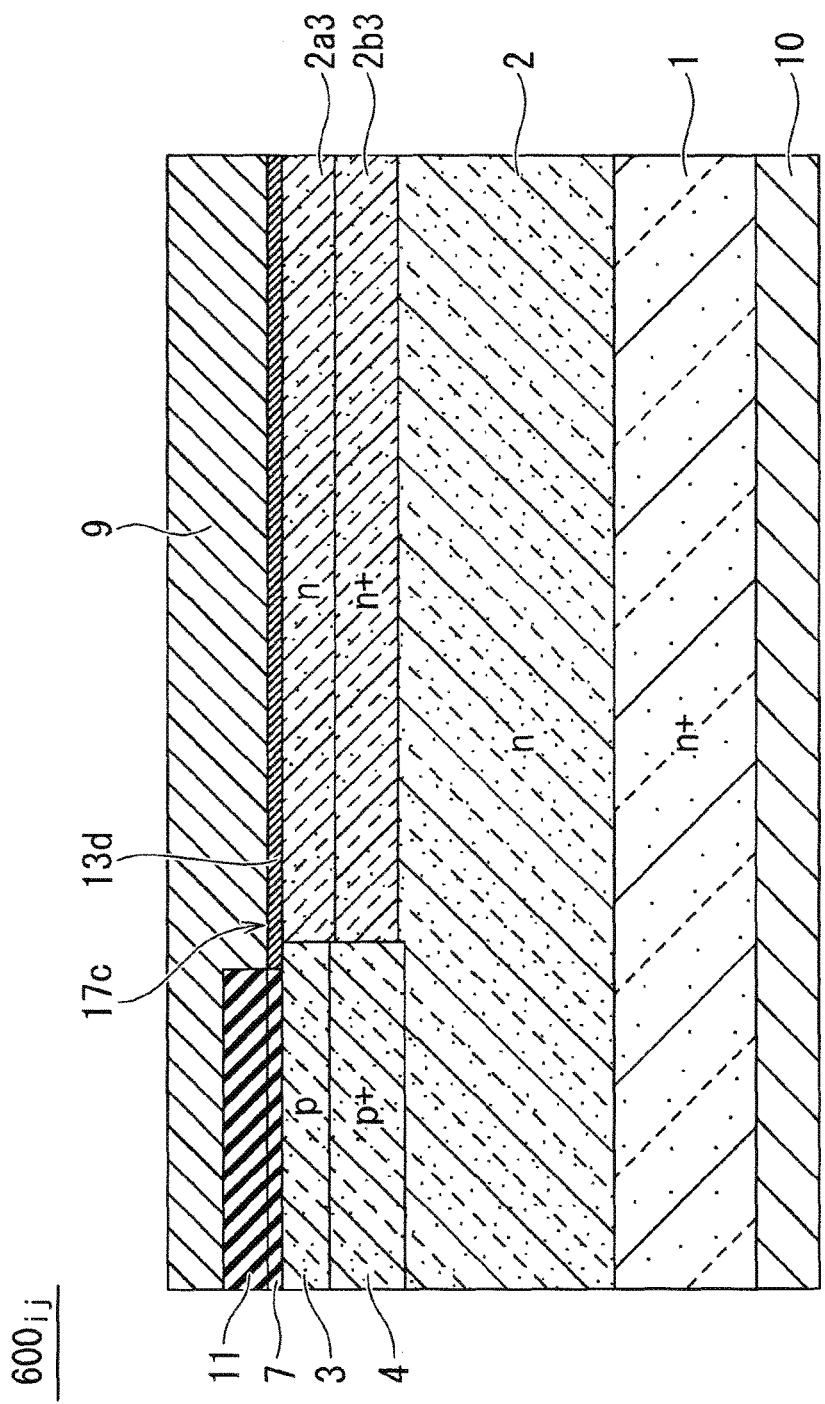
FIG. 27 is a cross-sectional view schematically illustrating a configuration of a portion of the main components of the n-type Schottky cell of the semiconductor device according to Embodiment 4 as viewed along line K-K in FIG. 25.

Furthermore, as illustrated in FIG. 27, the first potential barrier layer 13$d$ is connected to the source electrode 9 via a source/channel contact area 17$c$ (which is a Schottky contact area). In addition, the channel region 3 and the base region 4 beneath the channel region 3 are connected to the basic cells 100$_{ij}$ by the ends of the n-type Schottky cells 600$_{ij}$.

Although in Embodiment 4 the first potential barrier layer 13$d$ is also formed on a portion of the channel region 3, the first potential barrier layer 13$d$ and the contact area may alternatively be formed just on the inverted regions 2$a$1 and 2$a$2.

The same p-type or n-type metal may be used throughout for the Schottky metal used to form the first potential barrier layer 13$d$, or different metals with the optimal conductivity types for those metals may be used.

Moreover, in the n-type Schottky cell 600$_{ij}$ illustrated in FIGS. 24 to 27, a lateral MOSFET that functions as a built-in transistor 120$_{ij}$ is not formed. However, a built-in transistor 120$_{ij}$ may be formed by extending the first source region 5 from the adjacent basic cell 100 to form a second drain region 5$a$ for that built-in transistor 120$_{ij}$.

In the semiconductor device according to Embodiment 4, the n-type Schottky junctions can function as a built-in Schottky diode that is connected in parallel to the semiconductor device, thereby removing the need to connect a separate Schottky diode to the semiconductor device externally. Moreover, the semiconductor device according to Embodiment 4 makes it possible to form Schottky barrier diodes on the same chip without increasing the number of manufacturing steps.

P-type Schottky junctions currently do not yet exhibit satisfactory levels of performance. This is because for a given concentration of p-type or n-type impurities, the p-type impurities exhibit a larger resistance and a relatively large contact resistance. Therefore, in order to prevent the voltage drop and the parasitic bipolar effect from being significant when hole current flows to the source electrode due to avalanche breakdown or the like, relatively large Schottky regions would need to be formed.

The n-type Schottky junctions in the semiconductor device of the present invention are therefore particularly advantageous in that these Schottky junctions can have a smaller area, which minimizes any increases in chip area and also removes the need for die bonding components or wire bonding processes for connecting external Schottky diodes. The rest of the effects of the semiconductor device according to Embodiment 4 are the same as those of the semiconductor device according to Embodiment 1.

<Embodiment 5>

(Structure of Semiconductor Device)

In the semiconductor devices illustrated in FIGS. 1 to 27, the first gate electrodes 8 were all planar gates. A semiconductor device according to Embodiment 5 is therefore different than Embodiment 1 in that this semiconductor device has a trench-gate structure in which trenches 18a and 18b are formed in inverted regions 2a1 and 2a2 and in portions of a channel region 3 that contacts the inverted regions 2a1 and 2a2.

Figure 28:
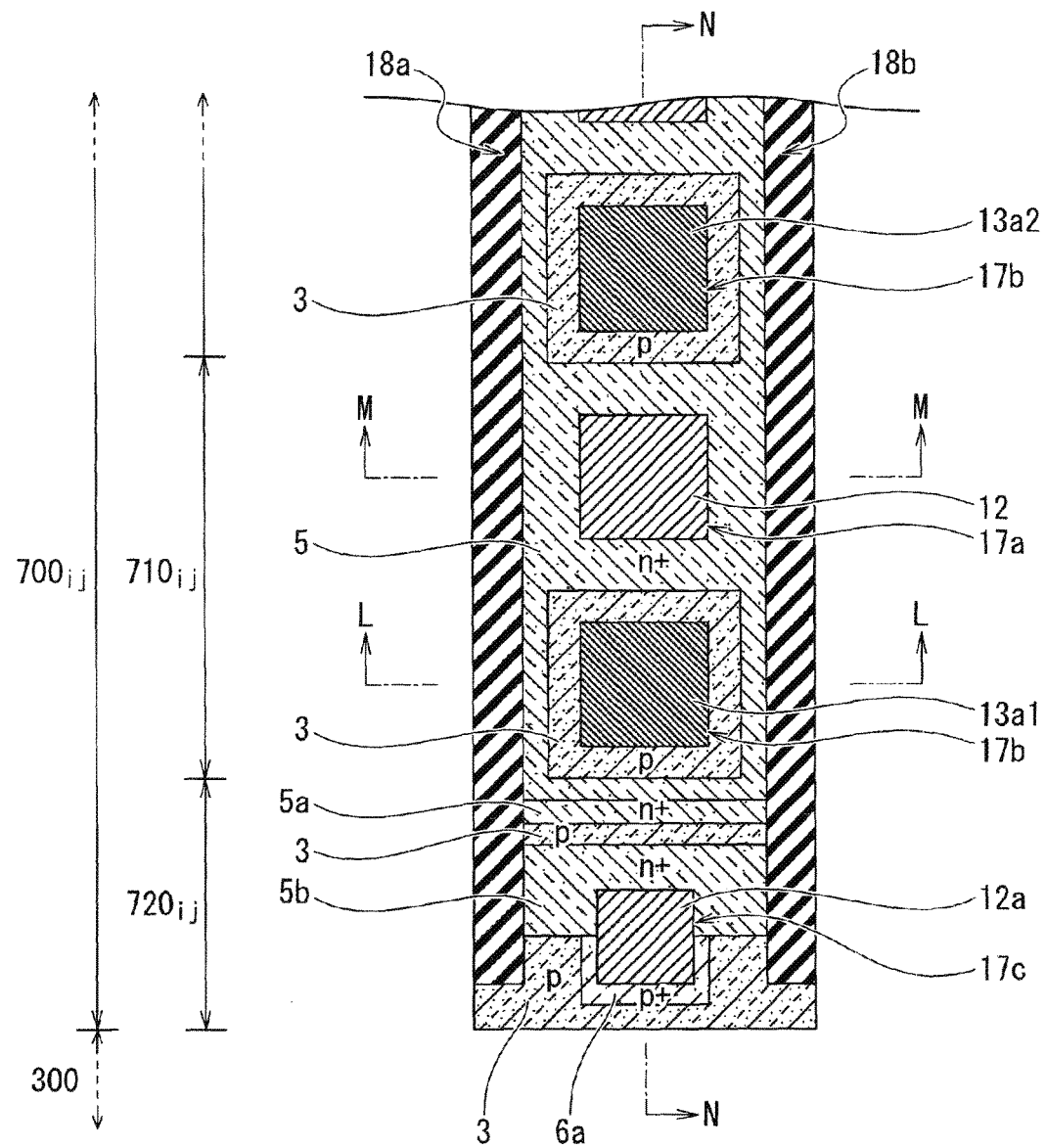
FIG. 28 schematically illustrates a configuration of a portion of the main components of a basic cell of a semiconductor device according to Embodiment 5 in a state in which layers above the upper surface of a channel region have been removed but potential barrier layers and ohmic contact layers have already been formed.

As illustrated in FIG. 28, the semiconductor device according to Embodiment 5 includes a basic cell $700_{ij}$ that includes one or more standard units $710_{ij}$ and one or more built-in transistors $720_{ij}$. The basic cells $700_{ij}$ of the semiconductor device according to Embodiment 5 include a high concentration n-type ($n^+$) first drain region 1 that is made primarily of SiC and is formed spanning across the respective standard units $710_{ij}$ and the respective built-in transistors $720_{ij}$.

Furthermore, the basic cell $700_{ij}$ of the semiconductor device according to Embodiment 5 includes an n-type drift layer 2 that is formed on the first drain region 1 and has a lower impurity concentration than the first drain region 1, as well as a high concentration p-type ($p^+$) base region 4 that is formed on the drift layer 2. The basic cell $700_{ij}$ of the semiconductor device according to Embodiment 5 also includes the p-type channel region 3, which is formed on a portion of the upper surface of the base region 4 and has a lower impurity concentration than the base region 4.

In addition, the basic cell $700_{ij}$ of the semiconductor device according to Embodiment 5 includes a high concentration n-type ($n^+$) first source region 5 formed in a portion of the upper surface of the channel region 3 of the standard unit $710_{ij}$ and running parallel to the lengthwise direction of the stripe shape of the basic cell $700_{ij}$. Furthermore, first potential barrier layers 13a1 and 13a2 are formed on the channel region 3 where exposed by openings in the first source region 5 in order to prevent the majority carriers from being injected into the channel region 3.

Moreover, a first ohmic contact layer 12 is formed on the first source region 5 between adjacent openings therein. In addition, a source electrode 9 is formed on an interlayer insulating film 11, the first ohmic contact layer 12, and the first potential barrier layers 13a1 and 13a2.

The basic cell $700_{ij}$ of the semiconductor device according to Embodiment 5 also includes a second drain region 5a of a first conductivity type that is formed in a portion of the upper surface of the channel region 3 in the built-in transistor $720_{ij}$ region and that is electrically connected to the first source region 5. The second drain region 5a is formed as an integrated part of the first source region 5.

Furthermore, the basic cell $700_{ij}$ of the semiconductor device according to Embodiment 5 also includes a high concentration n-type ($n^+$) second source region 5b that is formed in a portion of the upper surface of the channel region 3 in the built-in transistor $720_{ij}$ region and that is separated from the second drain region 5a. The rest of the components of the structure of the semiconductor device according to Embodiment 5 are the same as the corresponding layers, regions, and the like of the semiconductor devices according to Embodiments 1 to 4, and therefore a redundant description will be omitted here.

As illustrated in FIG. 28, the trenches 18a and 18b are formed at positions corresponding to the areas directly beneath the first gate electrodes 8 in the semiconductor device according to Embodiment 1. In other words, the trenches 18a and 18b are formed at positions corresponding to the exposed portions of the channel region 3 and the inverted regions 2a1 and 2a2 on the SiC surface of the semiconductor device illustrated in FIG. 3.

Figure 29:
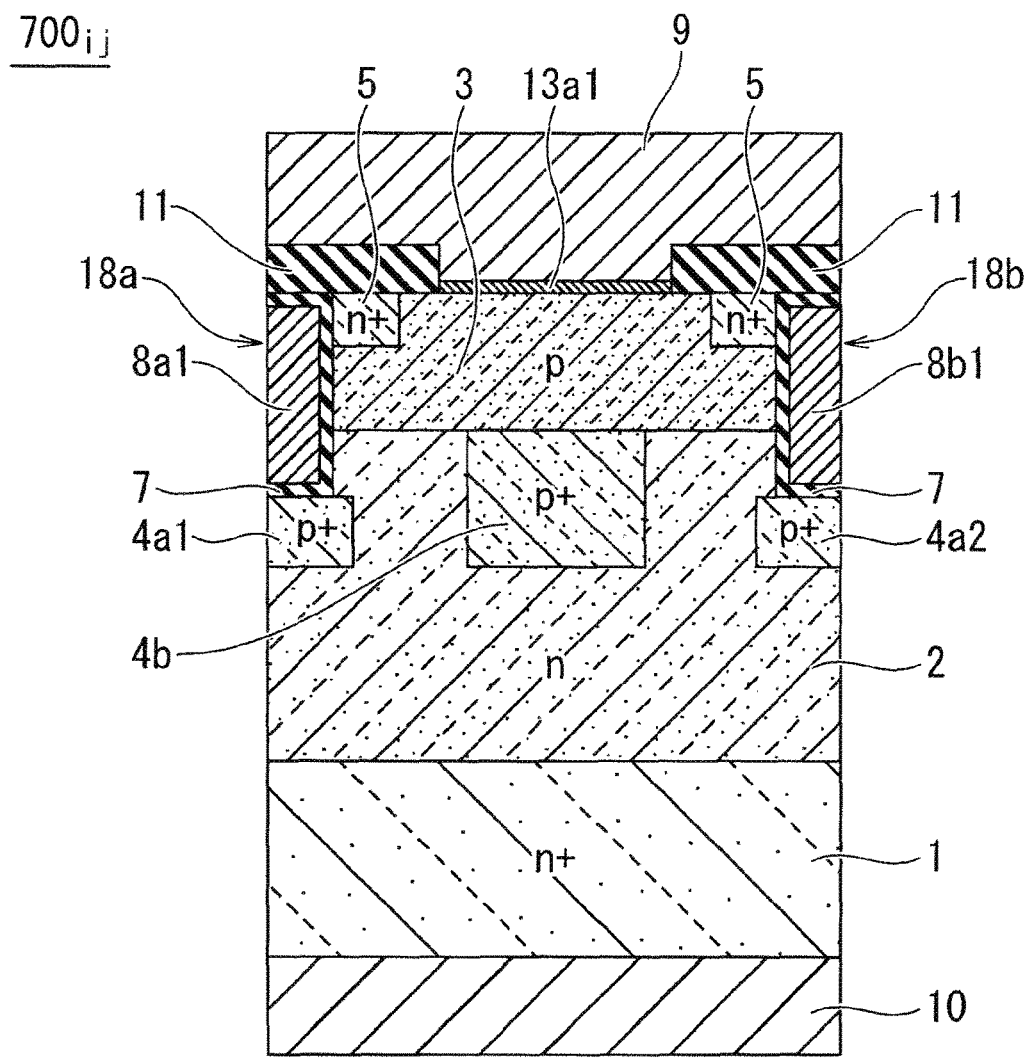
FIG. 29 is a cross-sectional view schematically illustrating a configuration of a portion of the main components of the basic cell of the semiconductor device according to Embodiment 5 as viewed along line L-L in FIG. 28.
Figure 30:
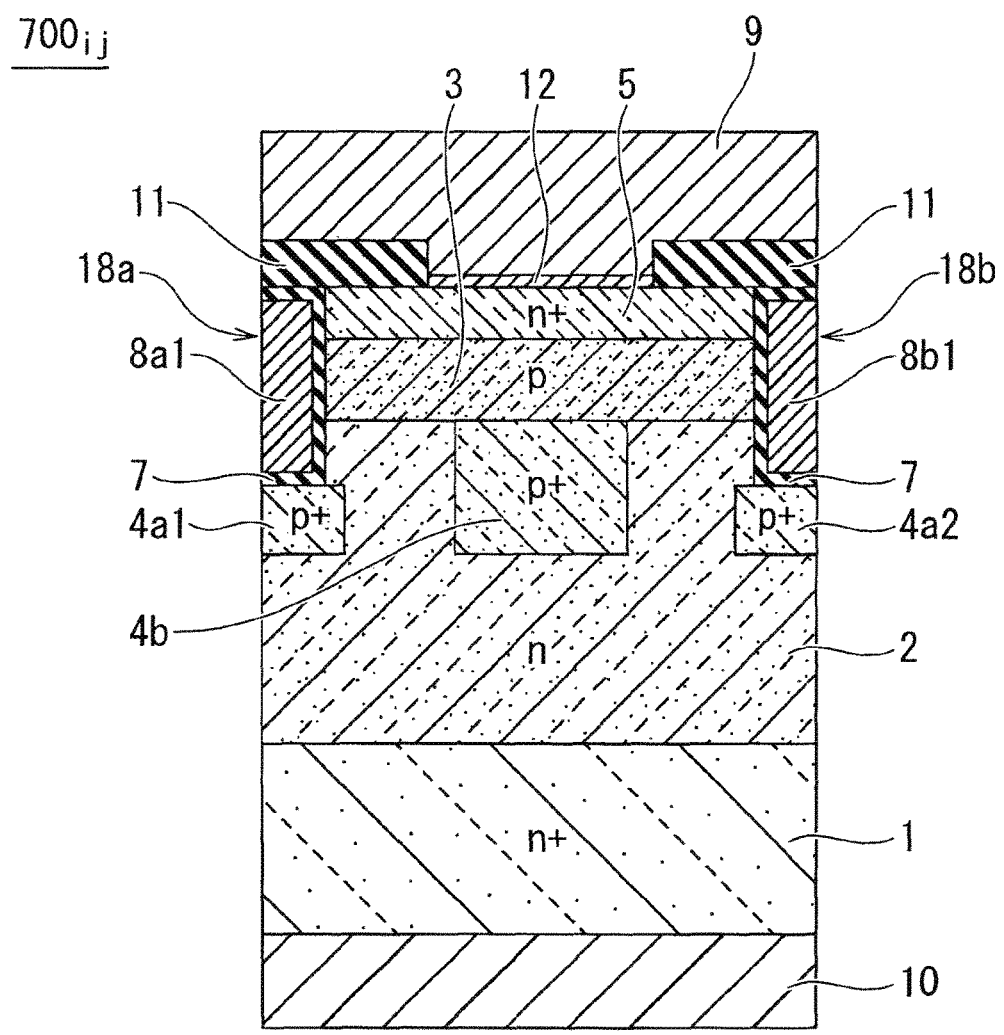
FIG. 30 is a cross-sectional view schematically illustrating a configuration of a portion of the main components of the basic cell of the semiconductor device according to Embodiment 5 as viewed along line M-M in FIG. 28.
Figure 31:
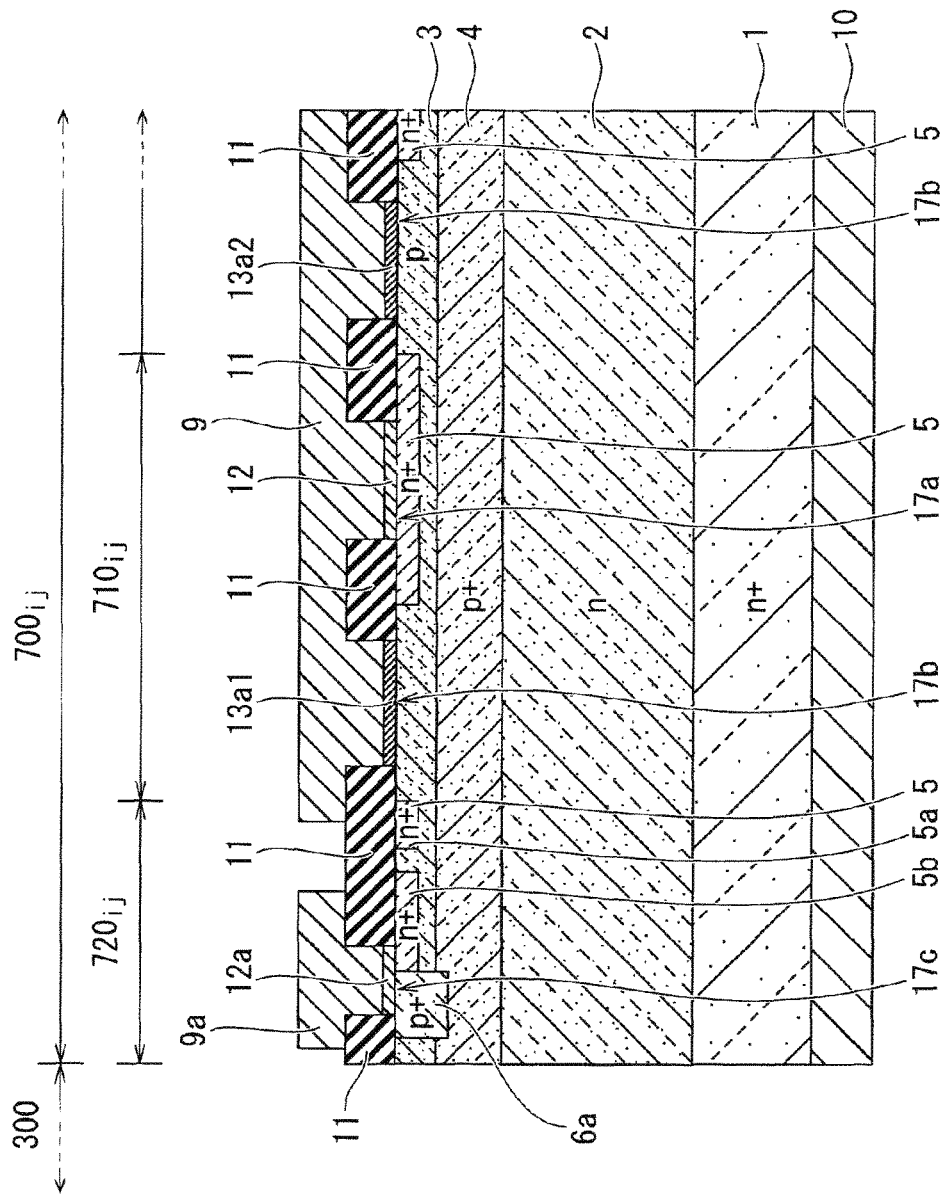
FIG. 31 is a cross-sectional view schematically illustrating a configuration of a portion of the main components of the basic cell of the semiconductor device according to Embodiment 5 as viewed along line N-N in FIG. 28.

As illustrated in FIG. 29, trench-type first gate electrodes 8a1 and 8b1 are respectively formed inside the trenches 18a and 18b with a first insulating film 7 interposed therebetween. Moreover, as illustrated in FIG. 30, the high concentration p-type ($p^+$) base region 4 is selectively formed in the upper portion of the drift layer 2 such that the upper surface of the base region 4 contacts the bottom surface of the channel region 3. The rest of the effects of the semiconductor device according to Embodiment 5 (that is, the effects other than those due to having a trench structure) are the same as the effects of the semiconductor device according to Embodiment 1.

Moreover, in the semiconductor device according to Embodiment 5, extending the first gate electrodes 8a1 and 8b1 of the standard unit $710_{ij}$ towards the built-in transistor $720_{ij}$ side makes it possible to use those extended portions as a second gate electrode in the built-in transistor $720_{ij}$. However, when using the gate electrodes of the standard unit $710_{ij}$ also as the gate electrode of the built-in transistor $720_{ij}$ in this way, the channel width of the built-in transistor $720_{ij}$ becomes equal to the depth of the second source region 5b and the second drain region 5a.

In other words, the channel width is less than in the planar structure illustrated in FIG. 3. Therefore, as an alternative, a planar-gate MOSFET structure may be formed just on the built-in transistor $720_{ij}$ side by forming a second insulating film 7a and a second gate electrode 8a of the type illustrated in FIG. 2 on the surface of the SiC body region.

<Embodiment 6>
(Structure of Semiconductor Device)

Figure 33:
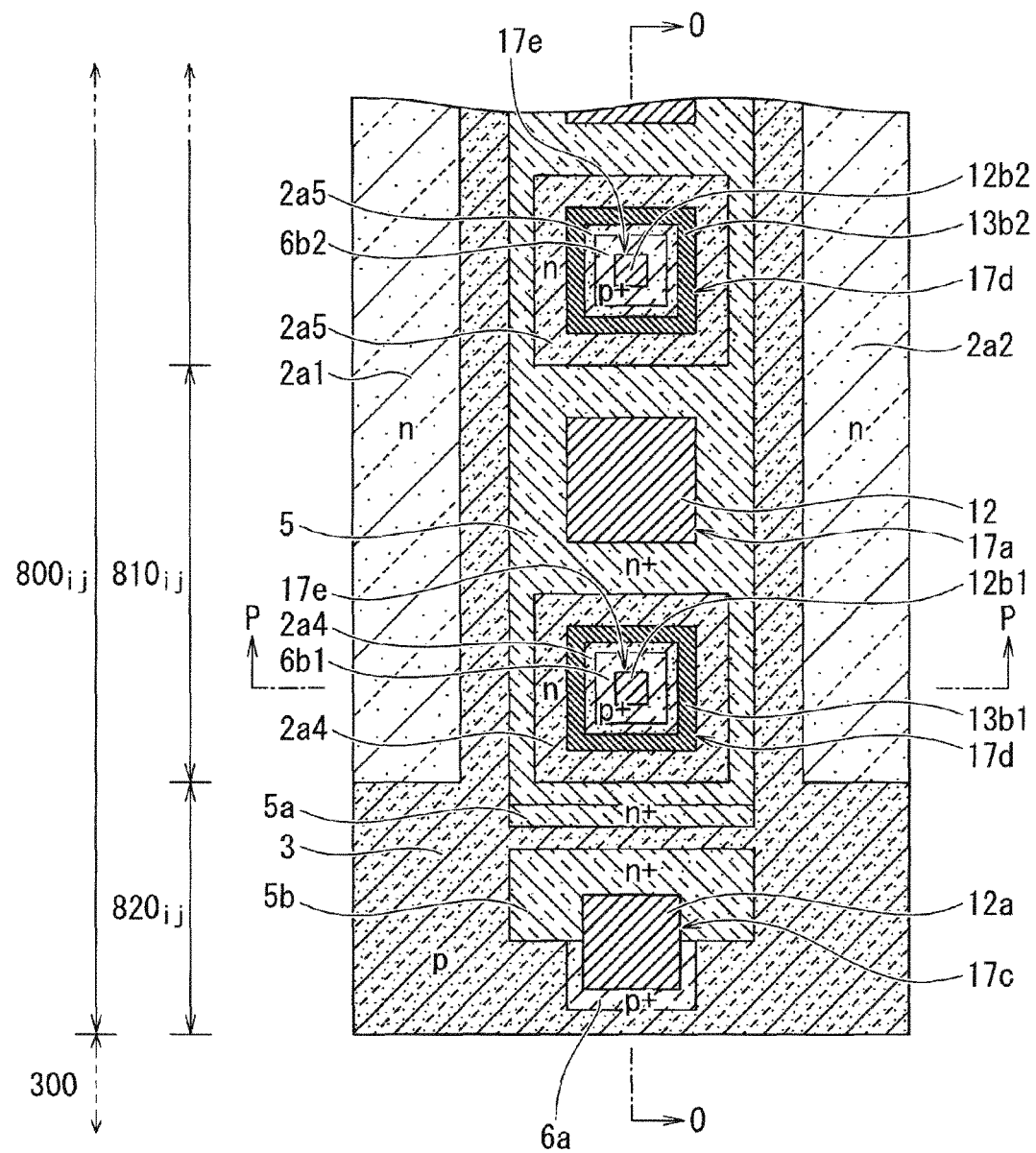
FIG. 33 schematically illustrates a configuration of a portion of the main components of the basic cell of the semiconductor device according to Embodiment 6 in a state in which layers above the upper surface of a channel region have been removed but potential barrier layers and ohmic contact layers have already been formed.

As illustrated in the plan view in FIG. 33, a semiconductor device according to Embodiment 6 is different than Embodiment 1 in that the structure inside openings in a first source region 5 is different. In FIG. 3, the channel region 3 is exposed inside of the openings in the first source region 5, while in FIG. 33 a channel region 3 is not exposed inside of the openings in the first source region 5.

Figure 32:
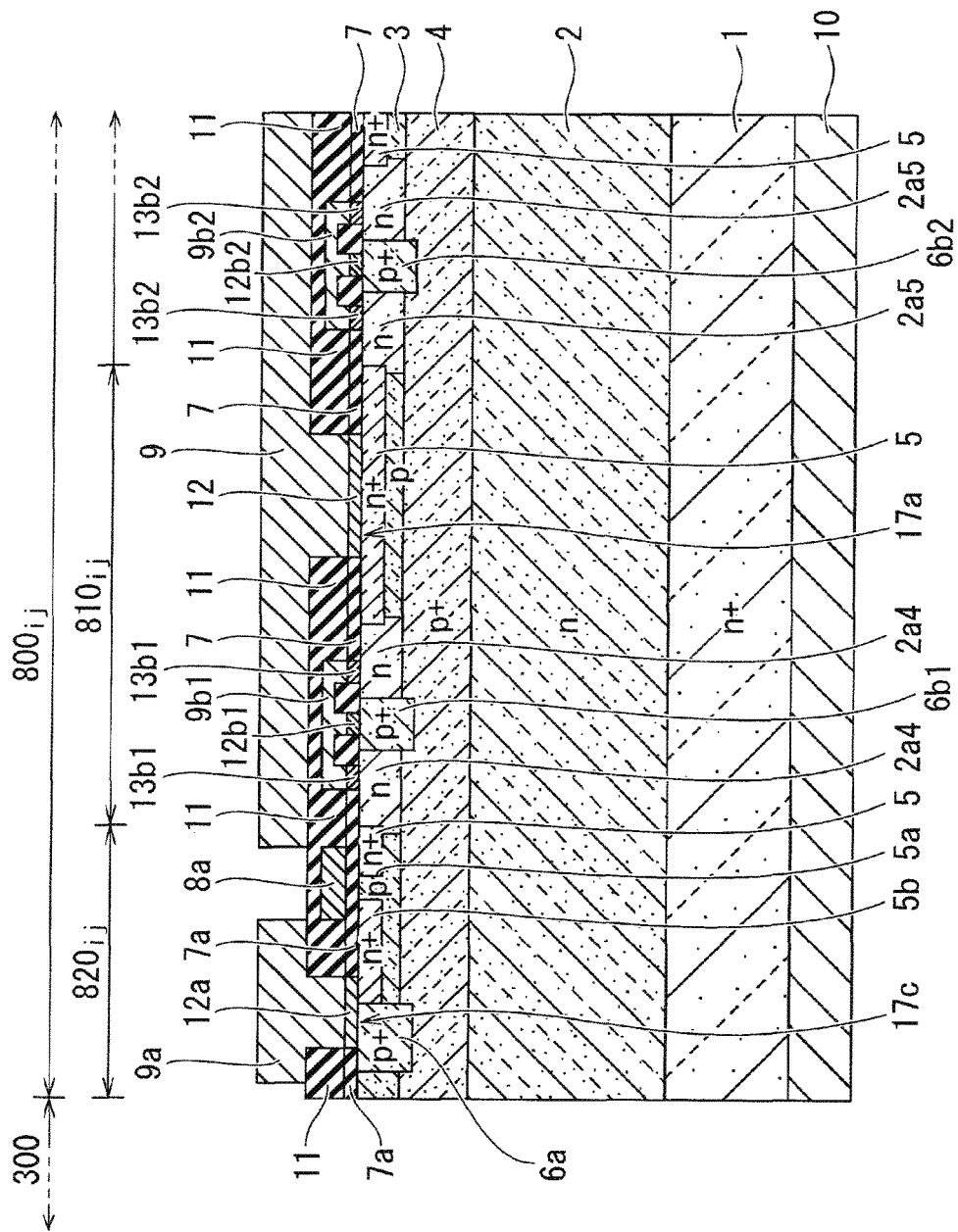
FIG. 32 is a cross-sectional view schematically illustrating a configuration of a portion of the main components of a basic cell of the semiconductor device according to Embodiment 6 as viewed along line O-O in FIG. 33.

Due to the differences in the planar structure illustrated in FIG. 33, the cross-sectional structure illustrated in FIG. 32 is also different than the structure inside of the openings in the first source region 5 as illustrated in FIG. 2. The semiconductor device includes an active portion in which a plurality of stripe-shaped basic cells $800_{ij}$ are arranged and an edge termination structure 300 formed around the periphery of the active portion.

As illustrated in FIG. 32, the basic cell $800_{ij}$ of the semiconductor device according to Embodiment 6 includes one or more standard units $810_{ij}$ and one or more built-in transistors $820_{ij}$. The standard unit $810_{ij}$ is a region through which a primary current flows, and the built-in transistor $820_{ij}$ is connected to the standard unit $810_{ij}$ in order to be able to form a short-circuit between an SiC body region (3, 4) and a source region of the standard unit $810_{ij}$.

The basic cells $800_{ij}$ of the semiconductor device according to Embodiment 6 include a high concentration n-type ($n^+$) first drain region 1 that is made primarily of SiC and is formed spanning across the respective standard units $810_{ij}$ and the respective built-in transistors $820_{ij}$. Furthermore, the basic cell $800_{ij}$ of the semiconductor device according to Embodiment 6 includes an n-type drift layer 2 that is formed on the first drain region 1 and has a lower impurity concentration than the first drain region 1, as well as a high concentration p-type ($p^+$) base region 4 that is formed on the drift layer 2.

The basic cell $800_{ij}$ of the semiconductor device according to Embodiment 6 also includes the p-type channel region 3, which is formed on a portion of the upper surface of the base region 4 and has a lower impurity concentration than the base region 4. In addition, the basic cell $800_{ij}$ of the semiconductor device according to Embodiment 6 includes a high concentration n-type (n⁺) first source region 5 formed in a portion of the upper surface of the channel region 3 of the standard unit 810$_{ij}$ and running parallel to the lengthwise direction of the stripe shape of the basic cell 800$_{ij}$.

Moreover, a first ohmic contact layer 12 is formed on the first source region 5 between the adjacent openings therein. In addition, a source electrode 9 is formed on an interlayer insulating film 11 and on the first ohmic contact layer 12. The basic cell 800$_{ij}$ of the semiconductor device according to Embodiment 6 also includes a second drain region 5a of a first conductivity type that is formed in a portion of the upper surface of the channel region 3 in the built-in transistor 820$_{ij}$ region and that is electrically connected to the first source region 5.

The second drain region 5a is formed as an integrated part of the first source region 5. Furthermore, the basic cell 800$_{ij}$ of the semiconductor device according to Embodiment 6 also includes a high concentration n-type (n⁺) second source region 5b that is formed in a portion of the upper surface of the channel region 3 in the built-in transistor 820$_{ij}$ region and that is separated from the second drain region 5a.

As illustrated in FIG. 32, the semiconductor device according to Embodiment 6 includes n-type inverted regions 2a4 and 2a5 that are formed in a region of the channel region 3 that is surrounded by the first source region 5. The semiconductor device according to Embodiment 6 also includes high concentration p-type (p⁺) base contact regions 6b1 and 6b2 that are formed in the inverted regions 2a4 and 2a5.

The semiconductor device according to Embodiment 6 also includes second potential barrier layers 13b1 and 13b2 that contact the inverted regions 2a4 and 2a5 as well as third ohmic contact layers 12b1 and 12b2 that contact the base contact regions 6b1 and 6b2. Second floating electrodes 9b1 and 9b2 are respectively connected to the second potential barrier layers 13b1 and 13b2 and to the third ohmic contact layers 12b1 and 12b2 in the regions surrounded by the first source region. The third ohmic contact layers 12b1 and 12b2 correspond to "second ohmic contact layers" in the present invention.

Figure 34:
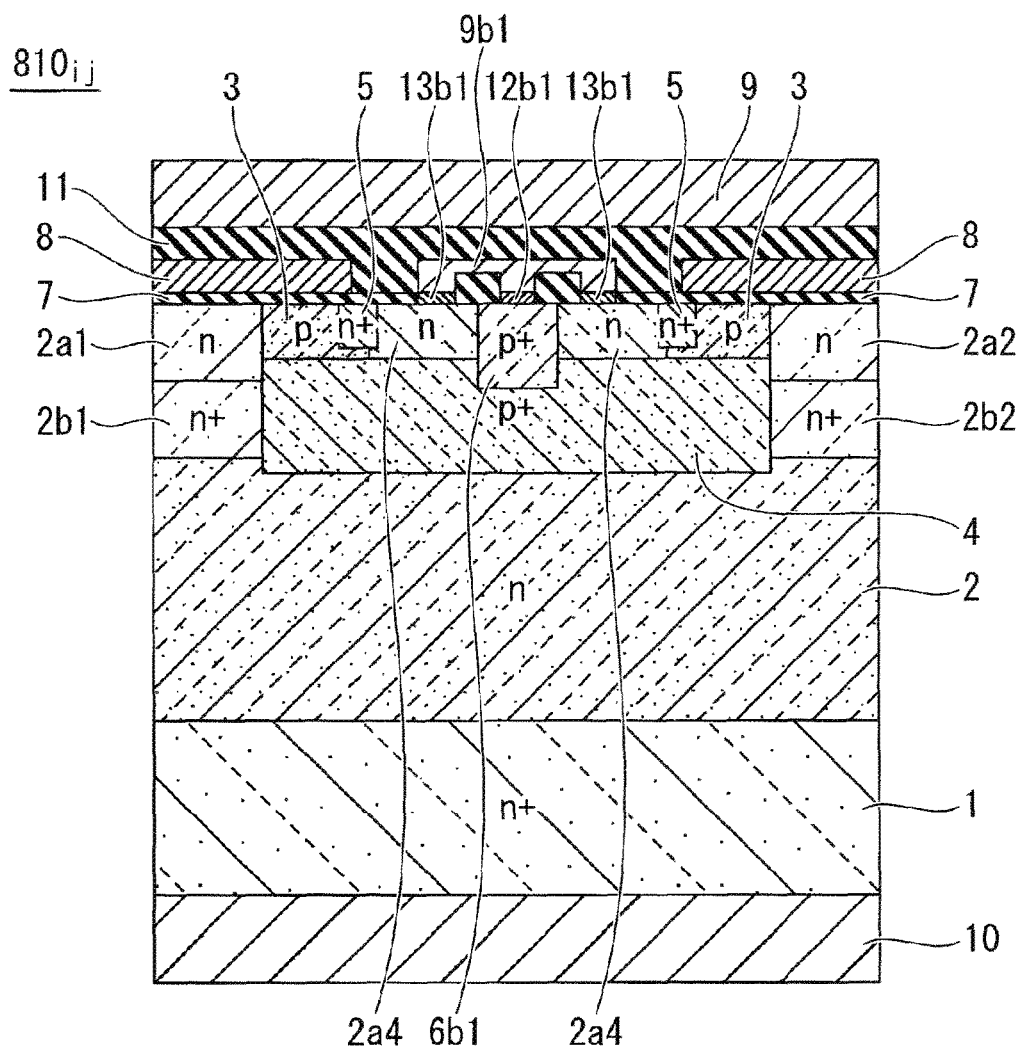
FIG. 34 is a cross-sectional view schematically illustrating a configuration of a portion of the main components of the basic cell of the semiconductor device according to Embodiment 6 as viewed along line P-P in FIG. 33.

As illustrated in FIG. 33, the inverted regions 2a4 and 2a5 have a frame shape when viewed in a plan view and are formed contacting at least a portion of the first source region 5. As illustrated in FIG. 34, and similar to a base contact region 6a of the built-in transistor 820$_{ij}$, the base contact regions 6b1 and 6b2 have a depth that reaches the upper portion of the base region 4. Moreover, the cross-sectional structure of the basic cell 800$_{ij}$ of the semiconductor device according to Embodiment 6 at the position of a source contact area 17a (that is, the structure as taken along a line corresponding to line C-C in FIG. 3) is the same as the cross-sectional structure of the basic cell 100$_{ij}$ of the semiconductor device according to Embodiment 1 as illustrated in FIG. 5.

The second potential barrier layers 13b1 and 13b2 are formed on a portion of the surfaces of the inverted regions 2a4 and 2a5 and in Schottky region contact areas 17d that are formed in openings in the interlayer insulating film 11. As illustrated in FIG. 33, the second potential barrier layers 13b1 and 13b2 of the semiconductor device according to Embodiment 6 have a frame shape when viewed in a plan view. The second potential barrier layers 13b1 and 13b2 are made of a Schottky metal and form Schottky junctions with the inverted regions 2a4 and 2a5.

The third ohmic contact layers 12b1 and 12b2 are formed on a portion of the surfaces of the base contact regions 6b1 and 6b2 and in contact region contact areas 17e that are formed in openings in the interlayer insulating film 11. As illustrated in FIG. 33, the third ohmic contact layers 12b1 and 12b2 are rectangular when viewed in a plan view. The third ohmic contact layers 12b1 and 12b2 are silicide layers. The second floating electrodes 9b1 and 9b2 are formed inside of the interlayer insulating film 11 on the second potential barrier layers 13b1 and 13b2 and the third ohmic contact layers 12b1 and 12b2 and are thus insulated from the source electrode 9.

The second floating electrodes 9b1 and 9b2 are respectively connected to the inverted regions 2a4 and 2a5 via the second potential barrier layers 13b1 and 13b2 and are also respectively connected to the base contact regions 6b1 and 6b2 via the third ohmic contact layers 12b1 and 12b2. As illustrated in FIG. 34, the inverted regions 2a4 and 2a5 may be formed at the same time that inverted regions 2a1 and 2a2 are formed beneath the first gate electrodes 8. Alternatively, in order to reduce the on-resistance of the Schottky diodes formed by the second potential barrier layers 13b1 and 13b2 and the inverted regions 2a4 and 2a5, the inverted regions 2a4 and 2a5 may be formed in a separate ion implantation process and using a higher impurity concentration.

As illustrated in FIG. 33, in the basic cells 800$_{ij}$ of the semiconductor device according to Embodiment 6, the standard units 810$_{ij}$ are arranged in a repeating manner such that the Schottky region contact areas 17d and the contact region contact areas 17e are formed alternately in a direction going from the end on the built-in transistor 820ij side towards the center of the device.

Figure 35:
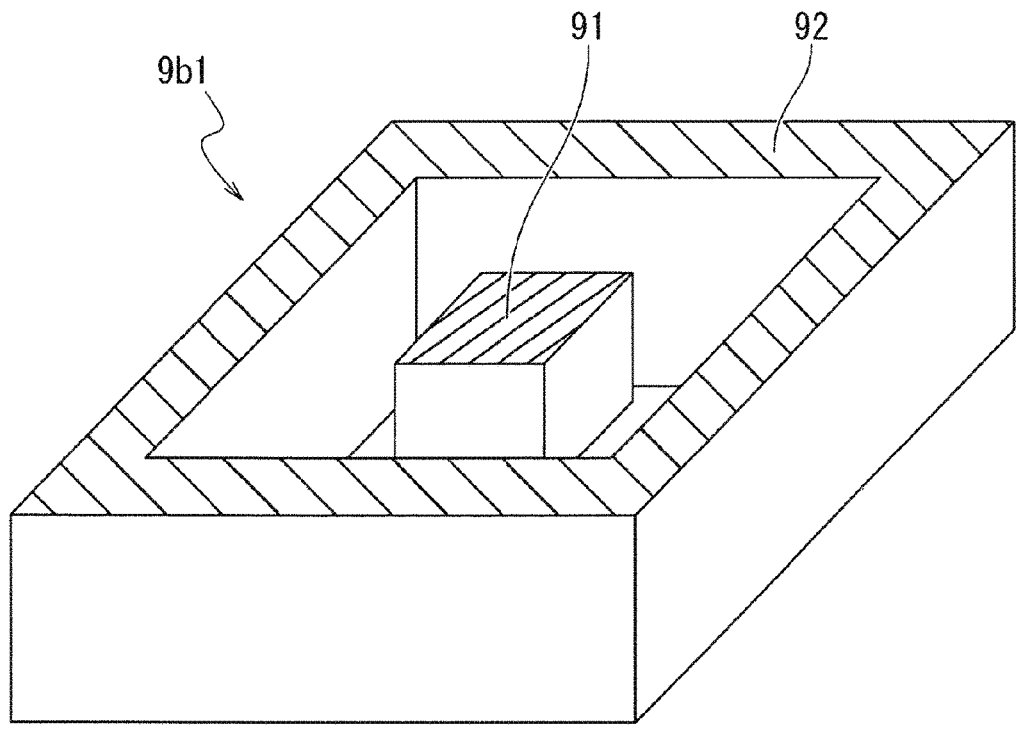
FIG. 35 is a bird's eye view (a perspective view) schematically illustrating a configuration of a second floating electrode used in the basic cell of the semiconductor device according to Embodiment 6.

As illustrated by the second floating electrode 9b1 in FIG. 35 (which has been vertically inverted relative to the state illustrated in FIG. 32), the second floating electrodes 9b1 and 9b2 have a plate shape that is rectangular when viewed in a plan view and includes a recess surrounded by sidewalls that are extruded up from the four sides of the rectangle. A protrusion is formed in the center of the recess and separated from the peripheral sidewalls. The protrusion has a rectangular shape when viewed in a plan view, and a surface 91 of the protrusion (the hatched upper surface in FIG. 35) contacts the third ohmic contact layer 12b1.

Meanwhile, the peripheral sidewalls have a frame shape when viewed in a plan view, and a surface 92 of the sidewalls (the hatched upper surface in FIG. 35) contacts the second potential barrier layer 13b1. The rest of the components of the structure of the semiconductor device according to Embodiment 6 are the same as the corresponding layers, regions, and the like of the semiconductor devices according to Embodiments 1 to 5, and therefore a redundant description will be omitted here.

(Operation of Semiconductor Device)

To switch device to the ON state (that is, to make the electric potential of a drain electrode 10 higher than the electric potential of the source electrode 9), a voltage of greater than or equal to the gate threshold voltage Vth is applied to the first gate electrodes 8, thereby causing an inversion layer to be formed in the surface of the channel region 3 that is directly beneath the first gate electrodes 8. Current then flows through a path that includes the drain electrode 10, the drain region 1, the drift layer 2, a JFET region 2b1 illustrated on the left side in FIG. 34, the inverted region 2a1, the inversion layer in the surface of the channel region 3, the first source region 5, the first ohmic contact layer 12, and the source electrode 9.

Current also flows through a path that includes the drain electrode 10, the drain region 1, the drift layer 2, a JFET region 2b2 illustrated on the right side in FIG. 34, the inverted region 2a2, the inversion layer in the surface of the channel region 3, the first source region 5, the first ohmic contact layer 12, and the source electrode 9.

At this time, the voltage greater than or equal to the gate threshold voltage Vth is also applied to the second gate electrode 8a of the built-in transistor $820_{ij}$. The base region 4 and the channel region 3 are connected to the source electrode 9 via the base contact region 6a of the built-in transistor $820_{ij}$, the second source region 5b, the inversion layer in the surface of the channel region 3 directly beneath the second gate electrode 8a, the second drain region 5a, and the first source region 5. Therefore, the channel region 3 (that is, the back gate of the standard unit $810_{ij}$) takes substantially the same electric potential as the source electrode 9, and the device functions the same as a normal vertical MOSFET.

Meanwhile, when the first gate electrodes 8 are set to an electric potential less than the gate threshold voltage Vth in order to switch the device OFF, the inversion layer in the surface of the channel region 3 disappears, and current stops flowing through the standard unit $810_{ij}$. Here, the electric potential of the drain electrode is increased by the supply voltage, and the p-n junctions between the n-type regions such as the inverted regions 2a1 and 2a2 and the JFET regions 2b1 and 2b2 and the p-type regions such as the base region 4 and the channel region 3 become reverse-biased, thereby resulting in the formation of depletion layers and maintaining the breakdown voltage.

In order for the depletion layers to be formed, current must flow from the base region 4 and the channel region 3 to the source electrode 9 side. Here, in the Schottky region contact area 17d, the Schottky diodes formed by the second potential barrier layers 13b1 and 13b2 (which are made of a Schottky metal) and the inverted regions 2a4 and 2a5 become biased in the forward direction. As a result, in the Schottky region contact area 17d, current flows from the base region 4 and the channel region 3 through a path that includes the base contact regions 6b1 and 6b2, the third ohmic contact layers 12b1 and 12b2, the second floating electrodes 9b1 and 9b2, the second potential barrier layers 13b1 and 13b2, the inverted regions 2a4 and 2a5, and the first source region 5.

Furthermore, in the source contact area 17a, the current that has flowed to the first source region 5 then continues to flow from the first source region 5 through a path that includes the first ohmic contact layer 12 and the source electrode 9. A current that flows through this same path also flows when holes are generated in the drift layer 2 due to avalanche breakdown when the device is isolated using an inductance load or the like, thereby making it possible to prevent occurrence of the parasitic bipolar transistor effect.

As the device is repeatedly switched ON and OFF as described above, the base region 4 and the channel region 3 become negatively biased relative to the source electrode 9 due to the charge pumping effect. However, because the Schottky diodes formed by the second potential barrier layers 13b1 and 13b2 and the inverted regions 2a4 and 2a5 become reverse-biased, holes cannot be supplied to the base region 4 and the channel region 3 through the Schottky junctions. Therefore, the base region 4 and the channel region 3 remain negatively biased.

However, even when the base region 4 and the channel region 3 are negatively biased while the device is in the OFF state, the built-in transistor $820_{ij}$ will still be switched ON when the device is switched ON. Therefore, holes are supplied to the base region 4 and the channel region 3 through the built-in transistor $820_{ij}$ as well, thereby making it possible to give the base region 4 and the channel region 3 substantially the same electric potential as the source electrode 9. This prevents an increase in the on-resistance due to an increase in the gate threshold voltage Vth or an increase in the JFET effect.

Moreover, even when the base region 4 and the channel region 3 become negatively biased in the OFF state, the gate threshold voltage Vth increases, which has advantages such as reducing channel leaks, promoting pinch-off of the JFET regions 2b1 and 2b2 due to the JFET effect, and improving the breakdown voltage, all without causing any associated disadvantages.

Next, the operation of the bridge circuit illustrated in FIG. 8 while the current $I_b$ is flowing will be described for a case in which the semiconductor device according to Embodiment 6 is applied to the MOSFETs 20a to 20d. When the current $I_b$ is flowing, the electric potential of the drain electrode 10 is more negative than the electric potential of the source electrode 9.

Here, recall that when using Comparison Example 1 as illustrated in FIG. 7, when the on-voltage of the diode 21c (a Schottky diode) that is connected in parallel to the MOSFET 20c exceeds the built-in voltage of the body diode of the MOSFET 20c, holes from the base region 4 and the channel region 3 are injected into the drift layer 2 and cause deterioration due to growth of stacking faults.

However, when using the semiconductor device according to Embodiment 6, the Schottky diodes formed by the second potential barrier layers 13b1 and 13b2 and the inverted regions 2a4 and 2a5 become reverse-biased, and therefore holes are not supplied from the source electrode 9 to the base region 4 and the channel region 3. Therefore, even during periods of dead time in which the MOSFET 20a and the MOSFET 20c are both OFF, deterioration does not occur due to hole injection. However, the inductance of the load inductor 24 creates a large voltage while current is not flowing, and therefore the diode 21c (a Schottky diode) remains necessary even if this diode only has a small area.

Furthermore, when the MOSFET 20c is switched ON after the dead time, the built-in transistor $820_{ij}$ is switched ON at the same time, thereby making it possible to supply holes to the base region 4 and the channel region 3 via the built-in transistor $820_{ij}$. However, because the MOSFET 20c is in the ON state, the channel of the MOSFET 20c short-circuits the body diode of the MOSFET 20c, and therefore current does not flow through the body diode.

An equivalent circuit diagram for the semiconductor device according to Embodiment 6 can be represented using the same equivalent circuit diagram illustrated in FIG. 6 for the semiconductor device according to Embodiment 1. In FIG. 6, the parasitic body diode 121 corresponds to a parasitic body diode in the built-in transistor $820_{ij}$ of the semiconductor device according to Embodiment 6.

The p-type Schottky diode 130 in FIG. 6 corresponds to the Schottky diodes formed by the second potential barrier layers 13b1 and 13b2 and the inverted regions 2a4 and 2a5 in the semiconductor device according to Embodiment 6. The parasitic junction capacitor 140 in FIG. 6 corresponds to parasitic junction capacitance that includes the junction capacitance of the built-in transistor $820_{ij}$ and the Schottky diodes in the semiconductor device according to Embodiment 6.

The semiconductor device according to Embodiment 6 includes the built-in transistor $820_{ij}$, similar to the semiconductor device according to Embodiment 1. This makes it possible to prevent increases in the gate threshold voltage Vth or the JFET effect resulting from the charge pumping effect that occurs due to the trapping levels at the gate oxide film and channel region interfaces, thereby making it possible to prevent increases in the on-voltage.

Moreover, in the semiconductor device according to Embodiment 6, a plurality of n-type Schottky diodes are connected in series in order to achieve satisfactory Schottky properties between the p-type body region (3, 4) and the source electrode 9. Therefore, even when relatively small-area diodes with a high forward voltage are connected in parallel to the semiconductor device, holes are not continuously injected into the body region, and a current does not flow through the body diode of the semiconductor device. This prevents growth of stacking faults due to recombination, thereby making it possible to effectively solve the problem of deterioration in on-resistance. The rest of the effects of the semiconductor device according to Embodiment 6 are the same as in the semiconductor device according to Embodiment 1.

<Embodiment 7>

(Structure of Semiconductor Device)

A semiconductor device according to Embodiment 7 is different than Embodiment 6 in that this semiconductor device has the same structure as in Embodiment 4, in which n-type Schottky cells . . . , $600_{1j-1}$, $600_{1j}$, $600_{1j+1}$, . . . and . . . , $600_{2j-1}$, $600_{2j}$, $600_{2j+1}$, . . . are formed in the active portion and connected in parallel to the semiconductor device.

In other words, in the semiconductor device according to Embodiment 7, these n-type Schottky cells $600_{ij}$ are embedded in the active portion and interspersed among the basic cells $800_{ij}$ described in Embodiment 6. Therefore, a plan view of the semiconductor device according to Embodiment 7 can be the same as the plan view of the semiconductor device illustrated in FIG. 24 except in that the basic cells $100_{ij}$ are replaced by the basic cells $800_{ij}$. Similarly, the upper surfaces of the n-type Schottky cells $600_{ij}$ of the semiconductor device according to Embodiment 7 can be illustrated the same as in the n-type Schottky cell $600_{ij}$ as illustrated in FIG. 25.

Similar to the semiconductor device according to Embodiment 6 as illustrated in FIG. 33, the semiconductor device according to Embodiment 7 includes the basic cell $800_{ij}$ that includes one or more standard units $810_{ij}$ and one or more built-in transistors $820_{ij}$. The standard unit $810_{ij}$ is a region through which a primary current flows, and the built-in transistor $820_{ij}$ is connected to the standard unit $810_{ij}$ in order to be able to form a short-circuit between an SiC body region (3, 4) and a source region of the standard unit $810_{ij}$.

The basic cells $800_{ij}$ of the semiconductor device according to Embodiment 7 include a high concentration n-type (n$^+$) first drain region 1 that is made primarily of SiC and is formed spanning across the respective standard units $810_{ij}$ and the respective built-in transistors $820_{ij}$. Furthermore, the basic cell $800_{ij}$ of the semiconductor device according to Embodiment 7 includes an n-type drift layer 2 that is formed on the first drain region 1 and has a lower impurity concentration than the first drain region 1, as well as a high concentration p-type (p$^+$) base region 4 that is formed on the drift layer 2.

The basic cell $800_{ij}$ of the semiconductor device according to Embodiment 7 also includes a p-type channel region 3 that is formed on a portion of the upper surface of the base region 4 and has a lower impurity concentration than the base region 4. In addition, the basic cell $800_{ij}$ of the semiconductor device according to Embodiment 7 includes a high concentration n-type (n$^+$) first source region 5 formed in a portion of the upper surface of the channel region 3 of the standard unit $810_{ij}$ and running parallel to the lengthwise direction of the stripe shape of the basic cell $800_{ij}$.

Moreover, a first ohmic contact layer 12 is formed on the first source region 5 between adjacent openings therein. In addition, a source electrode 9 is formed on an interlayer insulating film 11 and on the first ohmic contact layer 12. The basic cell $800_{ij}$ of the semiconductor device according to Embodiment 7 also includes a second drain region 5a of a first conductivity type that is formed in a portion of the upper surface of the channel region 3 in the built-in transistor $820_{ij}$ region and that is electrically connected to the first source region 5.

The second drain region 5a is formed as an integrated part of the first source region 5. Furthermore, the basic cell $800_{ij}$ of the semiconductor device according to Embodiment 7 also includes a high concentration n-type (n$^+$) second source region 5b that is formed in a portion of the upper surface of the channel region 3 in the built-in transistor $820_{ij}$ region and that is separated from the second drain region 5a.

The semiconductor device according to Embodiment 7 also includes n-type inverted regions 2a4 and 2a5 that are formed in a region of the channel region 3 that is surrounded by the first source region 5. The semiconductor device according to Embodiment 7 also includes high concentration p-type (p$^+$) base contact regions 6b1 and 6b2 that are formed in the inverted regions 2a4 and 2a5.

Moreover, the semiconductor device according to Embodiment 7 includes second potential barrier layers 13b1 and 13b2 that contact the inverted regions 2a4 and 2a5 as well as third ohmic contact layers 12b1 and 12b2 that contact the base contact regions 6b1 and 6b2. Second floating electrodes 9b1 and 9b2 are respectively connected to the second potential barrier layers 13b1 and 13b2 and to the third ohmic contact layers 12b1 and 12b2 in the regions surrounded by the first source region. The rest of the components of the structure of the semiconductor device according to Embodiment 7 are the same as the corresponding layers, regions, and the like of the semiconductor devices according to Embodiments 1 to 6, and therefore a redundant description will be omitted here.

Figure 36:
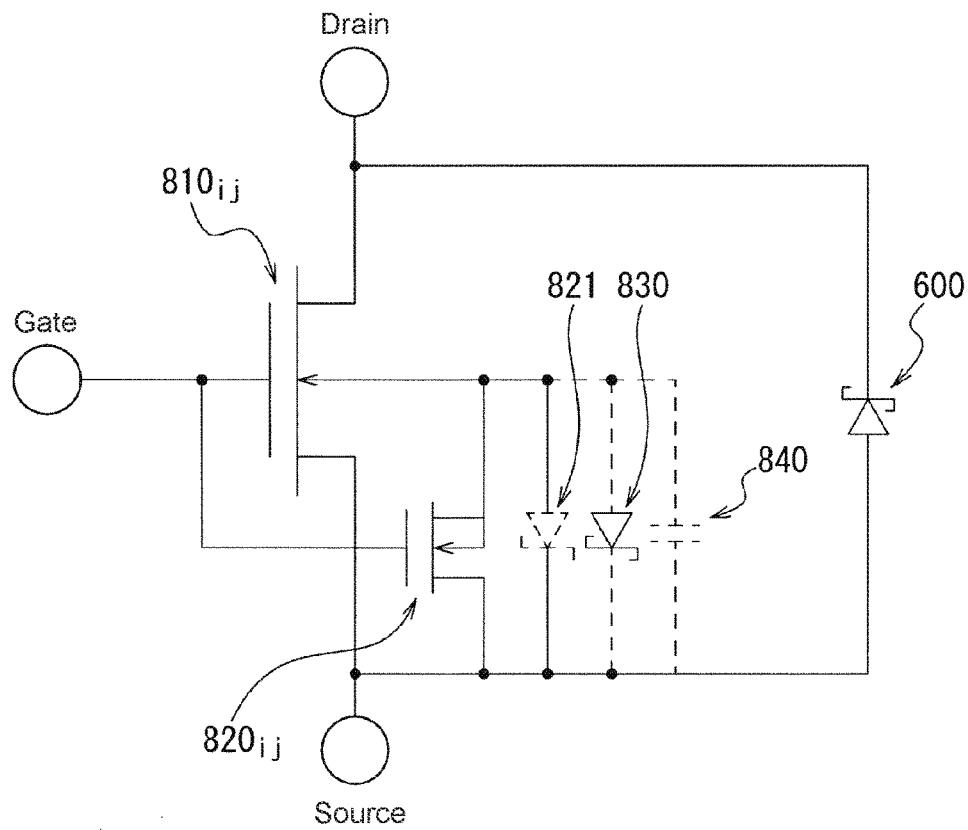
FIG. 36 is an equivalent circuit diagram of a semiconductor device according to Embodiment 7.

FIG. 36 is an equivalent circuit diagram of the semiconductor device according to Embodiment 7 and includes a MOSFET that represents the standard unit $810_{ij}$ and a MOSFET that represents the built-in transistor $820_{ij}$ that is connected between the channel region 3 and the source electrode 9 (that is, to the back gate of the former MOSFET).

Moreover, a parasitic body diode 821 of the built-in transistor $820_{ij}$ and a p-type Schottky diode 830 formed between the channel region 3 and the second potential barrier layers 13b1 and 13b2 are represented as being connected in parallel to the built-in transistor $820_{ij}$. Similarly, a parasitic junction capacitor 840 that represents the sum of the junction capacitance of the built-in transistor $820_{ij}$, the p-type Schottky diode 830, and the like is also represented as being connected in parallel to the built-in transistor $820_{ij}$. Furthermore, a Schottky diode formed by the n-type Schottky cells $600_{ij}$ is connected in parallel between the source and the drain.

Similar to the semiconductor device according to Embodiment 4, the semiconductor device according to Embodiment 7 makes it possible to form Schottky barrier diodes on the same chip without increasing the number of manufacturing steps, thereby removing the need for die bonding components or wire bonding processes for connecting external Schottky diodes. The rest of the effects of the semiconductor device according to Embodiment 7 (that is, the effects other than those due to the inclusion of the n-type Schottky cells $600_{ij}$) are the same as the effects of the semiconductor device according to Embodiment 6.

<Embodiment 8>

(Structure of Semiconductor Device)

Figure 37:
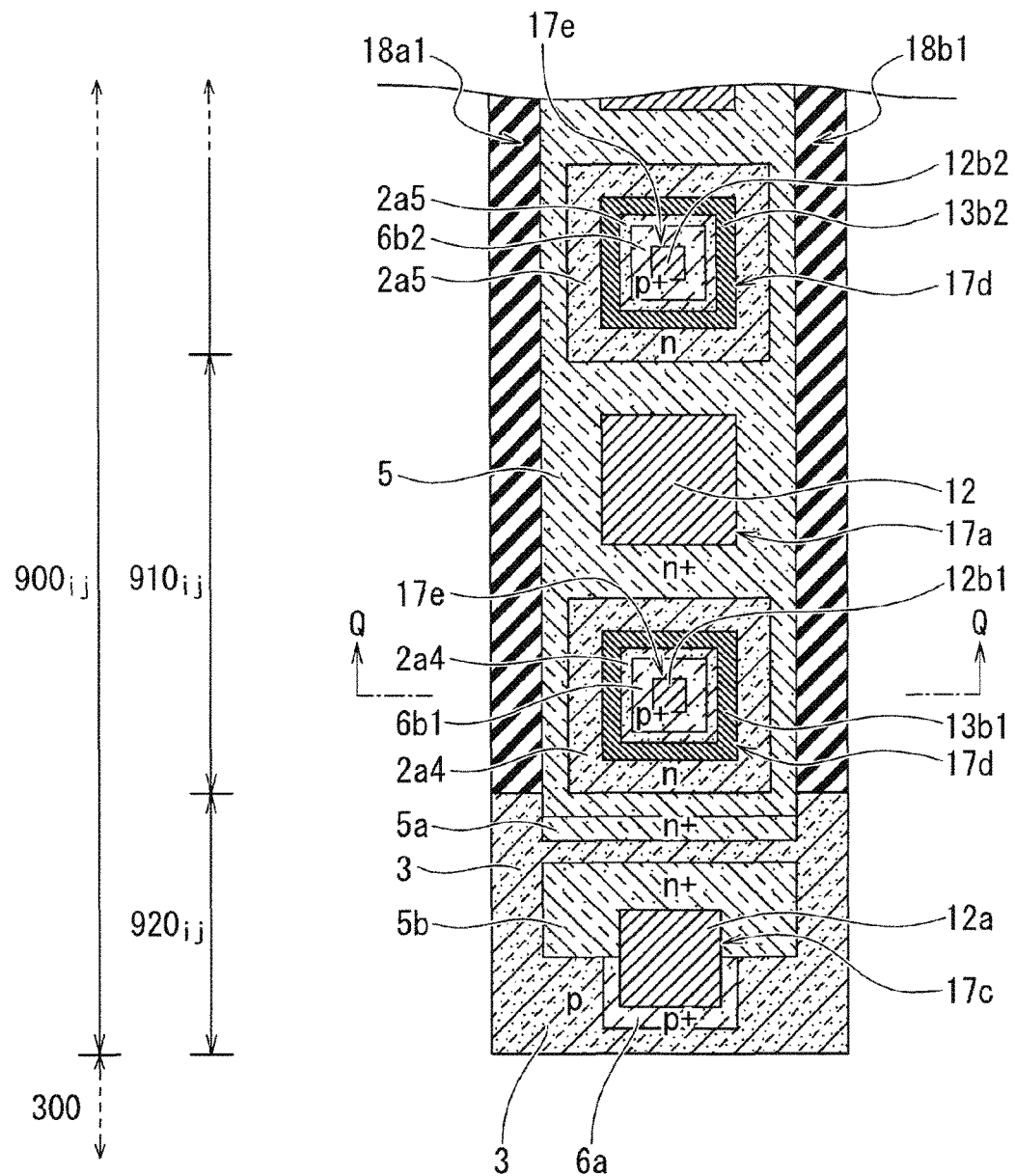
FIG. 37 schematically illustrates a configuration of a portion of the main components of a basic cell of a semiconductor device according to Embodiment 8 in a state in which layers above the upper surface of a channel region have been removed but potential barrier layers and ohmic contact layers have already been formed.

A semiconductor device according to Embodiment 8 is different from Embodiment 6 in that as illustrated in FIG. 37, this semiconductor device has a trench-gate structure in which trenches 18a1 and 18b1 are formed in inverted regions 2a1 and 2a2 and in portions of a channel region 3 that contacts the inverted regions 2a1 and 2a2.

Similar to the semiconductor device according to Embodiment 6 as illustrated in FIG. 33, the semiconductor device according to Embodiment 8 includes a basic cell $900_{ij}$ that includes one or more standard units $910_{ij}$ and one or more built-in transistors $920_{ij}$. The standard unit $910_{ij}$ is a region through which a primary current flows, and the built-in transistor $920_{ij}$ is connected to the standard unit $910_{ij}$ in order to be able to form a short-circuit between an SiC body region (3, 4) and a source region of the standard unit $910_{ij}$.

The basic cell $900_{ij}$ of the semiconductor device according to Embodiment 8 includes a high concentration n-type ($n^+$) first drain region 1 that is made primarily of SiC and is formed spanning across the standard unit $910_{ij}$ and the built-in transistor $820_{ij}$. Furthermore, the basic cell $900_{ij}$ of the semiconductor device according to Embodiment 8 includes an n-type drift layer 2 that is formed on the first drain region 1 and has a lower impurity concentration than the first drain region 1, as well as a high concentration p-type ($p^+$) base region 4 that is formed on the drift layer 2.

The basic cell $900_{ij}$ of the semiconductor device according to Embodiment 8 also includes a p-type channel region 3 that is formed on a portion of the upper surface of the base region 4 and has a lower impurity concentration than the base region 4. In addition, the basic cell $900_{ij}$ of the semiconductor device according to Embodiment 8 includes a high concentration n-type ($n^+$) first source region 5 formed in a portion of the upper surface of the channel region 3 of the standard unit $910_{ij}$ and running parallel to the lengthwise direction of the stripe shape of the basic cell $900_{ij}$.

Moreover, a first ohmic contact layer 12 is formed on the first source region 5 between adjacent openings therein. In addition, a source electrode 9 is formed on an interlayer insulating film 11 and on the first ohmic contact layer 12. The basic cell $900_{ij}$ of the semiconductor device according to Embodiment 8 also includes a second drain region 5a of a first conductivity type that is formed in a portion of the upper surface of the channel region 3 in the built-in transistor $920_{ij}$ region and that is electrically connected to the first source region 5.

The second drain region 5a is formed as an integrated part of the first source region 5. Furthermore, the basic cell $900_{ij}$ of the semiconductor device according to Embodiment 8 also includes a high concentration n-type ($n^+$) second source region 5b that is formed in a portion of the upper surface of the channel region 3 in the built-in transistor $920_{ij}$ region and that is separated from the second drain region 5a.

The semiconductor device according to Embodiment 8 also includes n-type inverted regions 2a4 and 2a5 that are formed in a region of the channel region 3 that is surrounded by the first source region 5. In addition, the semiconductor device according to Embodiment 8 includes high concentration p-type ($p^+$) base contact regions 6b1 and 6b2 that are formed in the inverted regions 2a4 and 2a5.

Moreover, the semiconductor device according to Embodiment 8 includes second potential barrier layers 13b1 and 13b2 that contact the inverted regions 2a4 and 2a5 as well as third ohmic contact layers 12b1 and 12b2 that contact the base contact regions 6b1 and 6b2. Second floating electrodes 9b1 and 9b2 are respectively connected to the second potential barrier layers 13b1 and 13b2 and to the third ohmic contact layers 12b1 and 12b2 in the regions surrounded by the first source region.

Figure 38:
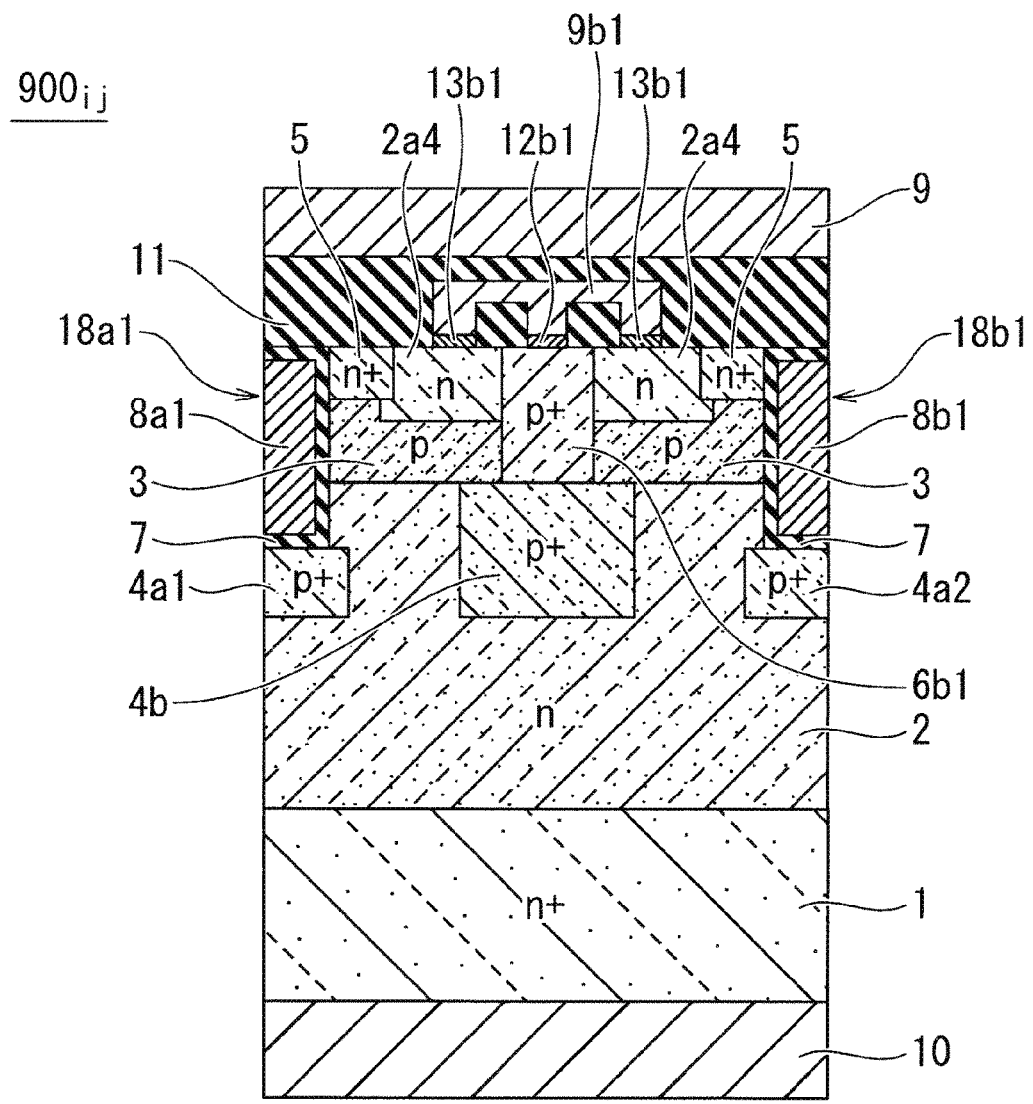
FIG. 38 is a cross-sectional view schematically illustrating a configuration of a portion of the main components of the basic cell of the semiconductor device according to Embodiment 8 as viewed along line Q-Q in FIG. 37.

As illustrated in FIG. 38, the base contact regions 6b1 and 6b2 are formed on a base region 4b. Moreover, the cross-sectional structure of the basic cell $900_{ij}$ of the semiconductor device according to Embodiment 8 at the position of a source contact area 17a (that is, the structure as taken along a line corresponding to line M-M in FIG. 28) is the same as the cross-sectional structure of the basic cell $700_{ij}$ of the semiconductor device according to Embodiment 5 as illustrated in FIG. 30.

As illustrated in FIG. 37, the trenches 18a1 and 18b1 are kept within the standard unit $910_{ij}$ on the built-in transistor $920_{ij}$ side thereof and do not extend into the region on the built-in transistor $920_{ij}$ side.

It is preferable that a second gate electrode of the built-in transistor $920_{ij}$ be formed on a surface of the SiC body region similar to the second gate electrode 8a of the built-in transistor $820_{ij}$ illustrated in FIG. 32. This is because this configuration makes it possible to avoid the decrease in the channel width of the built-in transistor $920_{ij}$ that would result from forming the second gate electrode by extending first gate electrodes 8a1 and 8b1 of the standard unit $910_{ij}$ towards the built-in transistor $920_{ij}$ side, as described above in Embodiment 5. The rest of the components of the structure of the semiconductor device according to Embodiment 8 are the same as the corresponding layers, regions, and the like of the semiconductor devices according to Embodiments 1 to 7, and therefore a redundant description will be omitted here.

Moreover, the rest of the effects of the semiconductor device according to Embodiment 8 (that is, the effects other than those due to having a trench structure) are the same as the effects of the semiconductor device according to Embodiment 6.

(Other Embodiments)

The present invention was described with reference to Embodiments 1 to 8 as described above. However, none of the descriptions or drawings of this disclosure should be understood to limit the present invention in any way. It should instead be understood that various alternative embodiments, other embodiments, and applied technologies based on this disclosure are obvious to a person skilled in the art.

For example, in all of Embodiments 1 to 8 as described above, potential barriers formed by n-type Schottky junctions were used to prevent hole injection. However, hole injection may instead be prevented using potential barriers formed by heterojunctions. Alternatively, even when polycrystalline silicon (doped polysilicon) layers are used as the potential barrier layers, these layers have a functionality equivalent to that of Schottky junctions and therefore still make it possible to prevent hole injection.

Furthermore, aspects of the configurations of Embodiments 1 to 8 may be combined to form new configurations of the present invention. As described above, the present invention includes various other embodiments and the like that are not explicitly described above. In addition, the technical scope of the present invention is defined only by the characterizing features of the invention as disclosed in claims derived appropriately from the descriptions above.

INDUSTRIAL APPLICABILITY

The present invention is suitable for application to power semiconductor devices made using wide-bandgap materials and intended for use in inverters, switching power supplies, or the like, and is particularly suitable for application to SiC semiconductor devices.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a first drain region of a first conductivity type and made primarily of silicon carbide, in a substrate;
   a drift layer of the first conductivity type above the first drain region;
   a channel region of a second conductivity type above the drift layer;
   a first source region of the first conductivity type in a portion of an upper surface of the channel region;
   a source electrode above the first source region;
   a second drain region of the first conductivity type disposed in a portion of the upper part of the channel region and having a pattern connected to the first source region;
   a second source region of the first conductivity type in a portion of the upper surface of the channel region and separated from the second drain region;
   a first floating electrode connected to the second source region and the channel region;
   a first gate electrode controlling a surface potential of a path for current that flows from the first source region in the channel region to the drift layer; and
   a second gate electrode that is connected to the first gate electrode and that controls a surface potential of the channel region between the second drain region and the second source region.

2. The semiconductor device according to claim 1, further comprising:
   a first ohmic contact layer disposed between the first source region and the source electrode and respectively contacting the first source region and the source electrode; and
   a first potential barrier layer contacting the channel region and preventing injection of majority carriers into the channel region,
   wherein the source electrode electrically connects the first ohmic contact layer and the first potential barrier layer.

3. The semiconductor device according to claim 2, further comprising:
   a base region of the second conductivity type disposed between the drift layer and the channel region and having a higher impurity concentration than the channel region.

4. The semiconductor device according to claim 2, wherein a plurality of openings penetrating the first source region and exposing the channel region are discretely arranged along a lengthwise direction of the first source region, and the first potential barrier layer is disposed in each of the plurality of openings.

5. The semiconductor device according to claim 2, further comprising:
   an inverted region of the first conductivity type sandwiching the channel region; and
   a JFET region between the drift layer and a bottom surface of the inverted region.

6. The semiconductor device according to claim 2, wherein the first potential barrier layer is a metal that forms a Schottky junction with the channel region.

7. The semiconductor device according to claim 2, wherein the first potential barrier layer is a semiconductor layer that forms a heterojunction.

8. The semiconductor device according to claim 7, wherein the first potential barrier layer is a polycrystalline silicon layer.

9. The semiconductor device according to claim 6, wherein a barrier height of the Schottky junction to holes is 0.5 eV to 2.26 eV.

10. The semiconductor device according to claim 9, wherein the barrier height is greater than or equal to 1 eV.

11. The semiconductor device according to claim 1, further comprising:
    a second ohmic contact layer disposed above the channel region and contacting the channel region;
    an inverted region connecting together the channel region and the first source region;
    a second potential barrier layer forming a Schottky junction with the inverted region; and
    a second floating electrode contacting the second ohmic contact layer and the second potential barrier layer.

12. The semiconductor device according to claim 1, wherein the first gate electrode is a planar-gate electrode.

13. The semiconductor device according to claim 1, wherein the first gate electrode is a trench-gate electrode.

14. The semiconductor device according to claim 12, wherein the second gate electrode is a planar-gate electrode.

15. The semiconductor device according to claim 1, further comprising:
    a Schottky diode connected in parallel to the semiconductor device within an active portion in which the semiconductor device is embedded.

16. A method of manufacturing a semiconductor device, comprising:
    forming, on a first drain region made of silicon carbide, a drift layer of a first conductivity type and a lower concentration of impurities than the first drain region;
    forming a channel region of a second conductivity type above the drift layer;
    forming, in a portion of an upper surface of the channel region, a first source region of the first conductivity type, a second drain region of the first conductivity type to be connected to the first source region, and a second source region of the first conductivity type separated from the second drain region;
    forming a gate insulating film above the channel region;
    forming, above the gate insulating film, a first gate electrode controlling a surface potential of a path for current that flows from the first source region in the channel region to the drift layer, and a second gate electrode connected to the first gate electrode and controlling a surface potential of the channel region between the second drain region and the second source region;
    forming a source electrode on the first source region; and
    forming a first floating electrode separated from the source electrode and connected to the second source region and the channel region.

17. The method of manufacturing the semiconductor device according to claim 16, further comprising:
    forming a first ohmic contact layer between and contacting the first source region and the source electrode; and
    forming a first potential barrier layer contacting the channel region.

* * * * *